(12) United States Patent
Ikeda et al.

(10) Patent No.: US 7,345,406 B2
(45) Date of Patent: Mar. 18, 2008

(54) PIEZOELECTRIC/ELECTROSTRICTIVE DEVICE

(75) Inventors: Koji Ikeda, Hisai (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 46 days.

(21) Appl. No.: 11/206,252

(22) Filed: Aug. 17, 2005

(65) Prior Publication Data

US 2006/0061238 A1 Mar. 23, 2006

Related U.S. Application Data

(60) Continuation-in-part of application No. 10/862,845, filed on Jun. 7, 2004, now Pat. No. 7,024,739, which is a division of application No. 10/046,331, filed on Jan. 14, 2002, now Pat. No. 6,798,119.

(30) Foreign Application Priority Data

| Jan. 18, 2001 | (JP) | ............................. 2001-010622 |
| Mar. 16, 2001 | (JP) | ............................. 2001-076314 |

(51) Int. Cl.
*H01L 41/04* (2006.01)
(52) U.S. Cl. ..................... 310/333; 310/328; 310/348
(58) Field of Classification Search ................ 310/328, 310/333, 348
See application file for complete search history.

(56) References Cited

U.S. PATENT DOCUMENTS

| 2,492,393 | A | 12/1949 | Muray |
| 4,251,961 | A | 2/1981 | Deibele |
| 4,438,469 | A | 3/1984 | Ohba et al. |
| 4,441,128 | A | 4/1984 | Ohba et al. |
| 4,612,440 | A | 9/1986 | Brunnée |
| 4,966,032 | A | 10/1990 | Takeuchi |

(Continued)

FOREIGN PATENT DOCUMENTS

DE 30 21 430 A1 12/1980

(Continued)

OTHER PUBLICATIONS

"Piezoelectric Piggy-Back Microactuator for Hard Disk Drive," Soeno et al., IEEE Transactions on Magnets, vol. 35, No. 2, Mar. 1999, pp. 983-987.

(Continued)

*Primary Examiner*—Thomas M. Dougherty
(74) *Attorney, Agent, or Firm*—Burr & Brown

(57) ABSTRACT

A piezoelectric/electrostrictive device that includes a base 11 having a pair of right and left movable parts 11a, 11b and a fixing part 11c disposed at one end thereof as well as piezoelectric/electrostrictive elements 12a, 12b disposed on the sides of the movable parts 11a, 11b of the base 11 is fabricated to have a construction with fewer components. The piezoelectric/electrostrictive device having a construction with fewer components is provided by adopting a base 11 having an integral structure formed by bending an original plate stamped into a shape that delineates a plane development of the base, as the base of the piezoelectric/ electrostrictive device. In addition, in this piezoelectric/ electrostrictive device, piezoelectric/electrostrictive elements are arranged on inner sides of a pair of left and right movable parts. Accordingly, destruction of the piezoelectric/ electrostrictive element can hardly occur and high reliability of the piezoelectric/electrostrictive device is achieved.

3 Claims, 56 Drawing Sheets

U.S. PATENT DOCUMENTS

| | | |
|---|---|---|
| 5,049,775 A | 9/1991 | Smits |
| 5,166,571 A | 11/1992 | Konno et al. |
| 5,500,777 A | 3/1996 | Hasegawa et al. |
| 5,680,163 A | 10/1997 | Sugahara |
| 5,745,319 A | 4/1998 | Takekado et al. |
| 5,747,915 A | 5/1998 | Benavides |
| 5,781,381 A | 7/1998 | Koganezawa et al. |
| 5,828,157 A | 10/1998 | Miki et al. |
| 5,877,042 A | 3/1999 | Mattson et al. |
| 5,892,640 A | 4/1999 | Goto |
| 5,901,014 A | 5/1999 | Hiraoka et al. |
| 5,912,524 A | 6/1999 | Ohnishi et al. |
| 5,923,500 A | 7/1999 | Hagen |
| 6,198,606 B1 | 3/2001 | Boutaghou et al. |
| 6,246,552 B1 | 6/2001 | Soeno et al. |
| 6,404,109 B1 | 6/2002 | Takeuchi et al. ............... 789/45 |
| 6,448,691 B1 | 9/2002 | Takeuchi et al. ............... 789/52 |
| 6,525,448 B1 | 2/2003 | Takeuchi et al. ............... 789/50 |
| 6,534,898 B1 | 3/2003 | Takeuchi et al. ............... 789/49 |
| 6,534,899 B1 | 3/2003 | Takeuchi et al. ............... 789/55 |
| 6,657,364 B1 | 12/2003 | Takeuchi et al. ............... 789/56 |
| 6,798,119 B2 * | 9/2004 | Ikeda et al. .................. 310/328 |
| 6,943,990 B1 * | 9/2005 | Yokoyama et al. ......... 360/294.4 |
| 6,950,288 B2 * | 9/2005 | Yao et al. .................. 360/294.4 |
| 7,006,332 B2 * | 2/2006 | Nakamura et al. ......... 360/294.3 |
| 7,024,739 B2 * | 4/2006 | Ikeda et al. .................. 29/25.35 |
| 7,089,637 B2 * | 8/2006 | Ikeda et al. .................. 29/25.35 |
| 2002/0051326 A1 | 5/2002 | Shiraishi et al. |
| 2002/0141117 A1 * | 10/2002 | Kasajima et al. ......... 360/294.4 |
| 2002/0154446 A1 * | 10/2002 | Kasajima et al. ......... 360/245.3 |
| 2004/0001288 A1 * | 1/2004 | Yao et al. .................. 360/294.3 |
| 2004/0130832 A1 * | 7/2004 | Nakamura et al. ......... 360/294.5 |
| 2004/0250413 A1 * | 12/2004 | Yao et al. .................. 29/603.03 |
| 2005/0174699 A1 * | 8/2005 | Yao et al. .................. 360/294.4 |

FOREIGN PATENT DOCUMENTS

| | | |
|---|---|---|
| EP | 0 503 762 A2 | 9/1992 |
| EP | 0 742 597 A1 | 11/1996 |
| EP | 1 020 937 A1 | 7/2000 |
| EP | 1 152 401 A1 | 11/2001 |
| GB | 1 328 931 A1 | 9/1973 |
| JP | 63-64640 | 3/1998 |
| JP | 10-136665 | 5/1998 |
| WO | 98/19304 A1 | 9/1997 |
| WO | 98/44488 A1 | 10/1998 |
| WO | 00/16318 A1 | 3/2000 |

OTHER PUBLICATIONS

"Dual-Stage Actuator System for Magnetic Disk Drives Using a Shear Mode Piezoelectric Microactuator," Koganezawa et al., IEEE Transactions on Magnets, vol. 35, No. 2, Mar. 1999, pp. 988-992.

* cited by examiner

PIEZOELECTRIC/ELECTROSTRICTIVE DEVICE

CROSS REFERENCE TO RELATED APPLICATIONS

This application is a continuation-in-part of U.S. patent application Ser. No. 10/862,845, filed Jun. 7, 2004, now U.S. Pat. No. 7,024,739 which in turn is a division of U.S. patent application Ser. No. 10/046,331, filed Jan. 14, 2002, now U.S. Pat. No. 6,798,119, the entireties of which are incorporated herein by reference.

BACKGROUND OF THE INVENTION

1. Field of the Invention

The present invention relates to a piezoelectric/electrostrictive device.

2. Description of the Background Art

As one form of piezoelectric/electrostrictive device, there are known a piezoelectric/electrostrictive device of a form that includes a base having a pair of right and left movable parts and a fixing part that connects the movable parts with each other at one end thereof as well as a piezoelectric/electrostrictive element disposed on at least one side of the movable parts of the base, and a piezoelectric/electrostrictive device of a form that includes a base having a pair of right and left movable parts, a fixing part that connects the movable parts with each other at one end thereof, and a mounting part that connects the movable parts with each other at the other end thereof as well as a piezoelectric/electrostrictive element disposed on at least one side of the movable parts of the base, as disclosed in the specification of European Patent EP1017116A2.

The piezoelectric/electrostrictive device of such a form has a function of operating the movable parts caused by the displacement operation of the piezoelectric/electrostrictive element or a sensing function of sensing the displacement of the movable parts input from the side that is sensed, with the use of the piezoelectric/electrostrictive element. By effectively using these functions, the piezoelectric/electrostrictive device is used in a wide range of fields such as described below.

Namely, the piezoelectric/electrostrictive devices of such a form are used as active elements such as various transducers, various actuators, frequency region functional components (filters), transformers, vibrators and resonators for communication or mechanical power, oscillators, and discriminators, various sensor elements such as supersonic wave sensors, acceleration sensors, angular velocity sensors, impact sensors, and mass sensors, and various actuators that are put to use for displacement, positioning adjustment, and angle adjustment mechanism for various precision components of optical instruments and precision apparatus.

Meanwhile, the piezoelectric/electrostrictive device of such a form is formed typically by cutting a device master into a suitable size, and the device master is constructed by bonding a piezoelectric/electrostrictive element onto both of the front and rear surfaces of a base master via an adhesive, or is constructed by integrally forming these. Here, the base master is constructed by laminating and baking plural sheets.

Thus, the piezoelectric/electrostrictive device having such a form has a large number of construction components, so that the device is produced at a high cost and through a cumbersome assembling work. Moreover, since the construction components are bonded via an adhesive, there arises a variation of adhesion between the construction components, giving rise to a fear that the device characteristics may be adversely affected.

Further, the piezoelectric/electrostrictive device having such a form is produced by adopting means to cut a device master suitably into a large number of devices. Therefore, the piezoelectric/electrostrictive devices formed by cutting are contaminated with dusts generated at the time of cutting, cutting liquid, and organic components such as an adhesive or wax used for holding the device master at the time of cutting, so that it is not easy to clean the piezoelectric/electrostrictive device.

Also, in the case where the base is constructed with ceramics, one must adopt a hard ceramic material such as zirconia, since the ceramics are liable to be split. Even if a hard ceramic material is adopted, one must choose a suitable cutting condition so as not to generate loss of the material or cracks. Further, since the base is made of a hard ceramic material, the machining process is difficult to be designed and, in order to increase the number of machining products, one must give a careful consideration such as use of a large number of machining apparatus having different functions.

The base can be constructed with a metal material; however, the metal material gives rise to an oxidized end surface by friction heat during the cutting process and burrs remained on the processed end surface, so that one must add another step of removing these. Further, the piezoelectric/electrostrictive device can be tested only after the device master is cut.

Meanwhile, the device cut out from the device master is preferably cleaned by adopting supersonic wave cleaning that can easily remove the contamination. However, if a strong supersonic wave is used to obtain a high cleaning effect in supersonic wave cleaning, the device may be damaged, and the piezoelectric/electrostrictive element may be broken or peeled off from the base. For this reason, if the supersonic wave cleaning is adopted, one must select a weak supersonic wave that does not give damages to the device. However, if such a cleaning condition is adopted, a long period of time is needed in removing the contamination that has adhered at the time of cutting.

Dust generation from the piezoelectric/electrostrictive device may cause the following problems. For example, in the case where the piezoelectric/electrostrictive device is used in an actuator of a magnetic head in a hard disk drive, if dust is generated in the drive, the dust may cause crash of the floating slider onto the medium, thereby raising a fear of data destruction. Also, for the piezoelectric/electrostrictive device itself, the dust may adhere to the electrode of the piezoelectric/electrostrictive device, thereby giving rise to a fear of short circuit. For this reason, a high level of cleaning is required not only in the hard disk drive but also in the device itself.

Therefore, an object of the present invention is to solve the aforementioned problems of the prior art by allowing the base constituting the piezoelectric/electrostrictive device of that form to have an integral structure using one sheet of flat plate as an original plate.

SUMMARY OF THE INVENTION

The present invention relates to a piezoelectric/electrostrictive device and a method of producing the piezoelectric/electrostrictive device. The piezoelectric/electrostrictive devices according to the present invention are piezoelectric/electrostrictive devices provided in the following three types of forms.

A piezoelectric/electrostrictive device of the first form according to the present invention is a piezoelectric/electrostrictive device that includes a base having a pair of right and left movable parts and a fixing part that connects the movable parts with each other at one end thereof as well as a piezoelectric/electrostrictive element disposed on at least one side of the movable parts of the base.

A piezoelectric/electrostrictive device of the second form according to the present invention is a piezoelectric/electrostrictive device that includes a base having a pair of right and left movable parts, a fixing part that connects the movable parts with each other at one end thereof, and a mounting part that is separate from the fixing part and connects the movable parts with each other at the other end thereof as well as a piezoelectric/electrostrictive element disposed on at least one side of the movable parts of the base.

A piezoelectric/electrostrictive device of the third form according to the present invention is a piezoelectric/electrostrictive device that includes a base having a pair of right and left movable parts, a fixing part that connects the movable parts with each other at one end thereof, a mounting part that is separate from the fixing part and connects the movable parts with each other at the other end thereof, and a connecting part that is integral with the mounting part and surrounds the mounting part, the movable parts, and the fixing part as well as a piezoelectric/electrostrictive element disposed on at least one side of the movable parts of the base.

Now, in the piezoelectric/electrostrictive device of the first form according to the present invention, the base is constructed with one sheet of flat plate; the fixing part has a flat plate shape; and the movable parts are erect by a predetermined height from side peripheries of the fixing part to face each other and extend beyond the other end of the fixing part along the side peripheries of the fixing part.

The piezoelectric/electrostrictive device can be constructed in such a manner that a slit-shaped groove extending from the other end of the fixing part intervenes between a base part of the movable parts constituting the base and the side peripheries of the fixing part. Further, the piezoelectric/electrostrictive device can be constructed in such a manner that a connecting portion between a base part of the movable parts and the side peripheries of the fixing part constituting the base has a circular arc shape.

In the piezoelectric/electrostrictive device of the second form according to the present invention, the base is constructed with one sheet of flat plate; the fixing part and the mounting part have a flat plate shape; and the movable parts are erect by a predetermined height from side peripheries of the fixing part and the mounting part to face each other and extend along the side peripheries of the fixing part and the mounting part.

The piezoelectric/electrostrictive device can be constructed in such a manner that a laterally extending slit-shaped groove intervenes between the other end of the fixing part and the one end of the mounting part constituting the base, and a longitudinally extending slit-shaped groove intervenes between a base part of the movable parts and the side peripheries of the fixing part and the mounting part. Alternatively, the piezoelectric/electrostrictive device can be constructed in such a manner that a laterally and longitudinally extending rectangular opening intervenes between the other end of the fixing part and the one end of the mounting part constituting the base. Further, the piezoelectric/electrostrictive device can be constructed in such a manner that a connecting portion between a base part of the movable parts and the side peripheries of the fixing part constituting the base has a circular arc shape.

In the piezoelectric/electrostrictive device of the third form according to the present invention, the base is constructed with one sheet of flat plate; the fixing part and the mounting part have a flat plate shape; the movable parts are erect by a predetermined height from side peripheries of the fixing part and the mounting part to face each other and extend along the side peripheries of the fixing part and the mounting part; and the movable parts, the fixing part, and the mounting part are positioned within a central space of the connecting part.

The piezoelectric/electrostrictive device can be constructed in such a manner that the central space of the connecting part on a side of the one end of the fixing part is either closed or open. Further, the piezoelectric/electrostrictive device can be constructed in such a manner that a connecting portion between a base part of the movable parts and the side peripheries of the fixing part constituting the base has a circular arc shape. Still further, the piezoelectric/electrostrictive device can be constructed in such a manner that a connecting portion between a base part of the movable parts and the side peripheries of the fixing part and the mounting part constituting the base has a circular arc shape.

The piezoelectric/electrostrictive devices of these forms according to the present invention can employ the following constructions, namely, a construction such that the base is constructed with a flat plate made of metal; a construction such that a central portion, as viewed in a length direction, of the movable parts constituting the base is formed to have a smaller thickness than other portions of the movable parts; a construction such that the movable parts constituting the base has a reinforcing part located at an end thereof on the fixing part side and bent from an upper edge of the end to extend towards and abut against a surface of the fixing part; a construction such that the movable parts constituting the base has a reinforcing part located at an end thereof on the fixing part side and bent from a front edge of the end to extend towards an inner side and abut against a surface of the fixing part; and a construction such that a reinforcing member intervenes between the movable parts on the fixing part constituting the base. Furthermore, the piezoelectric/electrostrictive devices can employ a construction such that the fixing part constituting the base extends from the one end side of the movable parts and is enlarged as compared with a case of being located within the movable parts, and a construction such that the mounting part constituting the base extends from the other end side of the movable parts and is enlarged as compared with a case of being located within the movable parts.

The methods of producing a piezoelectric/electrostrictive device according to the present invention are directed to methods of respectively producing piezoelectric/electrostrictive devices of the above-described three forms, and the methods of producing the piezoelectric/electrostrictive devices of these various forms are as follows.

The first production method according to the present invention is a method of producing a piezoelectric/electrostrictive device of the first form according to the present invention, wherein the method includes the steps of preparing a flexible and bendable flat plate as a material for forming the base, stamping the flat plate into a shape that delineates a plane development of the base to form a stamped structure, and bending the stamped structure at a predetermined site to form the base having the movable parts and the fixing part.

The production method can be carried out in such a manner that the stamped structure has a gate-shaped opening composed of a pair of straight side grooves located at right and left sides of a rectangular flat plate and extending along side peripheries and an opening formed by cutting and removing a portion between the two grooves, and the side peripheries of the flat plate are bent along the side grooves to form the side peripheries into the movable parts and to form a portion between the side grooves into the fixing part.

The second production method according to the present invention is a method of producing a piezoelectric/electrostrictive device of the second form according to the present invention, wherein the method includes the steps of preparing a flexible and bendable flat plate as a material for forming the base, stamping the flat plate into a shape that delineates a plane development of the base to form a stamped structure, and bending the stamped structure at a predetermined site to form the base having the movable parts, the fixing part, and the mounting part.

The production method can be carried out in such a manner that the stamped structure has an H-shaped opening composed of a pair of straight side grooves located at right and left sides of a rectangular flat plate and extending along side peripheries and a straight central groove that connects the two side grooves with each other at a middle part, and the side peripheries of the flat plate are bent along the side grooves to form the side peripheries into the movable parts and to form a portion between the side grooves into the fixing part and the mounting part. Further, the production method can be carried out in such a manner that the stamped structure has a rectangular opening at a central part of a rectangular flat plate, and side peripheries of the flat plate are bent along side peripheries of the opening to form the side peripheries into the movable parts and to form a portion between the side peripheries into the fixing part and the mounting part.

The third production method according to the present invention is a method of producing a piezoelectric/electrostrictive device of the third form according to the present invention, wherein the method includes the steps of preparing a flexible and bendable flat plate as a material for forming the base, stamping the flat plate into a shape that delineates a plane development of the base to form a stamped structure, and bending the stamped structure at a predetermined site to form the base having the movable parts, the fixing part, the mounting part, and the connecting part.

The production method can be carried out in such a manner that the stamped structure has a rectangular flat plate part located inside a central opening of a rectangular flat plate and has an H-shaped opening composed of a pair of straight side grooves located at right and left sides of the flat plate part and extending along side peripheries and a straight central groove that connects the two side grooves with each other at a middle part, and the side peripheries of the flat plate part are bent along the side grooves to form the side peripheries into the movable parts, to form a portion between the side grooves into the fixing part and the mounting part, and to form a portion around the central opening into the connecting part.

The production methods according to the present invention can be carried out in such a manner that a flat plate made of metal is adopted as a material for forming the base, and an opening of the stamped structure is formed by stamping simultaneously with stamping the flat plate or formed by a hole-forming process after stamping the flat plate.

Now, it is essential in the principle of operation that the fixing part or the fixing part and the mounting part are closely connected to the two flexible side peripheries. Since these are integrally formed in the piezoelectric/electrostrictive devices according to the present invention, the most preferable modes are embodied in view of the principle of operation.

For example, in the case where the aforesaid two or three essential parts are made of metal and welded with each other, one must take into consideration the problems in the heat treatment step, such as distortion by heat of welding, deterioration of material quality, and annealing. In contrast, in the case where the base is integrally formed as in the piezoelectric/electrostrictive devices according to the present invention, these fears are absent even if the base is made of metal, and also an improvement in the strength of the connecting part by process hardening at the time of integral forming can be expected.

If the piezoelectric/electrostrictive device according to the present invention is combined with a component (for example, a magnetic head of a hard disk drive), the height after assemblage will not be equal to the sum of the height of the component and the height of the device but will be smaller than the sum, thereby producing an advantage that the device can have a compact construction. Regarding the height of the device, the thickness of the plate of the movable parts and the thickness of the adhesive are added to the height of the component; however, as compared with the known devices described at the beginning, the height after assemblage can be reduced, thereby providing an effect of space reduction. Further, the assemblage can be carried out with ease simply by bonding the component onto the fixing part, and the bonding area can be enlarged, thereby advantageously increasing the bonding strength and providing a structure that will not be easily dropped off by impact.

In the first and second piezoelectric/electrostrictive devices among the piezoelectric/electrostrictive devices according to the present invention, it is easy in view of their structure to form, by pressing, a recess to accommodate an adhesive at the bonding site of the mounting part and the fixing part to the component to be controlled. This can increase the bonding strength and can restrain the squeeze-out of the adhesive. Also, it is easy to form a standard position (hole or the like) for positioning that is used in assembling the component. For this reason, the assembling precision in assembling the component onto the mounting part on the device and in mounting the fixing part onto the gimbal of the suspension in later steps can be increased to further improve the yield of the products. By testing the piezoelectric/electrostrictive element in advance before assembling the device, the deterioration of device characteristics after assembling the device can be greatly reduced.

It goes without saying that the piezoelectric/electrostrictive device of the third form according to the present invention can produce the functions and effects that are produced by the first and second piezoelectric/electrostrictive devices. In particular, since the third piezoelectric/electrostrictive device has a connecting part that is integral with the mounting part, the device provides a great advantage that the connecting part can be allowed to function as a gimbal for supporting the magnetic head (slider) of the hard disk drive.

The piezoelectric/electrostrictive devices according to the present invention are based on the piezoelectric/electrostrictive devices of the above-described three forms. In these piezoelectric/electrostrictive devices having a basic structure, the base of each device has an integral structure formed from an original plate made of a flat plate, so that the base is in principle constructed with only one construction component. Therefore, the construction components of each device are two kinds, namely, the base and the piezoelectric/electrostrictive elements, so that the number of construction components of the piezoelectric/electrostrictive device can be greatly reduced, and the number of steps for assembling the construction components can be greatly reduced, thereby leading to large reduction of costs.

Further, in each piezoelectric/electrostrictive device according to the present invention, since the number of construction components is extremely small and the number of bonding sites between the construction components is extremely small, there is little or no variation in the adhesion between the construction components, whereby the piezoelectric/electrostrictive device has device characteristics in which the set precision is high.

Further, in forming each piezoelectric/electrostrictive device according to the present invention, there is no need to adopt means for cutting a device master at numerous sites, so that there is no contamination caused by dusts and other contaminants generated at the time of cutting the device master. For this reason, if the base and the piezoelectric/electrostrictive elements are cleaned in advance in assembling the piezoelectric/electrostrictive device, the assembled piezoelectric/electrostrictive device has little or no contamination, thereby providing a great advantage that the step of cleaning the piezoelectric/electrostrictive device can be omitted or carried out in a simple manner.

Regarding the piezoelectric/electrostrictive devices according to the present invention, the piezoelectric/electrostrictive device of the first form, the piezoelectric/electrostrictive device of the second form, and the piezoelectric/electrostrictive device of the third form can be produced with ease and at a low cost respectively by the first method according to the present invention, the second method according to the present invention, and the third method according to the present invention.

DESCRIPTION OF THE PREFERRED EMBODIMENTS

The piezoelectric/electrostrictive devices according to the present invention are: a piezoelectric/electrostrictive device of the first form that includes a base having a pair of right and left movable parts and a fixing part that connects the movable parts with each other at one end thereof as well as a piezoelectric/electrostrictive element disposed on at least one side of the movable parts of the base; a piezoelectric/electrostrictive device of the second form that includes a base having a pair of right and left movable parts, a fixing part that connects the movable parts with each other at one end thereof, and a mounting part that is separate from the fixing part and connects the movable parts with each other at the other end thereof as well as a piezoelectric/electrostrictive element disposed on at least one side of the movable parts of the base; and a piezoelectric/electrostrictive device of the third form that includes a base having a pair of right and left movable parts, a fixing part that connects the movable parts with each other at one end thereof, a mounting part that is separate from the fixing part and connects the movable parts with each other at the other end thereof, and a connecting part that is integral with the mounting part and surrounds the mounting part, the movable parts, and the fixing part as well as a piezoelectric/electrostrictive element disposed on at least one side of the movable parts of the base. FIGS. 1A to 1K illustrate numerous embodiments (first embodiment to eleventh embodiment) of the piezoelectric/electrostrictive devices of various forms.

Figure 1A:
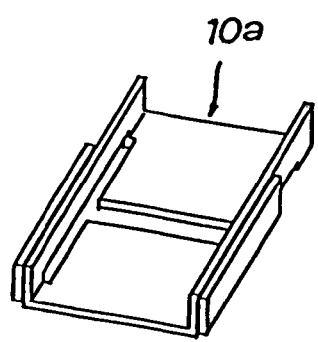
FIGS. 1A to 1K are perspective views respectively illustrating eleven types of embodiments of the piezoelectric/electrostrictive devices according to the present invention.
Figure 2:
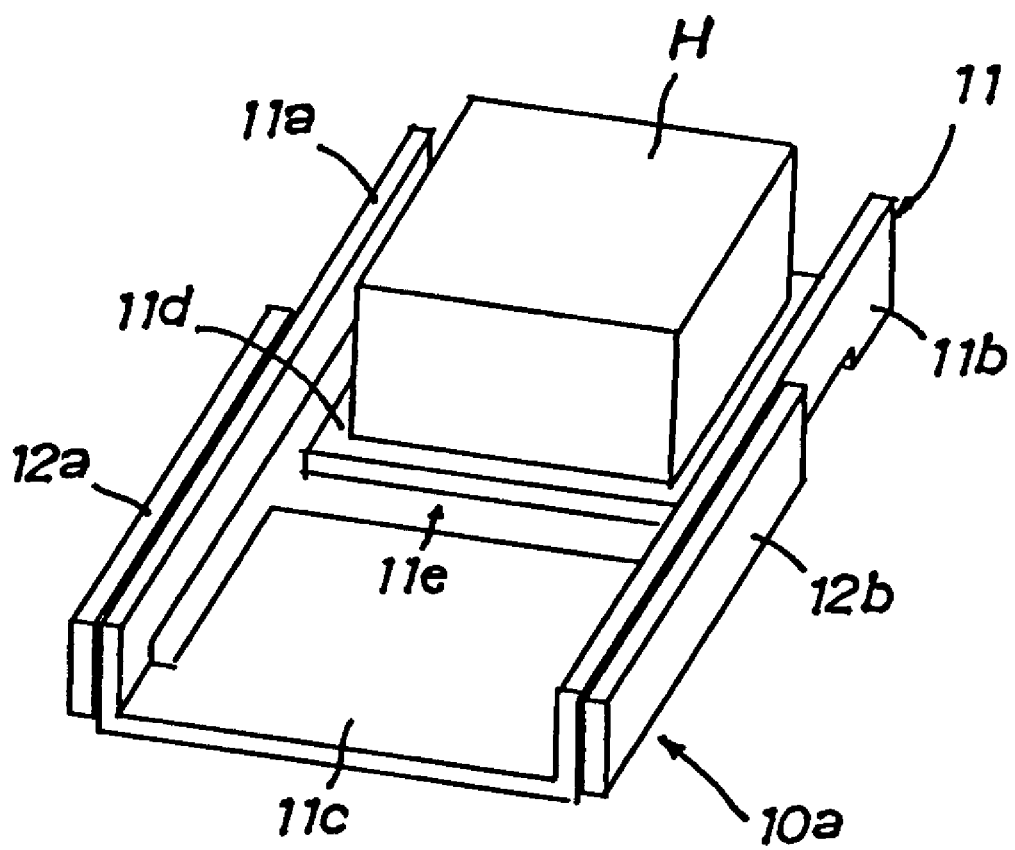
FIG. 2 is a perspective view illustrating a state in which a component to be controlled is mounted on the first piezoelectric/electrostrictive device of the second form according to the present invention.

The first piezoelectric/electrostrictive device 10a shown in FIG. 1A belongs to the category of the piezoelectric/electrostrictive device of the second form according to the present invention and is used in a state shown in FIG. 2. The first piezoelectric/electrostrictive device 10a is formed by the method shown in FIGS. 3 and 4. The first piezoelectric/electrostrictive device 10a is made of a base 11 and a pair of piezoelectric/electrostrictive elements 12a, 12b. Base 11 is constructed with a pair of right and left long and narrow plate-shaped movable parts 11a, 11b, a flat plate-shaped fixing part 11c that connects the movable parts 11a, 11b with each other at one end thereof, and a flat plate-shaped mounting part 11d that connects the movable parts 11a, 11b with each other at the other end thereof.

An H-shaped opening 11e sections base 11 into movable parts 11a, 11b, fixing part 11c, and mounting part 11d. Opening 11e is made of a pair of right and left side grooves 11e1, 11e2 and a central groove 11e3 that connects the two side grooves 11e1, 11e2 with each other at the central part thereof as viewed in the longitudinal direction. Movable part 11a on the left side is bent at side groove 11e1 along groove 11e1 and is erect perpendicularly to fixing part 11c and mounting part 11d. Similarly, movable part 11b on the right side is bent at side groove 11e2 along groove 11e2 and is erect perpendicularly to fixing part 11c and mounting part 11d.

In base 11 having such a construction, piezoelectric/electrostrictive elements 12a, 12b are bonded respectively onto outer sides of the movable parts 11a, 11b via an adhesive made of epoxy resin or the like. Piezoelectric/electrostrictive elements 12a, 12b are each a multi-layer body made of piezoelectric/electrostrictive layers and electrode films. Piezoelectric/electrostrictive elements 12a, 12b are formed to have the same shape as movable parts 11a, 11b and are shorter than movable parts 11a, 11b by a predetermined length. Piezoelectric/electrostrictive elements 12a, 12b are respectively bonded in alignment to the end of movable parts 11a, 11b on the fixing part 11c side, and extend to a site that leaves a predetermined length from the end of movable parts 11a, 11b on the mounting part 11d side.

In the base 11, a magnetic head H (slider) for a hard disk, which is a component to be controlled, for example, is bonded and fixed onto the upper side of mounting part 11d, and the lower side is bonded and fixed onto a gimbal of the suspension. Here, in this case, the positions of mounting the magnetic head H and the suspension can be changed to fixing part 11c, contrary to the above. This does not change the device functions at all. Also, the positions of mounting the magnetic head H and the suspension with respect to fixing part 11c and mounting part 11d can be changed to a configuration in which the roles of the front and rear surfaces are reversed. This does not change the device functions at all, either. However, the wirings of external electrodes that are brought into contact with the terminals of piezoelectric/electrostrictive elements 12a, 12b must be wired in a reversed manner on the suspension.

Figure 3A:
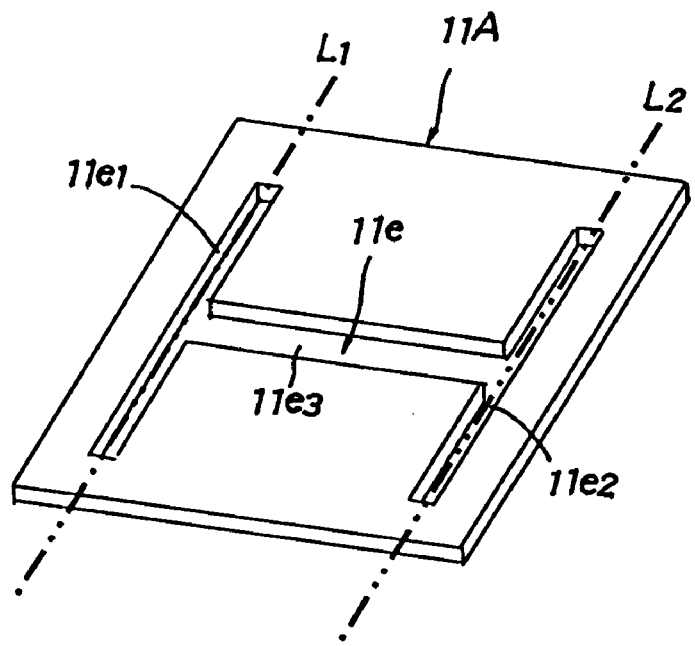
FIGS. 3A and 3B are a perspective view illustrating an original plate of a base constituting the first piezoelectric/electrostrictive device, and a perspective view illustrating the base formed by bending the original plate, respectively.
Figure 3B:
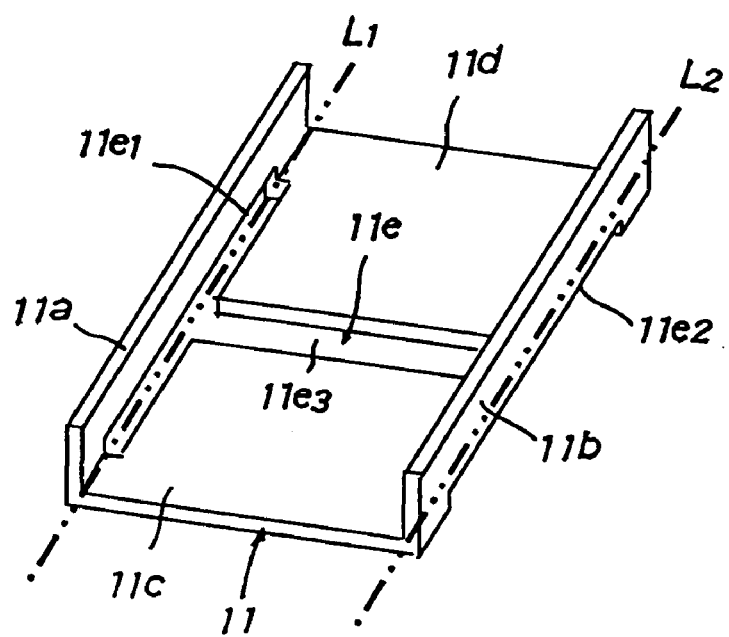

Now, base 11 constituting the piezoelectric/electrostrictive device 10a is formed by using an original plate 11A shown in FIG. 3A as a material for molding and by bending original plate 11A as shown in FIG. 3B. Original plate 11A is a stamped structure that is stamped out from a flexible and bendable flat plate and is formed in a shape that delineates a plane development of base 11. The flat plate constituting the original plate 11A is preferably made of metal in view of strength.

The flat plate is preferably made of a metal having a Young's modulus of at least 100 GPa and, as a ferrous metals material, one can mention austenite-series stainless steels such as SUS301, SUS304, AISI653, and SUH660, ferrite-series stainless steels such as SUS430 and SUS434, martensite-series stainless steels such as SUS410 and SUS630, semiaustenite-series stainless steels such as SUS6312 and AISI632, maraging stainless steel, various spring steel materials, and others. As a nonferrous metals material, one can mention super elastic titanium alloys such as a titanium-nickel alloy, brass, nickel, aluminum, tungsten, molybdenum, beryllium copper, phosphorus bronze, nickel, a nickel iron alloy, titanium, and others.

Original plate 11A is formed by subjecting a flat plate to a stamping process, and is provided with an H-shaped opening 11e. Opening 11e is formed simultaneously at the time of stamping the flat plate, and is made of a pair of straight side grooves 11e1, 11e2 located at right and left sides of original plate 11A and extending to the front and rear ends and a straight central groove 11e3 that connects the two side grooves 11e1, 11e2 with each other at the central parts thereof. Base 11 is formed by perpendicularly bending the right and left side peripheries of original plate 11A at the side grooves 11e1, 11e2 along central lines L1, L2 that extend at the center of the width of the grooves 11e1, 11e2 in the longitudinal direction thereof. By bending the right and left sides of original plate 11A in such a manner, the sites located outside the side grooves 11e1, 11e2 are formed into movable parts 11a, 11b, and the sites on the front end side and on the rear end side of the central groove 11e3 are formed into fixing part 11c and mounting part 11d, respectively.

Figure 4A:
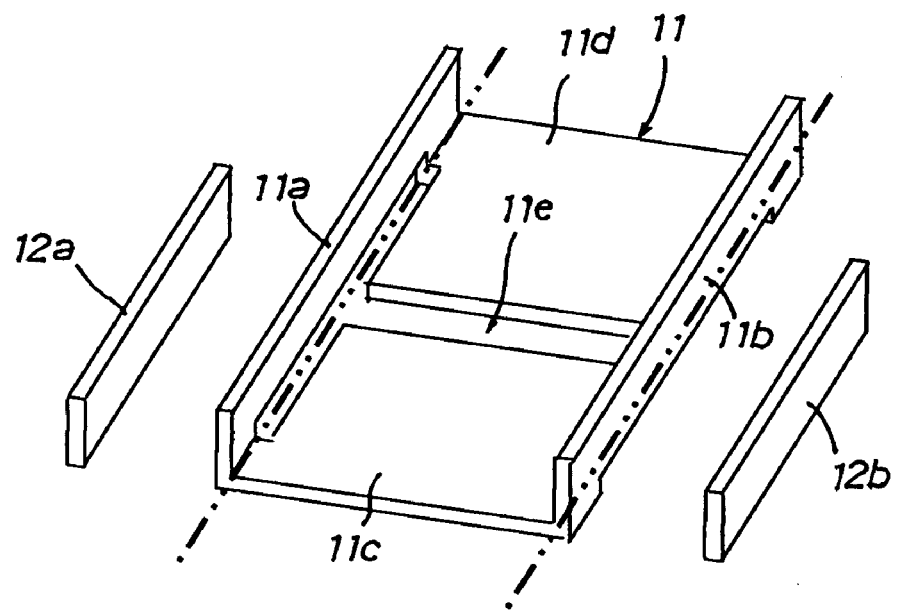
FIGS. 4A and 4B are a perspective view illustrating a state of assembling the first piezoelectric/electrostrictive device, and a perspective view illustrating the assembled piezoelectric/electrostrictive device, respectively.
Figure 4B:
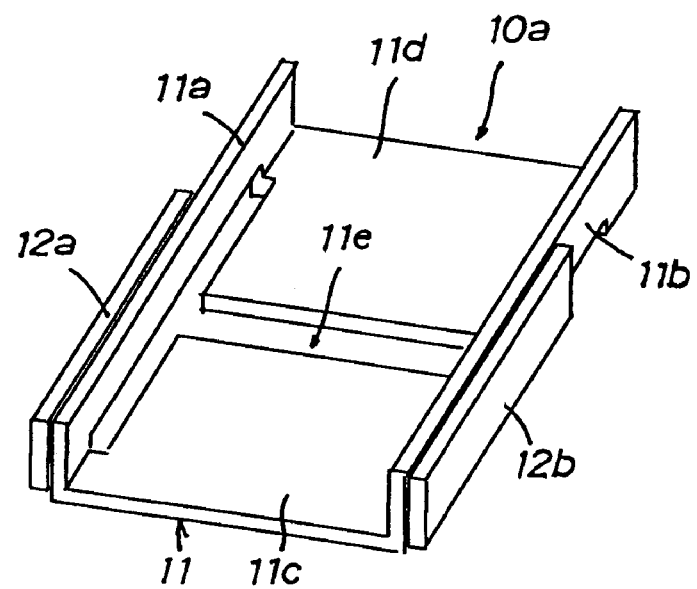

In base 11 thus integrally constructed from original plate 11A, piezoelectric/electrostrictive elements 12a, 12b are bonded via an adhesive onto the outer sides of movable parts 11a, 11b as shown in FIG. 4A to form piezoelectric/electrostrictive device 10a shown in FIG. 4B. Piezoelectric/electrostrictive device 10a thus formed functions in the same manner as the conventional piezoelectric/electrostrictive devices of this form and, since base 11 is integrally constructed from original plate 11A, piezoelectric/electrostrictive device 10a produces the following functions and effects.

Namely, in the first piezoelectric/electrostrictive device 10a, base 11 has an integral structure made of one sheet of original plate 11A alone and is constructed with one construction component. Therefore, the construction components of the device 10a are two kinds, i.e. base 11 and piezoelectric/electrostrictive elements 12a, 12b, so that the number of construction components of piezoelectric/electrostrictive device 10a can be greatly reduced, and the number of steps for assembling the construction components can be greatly reduced, thereby leading to large reduction of costs.

Further, in the first piezoelectric/electrostrictive device 10a, since the number of construction components is extremely small and the number of bonding sites between the construction components is extremely small, there is little or no variation in the adhesion between the construction components, whereby the first piezoelectric/electrostrictive device 10a has device characteristics in which the set precision is high.

Further, in forming the first piezoelectric/electrostrictive device 10a, there is no need to adopt means for cutting a device master at numerous sites as in the prior art, so that there is no contamination caused by adhesion of dusts and other contaminants generated at the time of cutting the device master. For this reason, if base 11 and piezoelectric/electrostrictive elements 12a, 12b are cleaned in advance in assembling the first piezoelectric/electrostrictive device 10a, the assembled piezoelectric/electrostrictive device 10a has little or no contamination, thereby providing a great advantage that the step of cleaning the piezoelectric/electrostrictive devβÿβ 10a can be omitted or carried out in a simple manner.

Figure 1B:
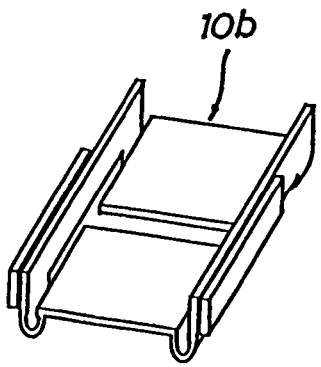
Figure 6A:
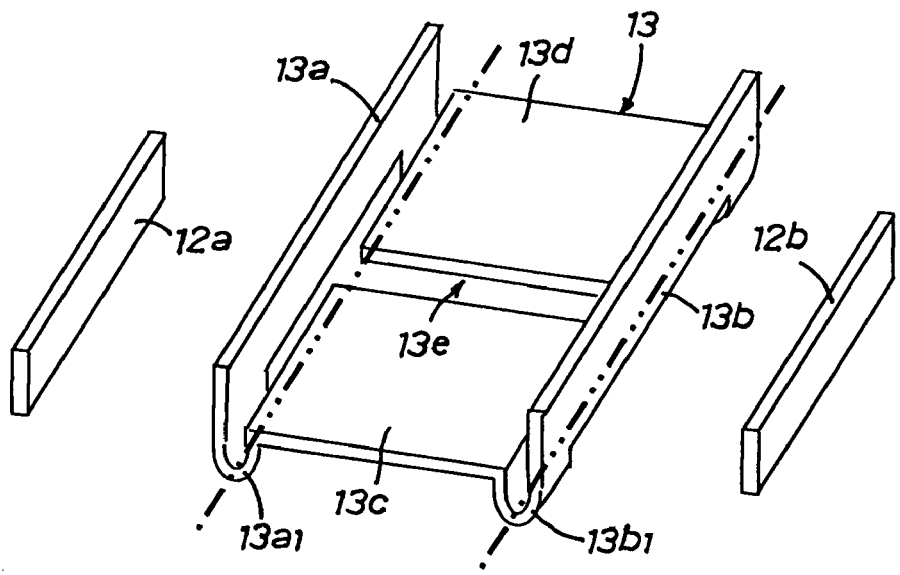
FIGS. 6A and 6B are a perspective view illustrating a state of assembling the second piezoelectric/electrostrictive device, and a perspective view illustrating the assembled piezoelectric/electrostrictive device, respectively.
Figure 6B:
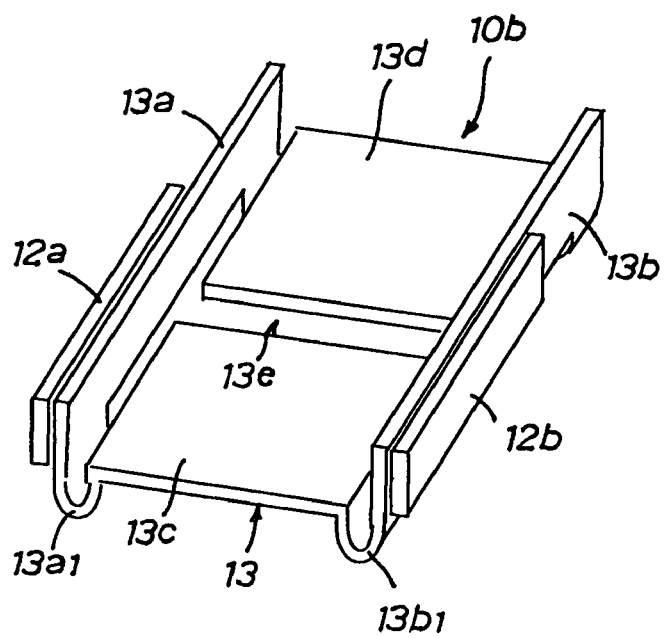

The second piezoelectric/electrostrictive device 10b shown in FIG. 1B belongs to the category of the piezoelectric/electrostrictive device of the second form according to the present invention. The second piezoelectric/electrostrictive device 10b has a base constructed in a slightly different manner from that of the first piezoelectric/electrostrictive device 10a. Referring to FIG. 6B, the second piezoelectric/electrostrictive device 10b is made of a base 13 and a pair of piezoelectric/electrostrictive elements 12a, 12b. Base 13 is constructed with a pair of right and left long and narrow plate-shaped movable parts 13a, 13b, a flat plate-shaped fixing part 13c that connects the movable parts 13a, 13b with each other at one end thereof, and a flat plate-shaped mounting part 13d that connects the movable parts 13a, 13b with each other at the other end thereof.

An H-shaped opening 13e sections base 13 into movable parts 13a, 13b, fixing part 13c, and mounting part 13d. As far as such a construction is concerned, the base 13 of the second piezoelectric/electrostrictive device 10b has the same construction as the base 11 of the first piezoelectric/electrostrictive device 10a.

Figure 5A:
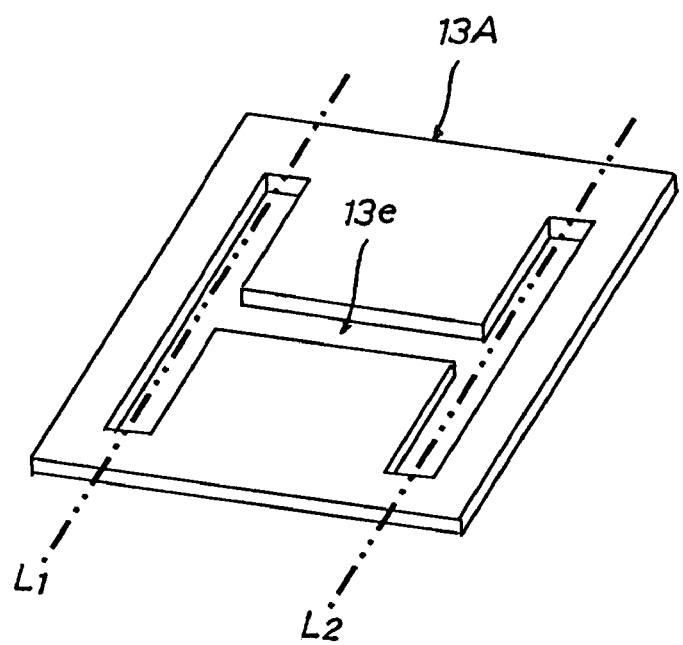
FIGS. 5A and 5B are a perspective view illustrating an original plate of a base constituting the second piezoelectric/electrostrictive device of the second form according to the present invention, and a perspective view illustrating the base formed by bending the original plate, respectively.
Figure 5B:
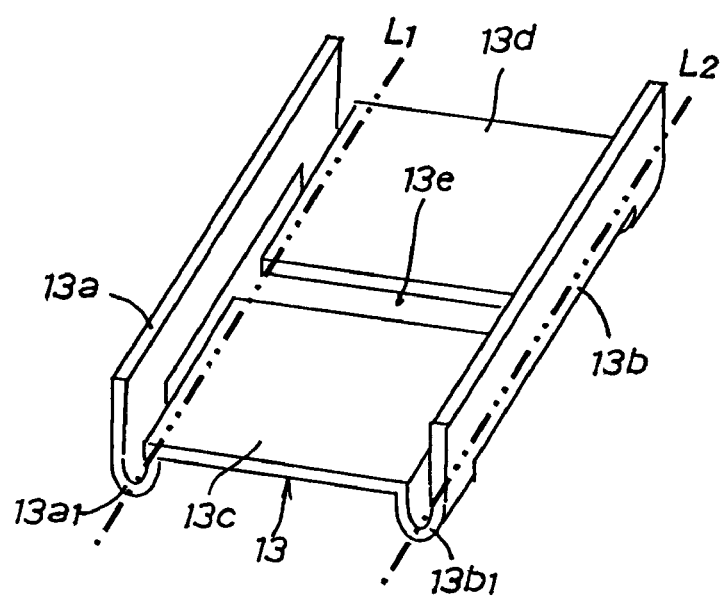

However, in base 13, the bent parts 13a1, 13b1, which are the sites for connecting movable parts 13a, 13b to fixing part 13c and mounting part 13d, have a circular arc shape in which the bent parts 13a1, 13b1 are recessed from the surface of fixing part 13c and mounting part 13d. Referring to FIG. 5A, the original plate 13A constituting the base 13 is the same as the original plate 11A of base 11, and has a different bent shape in bending the original plate to form movable parts 13a, 13b. Namely, in the bending process, circular arc-shaped bent parts 13a1, 13b1 are formed at the base part of movable parts 13a, 13b. Referring to FIG. 6A, piezoelectric/electrostrictive elements 12a, 12b are bonded onto the outer sides of movable parts 13a, 13b of the base 13 to form the second piezoelectric/electrostrictive device 10b.

The second piezoelectric/electrostrictive device 10b has the same functions as the first piezoelectric/electrostrictive device 10a and produces approximately similar actions and effects as the first piezoelectric/electrostrictive device 10a. In particular, since movable parts 13a, 13b are connected to fixing part 13c and mounting part 13d via circular arc-shaped bent parts 13a1, 13b1, the movability of movable parts 13c, 13d is improved to produce high device functions.

Further, the second piezoelectric/electrostrictive device 10b facilitates making a highly precise degree of orthogonality of movable parts 13a, 13b to fixing part 13c and mounting part 13d, thereby restraining displacements in the flapping direction. Moreover, since the position of movable parts 13a, 13b in the Y-axis direction with respect to fixing part 13c and mounting part 13d can be set by changing the degree of bending the circular arc-shaped bent parts, the device designing can have a larger width.

Figure 1C:
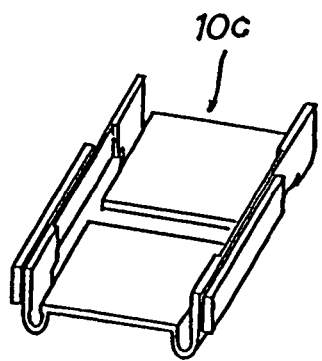

The third piezoelectric/electrostrictive device 10c shown in FIG. 1C belongs to the category of the piezoelectric/electrostrictive device of the second form according to the present invention. The third piezoelectric/electrostrictive device 10c has a base constructed to have slightly different parts from those of the second piezoelectric/electrostrictive device 10b, but the other parts are the same.

Figure 8A:
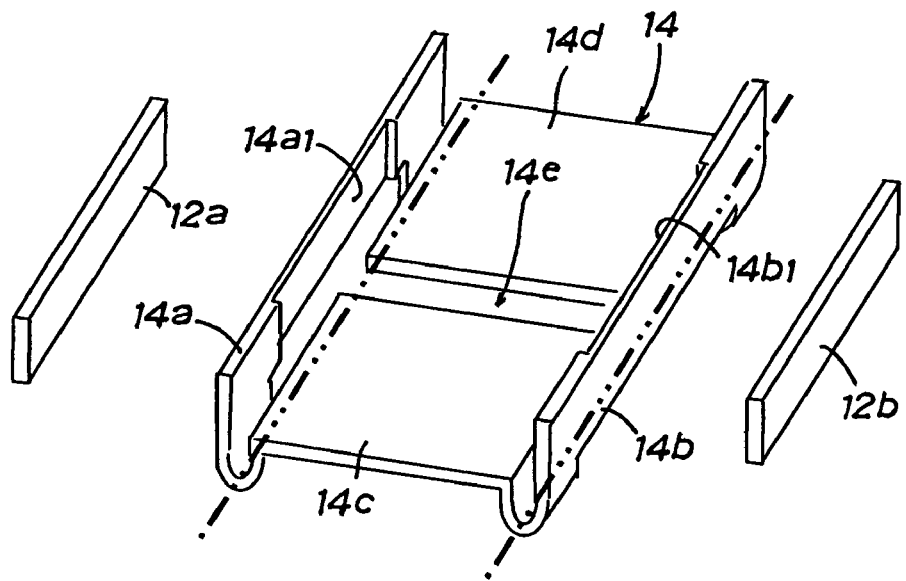
FIGS. 8A and 8B are a perspective view illustrating a state of assembling the third piezoelectric/electrostrictive device, and a perspective view illustrating the assembled piezoelectric/electrostrictive device, respectively.
Figure 8B:
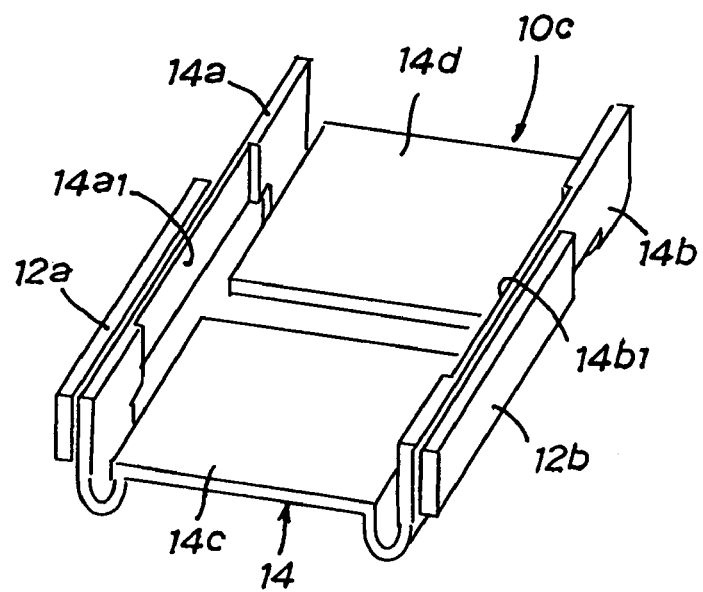

Now, referring to FIG. 8B, the third piezoelectric/electrostrictive device 10c is made of a base 14 and a pair of piezoelectric/electrostrictive elements 12a, 12b. Base 14 is constructed with a pair of right and left long and narrow plate-shaped movable parts 14a, 14b, a flat plate-shaped fixing part 14c that connects the movable parts 14a, 14b with each other at one end thereof, and a flat plate-shaped mounting part 14d that connects the movable parts 14a, 14b with each other at the other end thereof.

Figure 7A:
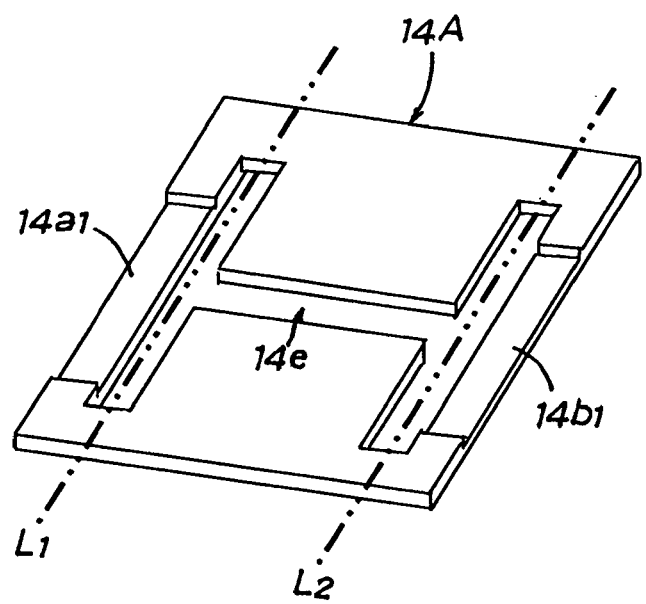
FIGS. 7A and 7B are a perspective view illustrating an original plate of a base constituting the third piezoelectric/electrostrictive device of the second form according to the present invention, and a perspective view illustrating the base formed by bending the original plate, respectively.
Figure 7B:
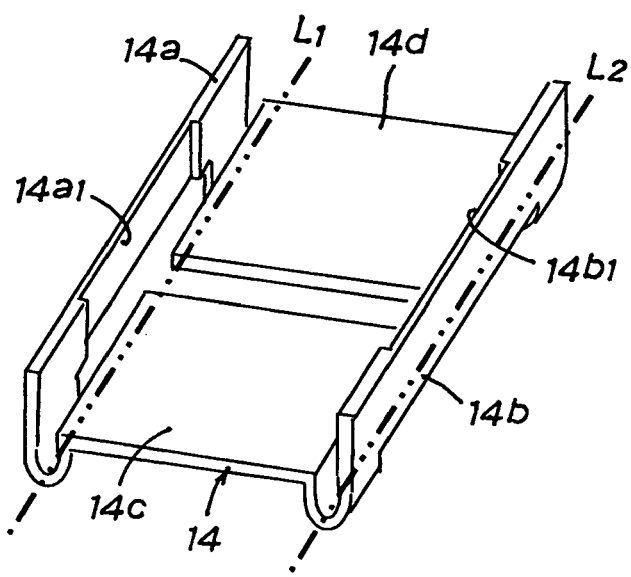

In base 14, the middle portion of movable parts 14a, 14b in the longitudinal is formed into thin parts 14a1, 14b1 for a predetermined length; however, except this point, base 14 is constructed in the same manner as base 13. Further, referring to FIG. 7A, the original plate 14A of base 14 has thin parts 14a1, 14b1 on the right and left sides of an H-shaped opening 14e which are to be formed into movable parts 14a, 14b later. Base 14 is subjected to a bending process along the two-dot chain lines L1, L2 shown in FIG. 7B in the same manner as base 13. Referring to FIG. 8A, piezoelectric/electrostrictive elements 12a, 12b are bonded onto outer sides of movable parts 14a, 14b to form the third piezoelectric/electrostrictive device 10c.

The third piezoelectric/electrostrictive device 10c has the same functions as the second piezoelectric/electrostrictive device 10b and produces approximately similar actions and effects as the second piezoelectric/electrostrictive device 10b. In particular, since movable parts 14a, 14b are provided with thin parts 14a1, 14b1 that are located in the middle thereof and extending in the longitudinal direction, the movability of movable parts 14a, 14b is more enhanced to produce further high device functions.

Here, as means for forming thin parts 14a1, 14b1 of original plate 14A, one can adopt a method of reducing the thickness by partially removing the material using chemical etching, microblasting, ion-milling, or the like, or a method of reducing the thickness by cutting through grinding, or the like method. Further, as a special means, one can adopt a plate formed by superposing and bonding one plate that has been drilled to have a hole of a predetermined length onto the other plate without a hole to substitute the site corresponding to the hole for the thin parts, as an original plate.

Figure 1D:
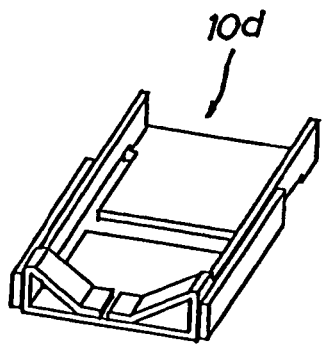

The fourth piezoelectric/electrostrictive device 10d shown in FIG. 1D belongs to the category of the piezoelectric/electrostrictive device of the second form according to the present invention. The fourth piezoelectric/electrostrictive device 10d has a base constructed to have slightly different parts from those of the first piezoelectric/electrostrictive device 10a, but the other parts are the same.

Figure 10A:
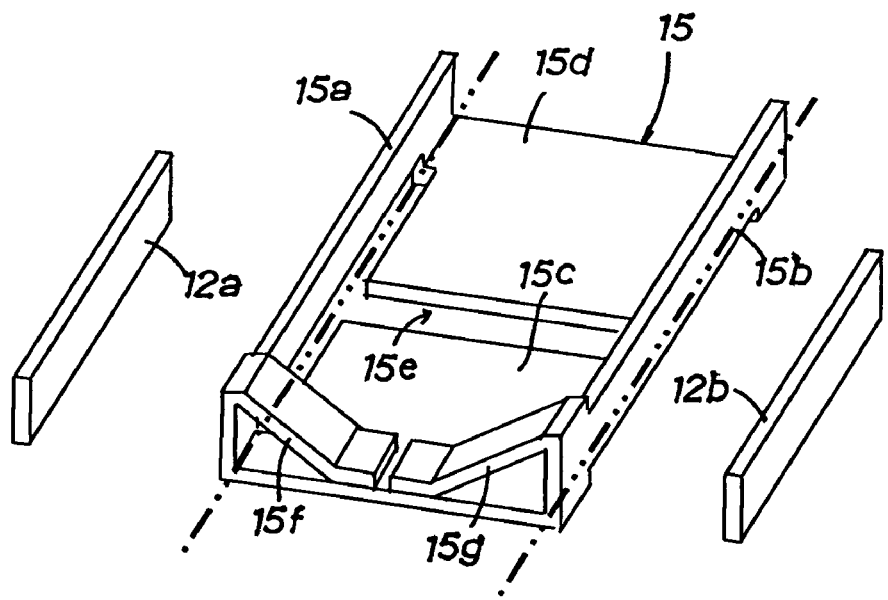
FIGS. 10A and 10B are a perspective view illustrating a state of assembling the fourth piezoelectric/electrostrictive device, and a perspective view illustrating the assembled piezoelectric/electrostrictive device, respectively.
Figure 10B:
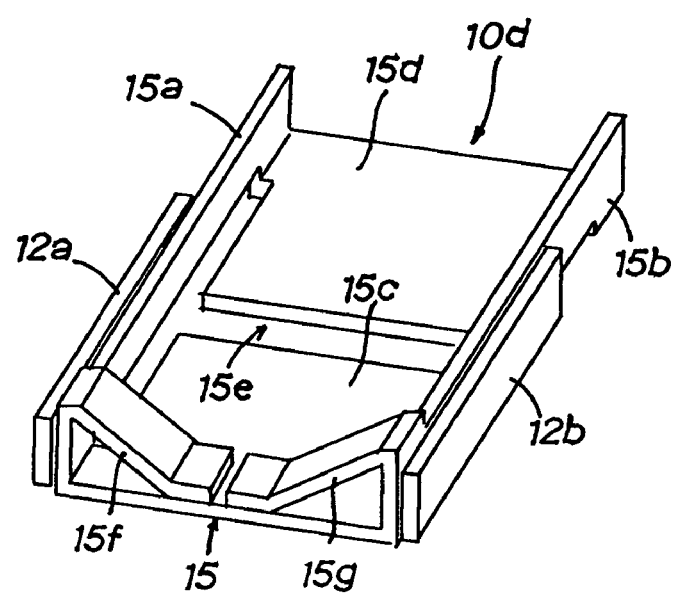

Referring to FIG. 10B, the fourth piezoelectric/electrostrictive device 10d is made of a base 15 and a pair of piezoelectric/electrostrictive elements 12a, 12b. Base 15 is constructed with a pair of right and left long and narrow plate-shaped movable parts 15a, 15b, a flat plate-shaped fixing part 15c that connects the movable parts 15a, 15b with each other at one end thereof, a flat plate-shaped mounting part 15d that connects the movable parts 15a, 15b with each other at the other end thereof, and a pair of right and left reinforcing parts 15f, 15g that extend from an upper fringe on one ends of movable parts 15a, 15b and abut against the surface of fixing part 15c.

Figure 9A:
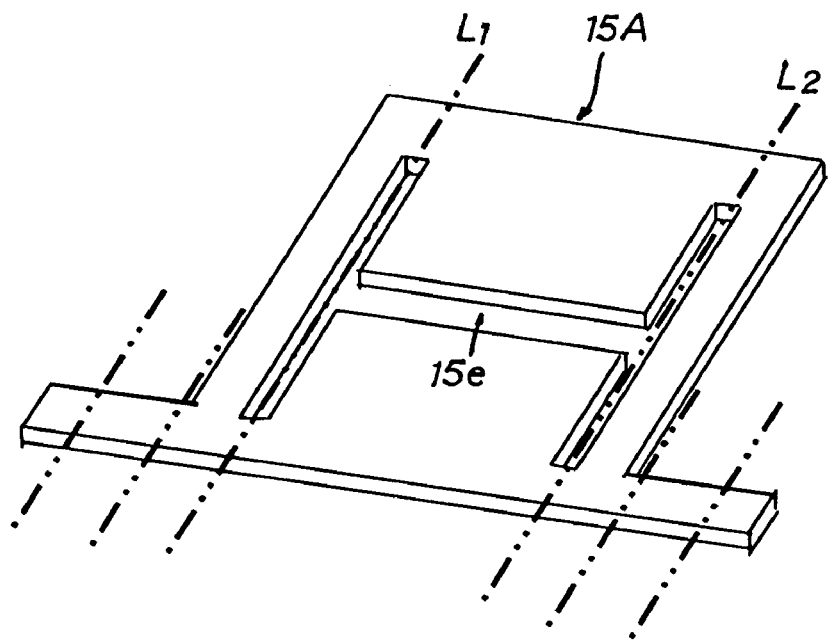
FIGS. 9A and 9B are a perspective view illustrating an original plate of a base constituting the fourth piezoelectric/electrostrictive device of the second form according to the present invention, and a perspective view illustrating the base formed by bending the original plate, respectively.
Figure 9B:
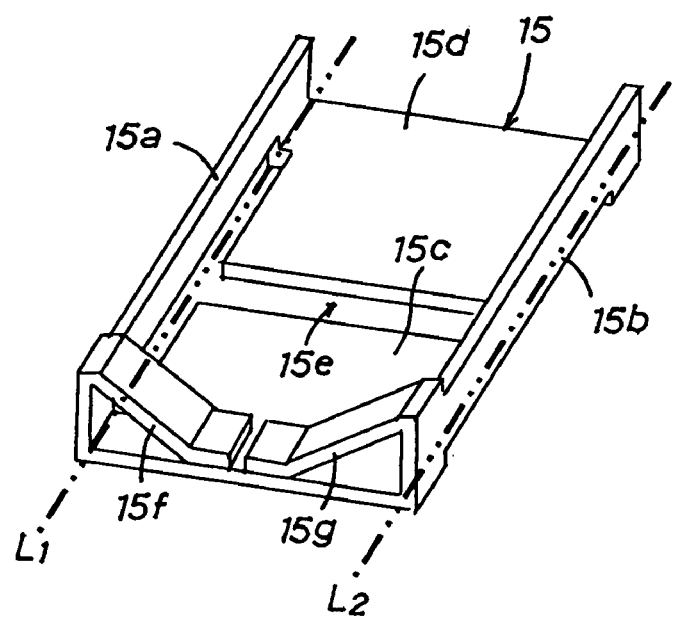

Base 15 is constructed in the same manner as base 11 except that base 15 is provided with reinforcing parts 15f, 15g. Further, referring to FIG. 9A, the original plate 15A of base 15 is provided with portions to become reinforcing parts 15f, 15g that are extending outward from one ends of the right and left sides of an H-shaped opening 15e which are to be formed into movable parts 15a, 15b later. Base 15 is subjected to a bending process along two-dot chain lines L1, L2 and others as shown in FIG. 9B. Referring to FIG. 10A, piezoelectric/electrostrictive elements 12a, 12b are bonded onto outer sides of movable parts 15a, 15b to form the fourth piezoelectric/electrostrictive device 10d.

The fourth piezoelectric/electrostrictive device 10d has the same functions as the first piezoelectric/electrostrictive device 10a and produces approximately similar actions and effects as the first piezoelectric/electrostrictive device 10a. In particular, fixing part 15c is reinforced by reinforcing parts 15f, 15g. Reinforcing parts 15f, 15g are bonded onto fixing part 15c. As the bonding means therefor, one can adopt a bonding means such as spot welding, press-bonding, caulking, soldering, brazing, or using an adhesive such as epoxy resin or UV-curing type resin or the like. Among these bonding means, spot welding is especially preferable.

Figure 1E:
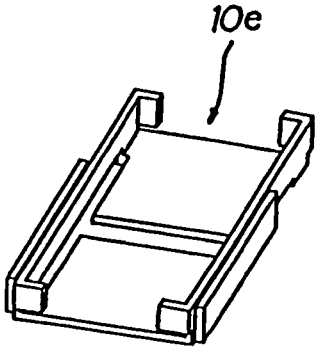

The fifth piezoelectric/electrostrictive device 10e shown in FIG. 1E belongs to the category of the piezoelectric/electrostrictive device of the second form according to the present invention. The fifth piezoelectric/electrostrictive device 10e has a base constructed to have slightly different parts from those of the fourth piezoelectric/electrostrictive device 10d, but the other parts are the same.

Figure 12A:
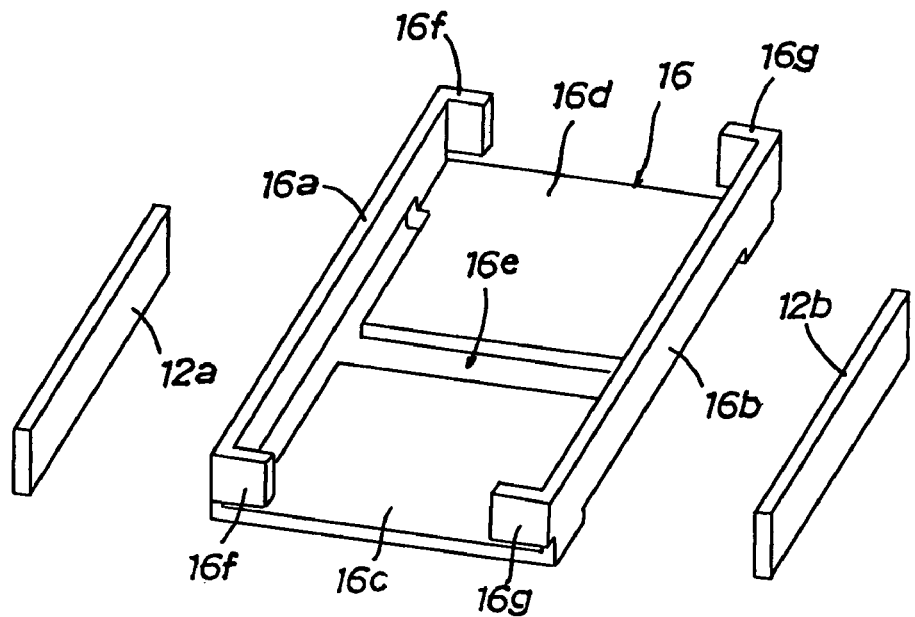
FIGS. 12A and 12B are a perspective view illustrating a state of assembling the fifth piezoelectric/electrostrictive device, and a perspective view illustrating the assembled piezoelectric/electrostrictive device, respectively.
Figure 12B:
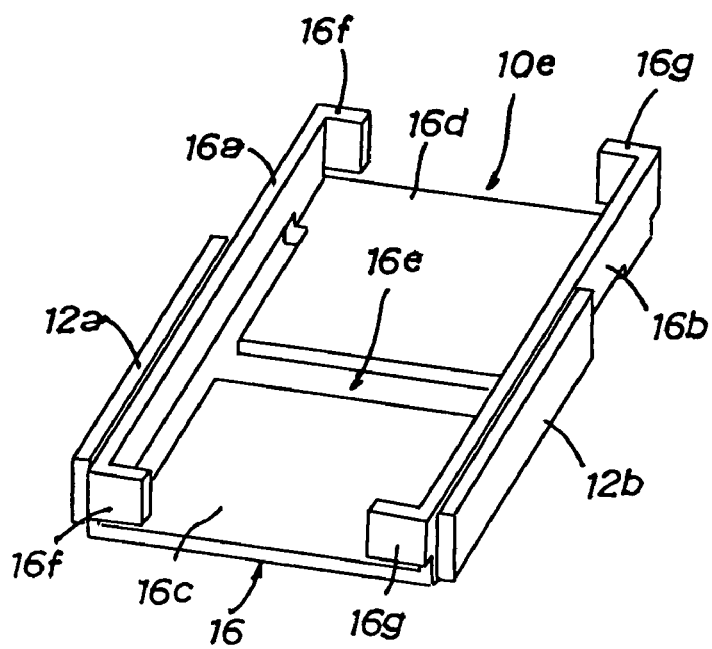

Now, referring to FIG. 12B, the fifth piezoelectric/electrostrictive device 10e is made of a base 16 and a pair of piezoelectric/electrostrictive elements 12a, 12b. Base 16 is constructed with a pair of right and left long and narrow plate-shaped movable parts 16a, 16b, a flat plate-shaped fixing part 16c that connects the movable parts 16a, 16b with each other at one end thereof, a flat plate-shaped mounting part 16d that connects the movable parts 16a, 16b with each other at the other end thereof, and reinforcing parts 16f, 16g that bend inwardly from the end of movable parts 16a, 16b in a manner like a flange.

Figure 11A:
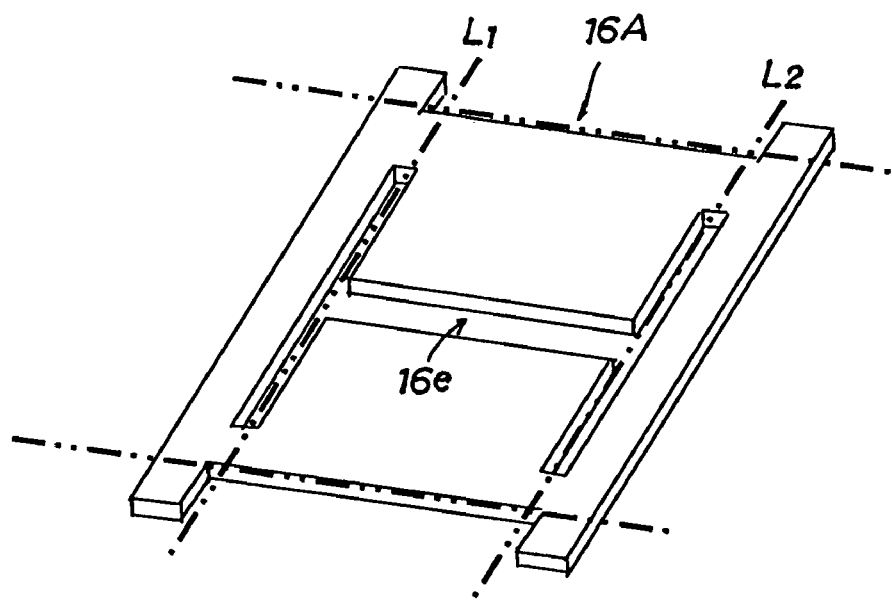
FIGS. 11A and 11B are a perspective view illustrating an original plate of a base constituting the fifth piezoelectric/electrostrictive device of the second form according to the present invention, and a perspective view illustrating the base formed by bending the original plate, respectively.
Figure 11B:
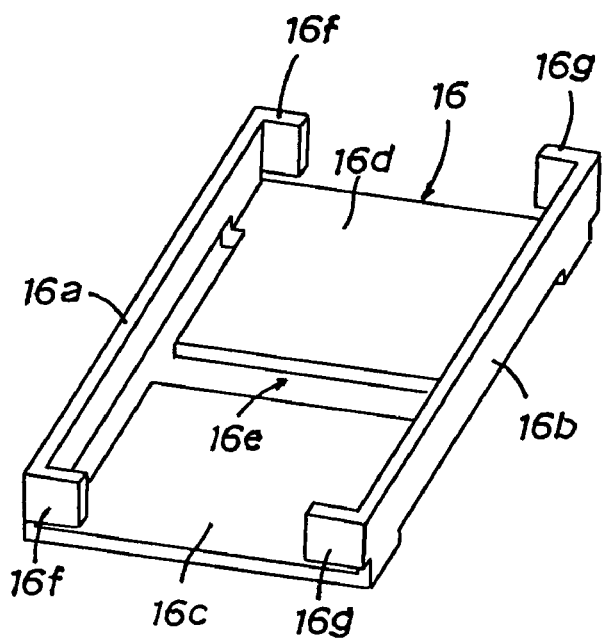

Base 16 is constructed in the same manner as base 15 except that the shape of reinforcing parts 16f, 16g is different from the shape of reinforcing parts 15f, 15g. Further, referring to FIG. 11A, the original plate 16A of base 16 is constructed in such a manner that the right and left sides of an H-shaped opening 16e, which are to be formed into movable parts 16a, 16b later, protrude both forwardly and rearwardly for a predetermined length. Referring to FIG. 11B, base 16 is subjected to a bending process along two-dot chain lines L1, L2 and others shown in FIG. 11A. Referring to FIG. 12A, piezoelectric/electrostrictive elements 12a, 12b are bonded onto outer sides of movable parts 16a, 16b to form the fifth piezoelectric/electrostrictive device 10e.

Here, in the fifth piezoelectric/electrostrictive device 10e, reinforcing parts 16f, 16g are bonded to neither fixing part 16c nor mounting part 16d; however, reinforcing parts 16f, 16g are more preferably bonded to fixing part 16c and mounting part 16d. As the bonding means therefor, one can adopt a bonding means such as spot welding, press-bonding, caulking, soldering, brazing, or using an adhesive such as epoxy resin or UV-curing type resin or the like. Among these bonding means, spot welding is especially preferable.

The fifth piezoelectric/electrostrictive device 10e has the same functions as the first piezoelectric/electrostrictive device 10a and produces approximately similar actions and effects as the first piezoelectric/electrostrictive device 10a. In particular, fixing part 16c and mounting part 16d are reinforced by reinforcing parts 16f, 16g.

Figure 1F:
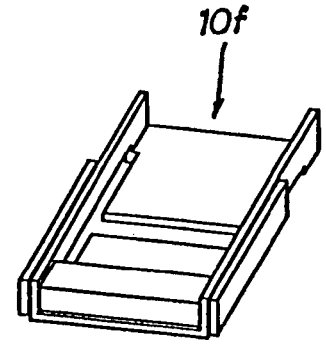

The sixth piezoelectric/electrostrictive device 10f shown in FIG. 1F belongs to the category of the piezoelectric/electrostrictive device of the second form according to the present invention. The sixth piezoelectric/electrostrictive device 10f is different from the first piezoelectric/electrostrictive device 10a in that a reinforcing member is added to the base, but the other parts are the same.

Figure 14A:
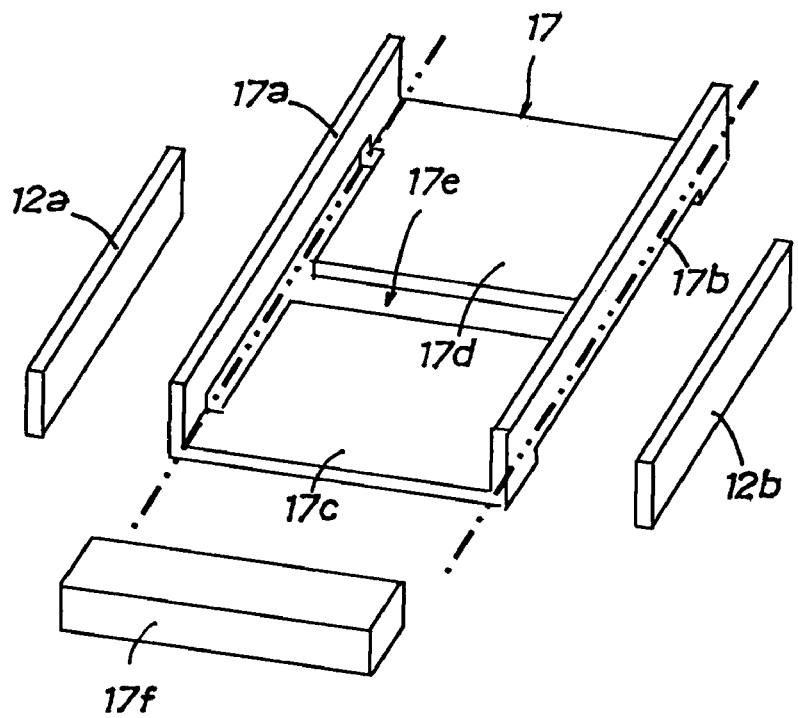
FIGS. 14A and 14B are a perspective view illustrating a state of assembling the sixth piezoelectric/electrostrictive device, and a perspective view illustrating the assembled piezoelectric/electrostrictive device, respectively.
Figure 14B:
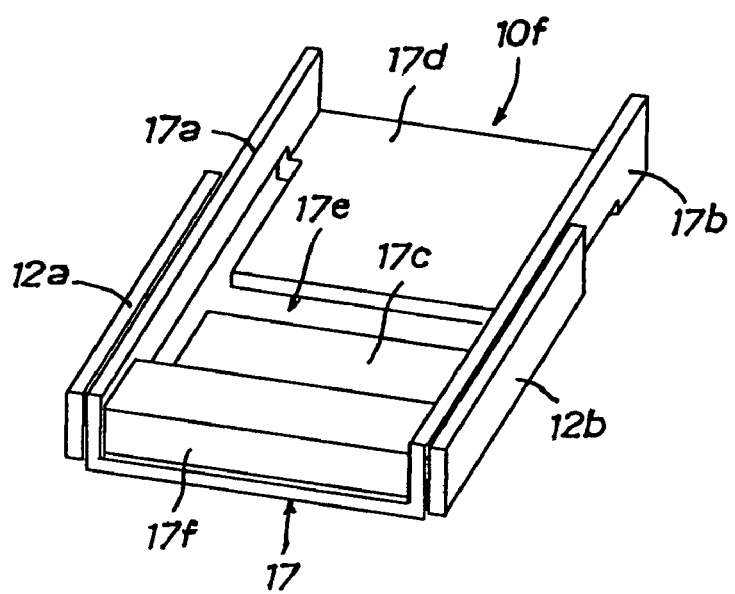

Now, referring to FIG. 14B, the sixth piezoelectric/electrostrictive device 10f is made of a base 17 and a pair of piezoelectric/electrostrictive elements 12a, 12b. Base 17 is constructed with a pair of right and left long and narrow plate-shaped movable parts 17a, 17b, a flat plate-shaped fixing part 17c that connects the movable parts 17a, 17b with each other at one end thereof, a flat plate-shaped mounting part 17d that connects the movable parts 17a, 17b with each other at the other end thereof, and a plate-shaped reinforcing member 17f inserted between the sides at one ends of movable parts 17a, 17b and bonded to the surface of fixing part 17c.

Figure 13A:
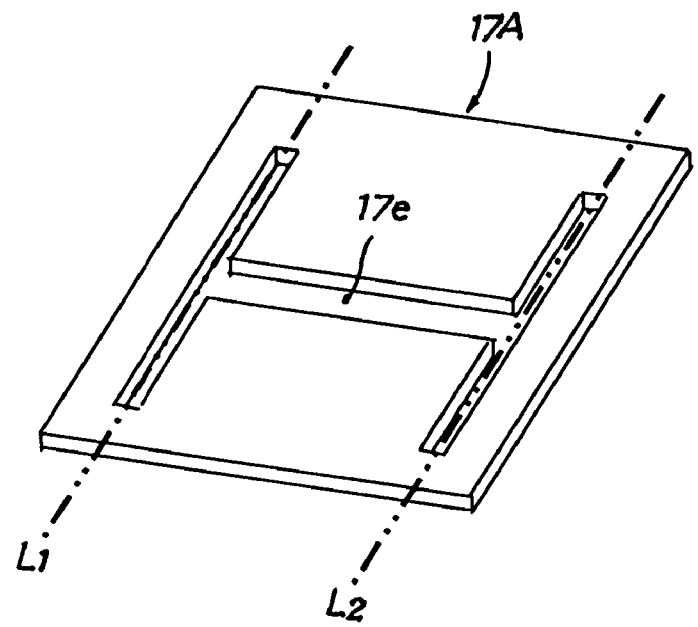
FIGS. 13A and 13B are a perspective view illustrating an original plate of a base constituting the sixth piezoelectric/electrostrictive device of the second form according to the present invention, and a perspective view illustrating the base formed by bending the original plate, respectively.
Figure 13B:
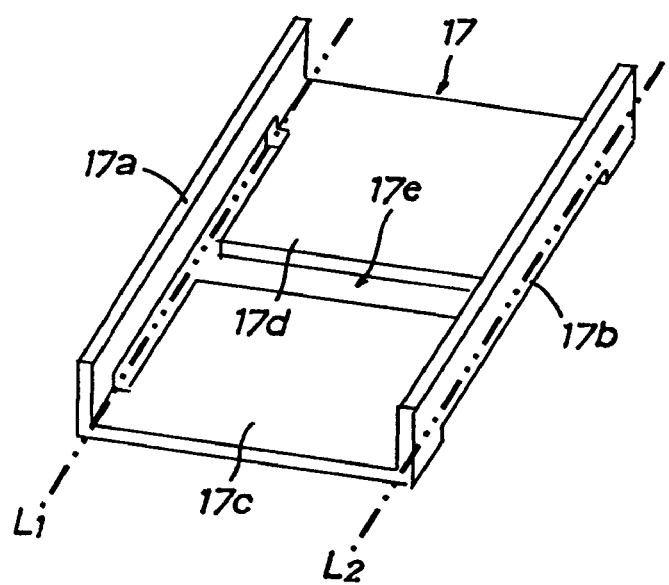

Referring to FIG. 13A, the original plate 17A of base 17 has the same shape as the original plate 11A of base 11. Referring to FIG. 13B, base 17 is subjected to a bending process along two-dot chain lines L1, L2. Referring to FIG. 14A, reinforcing member 17f is bonded onto the surface of fixing part 17c between the sides at one end of movable parts 17a, 17b, and piezoelectric/electrostrictive elements 12a, 12b are bonded onto outer sides of movable parts 17a, 17b to form the sixth piezoelectric/electrostrictive device 10f. The sixth piezoelectric/electrostrictive device 10f has the same functions as the fourth piezoelectric/electrostrictive device 10d and produces approximately similar actions and effects as the fourth piezoelectric/electrostrictive device 10d.

Figure 1G:
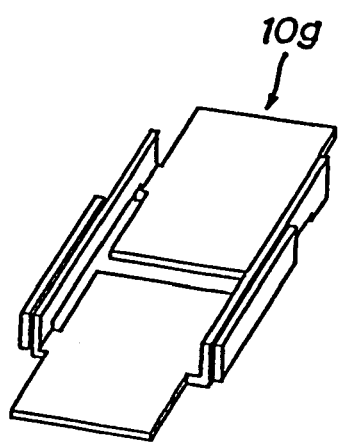

The seventh piezoelectric/electrostrictive device log shown in FIG. 1G belongs to the category of the piezoelectric/electrostrictive device of the second form according to the present invention. The seventh piezoelectric/electrostrictive device 10g is different from the first piezoelectric/electrostrictive device 10a in that the fixing part and the mounting part of the base are differently shaped, but the other parts are the same.

Figure 16A:
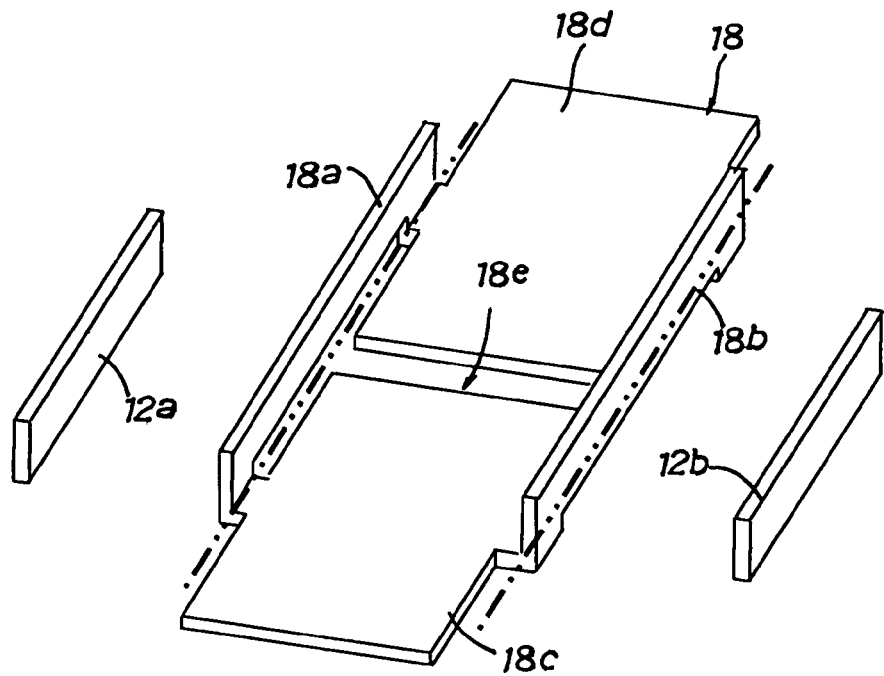
FIGS. 16A and 16B are a perspective view illustrating a state of assembling the seventh piezoelectric/electrostrictive device, and a perspective view illustrating the assembled piezoelectric/electrostrictive device, respectively.
Figure 16B:
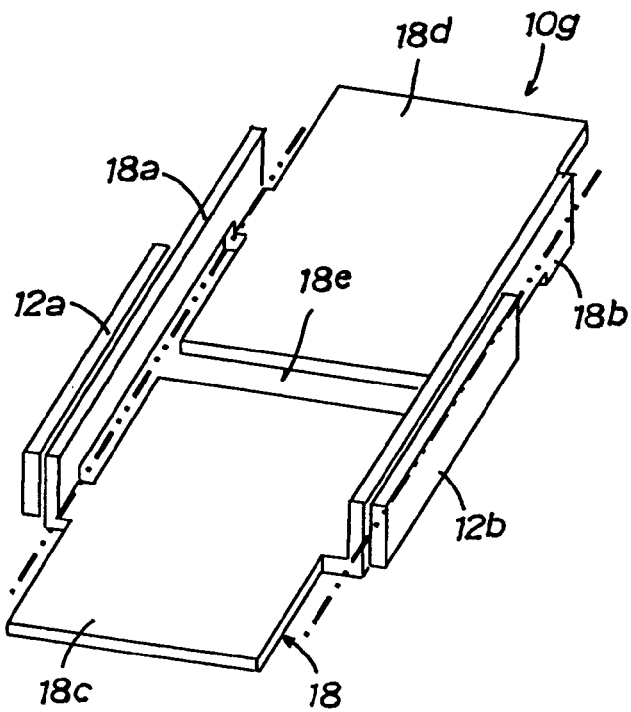

Now, referring to FIG. 16B, the seventh piezoelectric/electrostrictive device 10g is made of a base 18 and a pair of piezoelectric/electrostrictive elements 12a, 12b. Base 18 is constructed with a pair of right and left long and narrow plate-shaped movable parts 18a, 18b, a flat plate-shaped fixing part 18c that connects the movable parts 18a, 18b with each other at one end thereof, and a flat plate-shaped mounting part 18d that connects the movable parts 18a, 18b with each other at the other end thereof. Fixing part 18c protrudes for a predetermined length from one ends of movable parts 18a, 18b, and mounting part 18d protrudes for a predetermined length from the other ends of movable parts 18a, 18b. Therefore, fixing part 18c and mounting part 18d are an enlargement of fixing part 11c and mounting part 11d in base 11 of the first piezoelectric/electrostrictive device 10a, thereby ensuring a larger area.

Figure 15A:
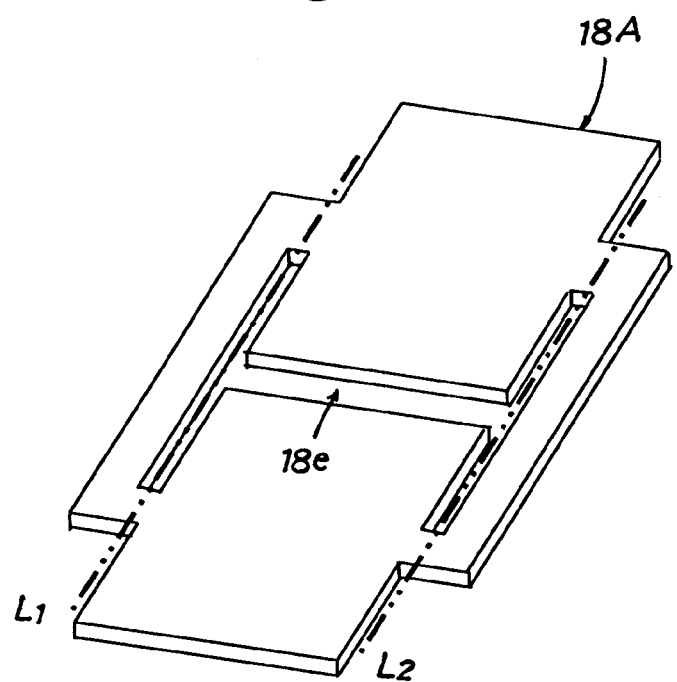
FIGS. 15A and 15B are a perspective view illustrating an original plate of a base constituting the seventh piezoelectric/electrostrictive device of the seventh embodiment according to the present invention, and a perspective view illustrating the base formed by bending the original plate, respectively.
Figure 15B:
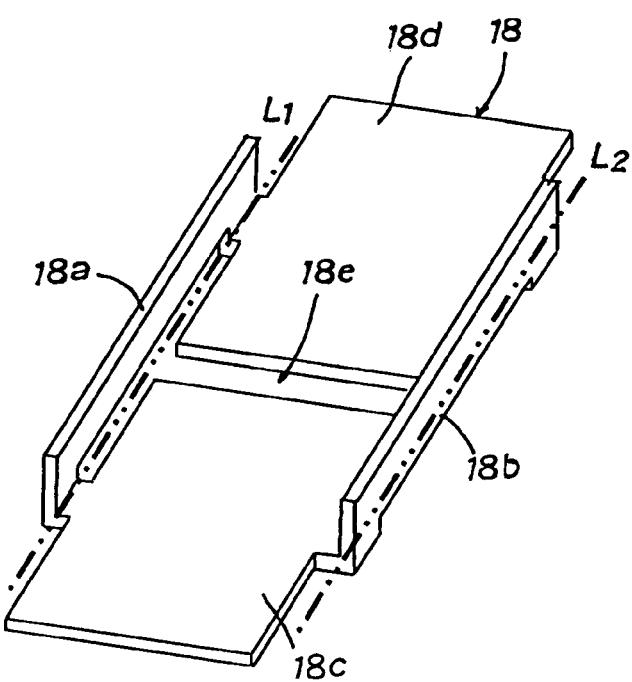

Base 18 is constructed in the same manner as base 11 except that the areas of fixing part 18c and mounting part 18d are enlarged. Further, referring to FIG. 15A, the original plate 18A of base 18 is constructed in such a manner that the front and rear sides of an H-shaped opening 18e, which are to be formed into fixing part 18c and mounting part 18d later, protrude forwardly and rearwardly for a predetermined length. Referring to FIG. 15B, base 18 is subjected to a bending process along two-dot chain lines L1, L2. Referring to FIG. 16A, piezoelectric/electrostrictive elements 12a, 12b are bonded onto outer sides of movable parts 18a, 18b to form the seventh piezoelectric/electrostrictive device 10g.

The seventh piezoelectric/electrostrictive device 10g has the same functions as the first piezoelectric/electrostrictive device 10a and produces approximately similar actions and effects as the first piezoelectric/electrostrictive device 10a. In particular, since fixing part 18c and mounting part 18d each have a larger area, the bonding area to the gimbal of the suspension can be enlarged, and the bonding area to the component to be controlled, such as the magnetic head of the hard disk drive, can be enlarged.

Figure 1H:
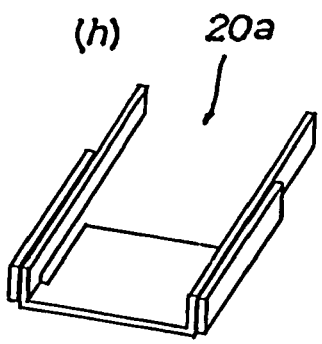
Figure 1I:
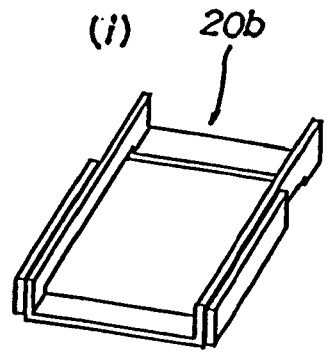

The eighth piezoelectric/electrostrictive device 20a shown in FIG. 1H belongs to the category of the piezoelectric/electrostrictive device of the first form according to the present invention. The eighth piezoelectric/electrostrictive device 20a has a base constructed in a greatly different manner from that of the first piezoelectric/electrostrictive device 10a.

Figure 18A:
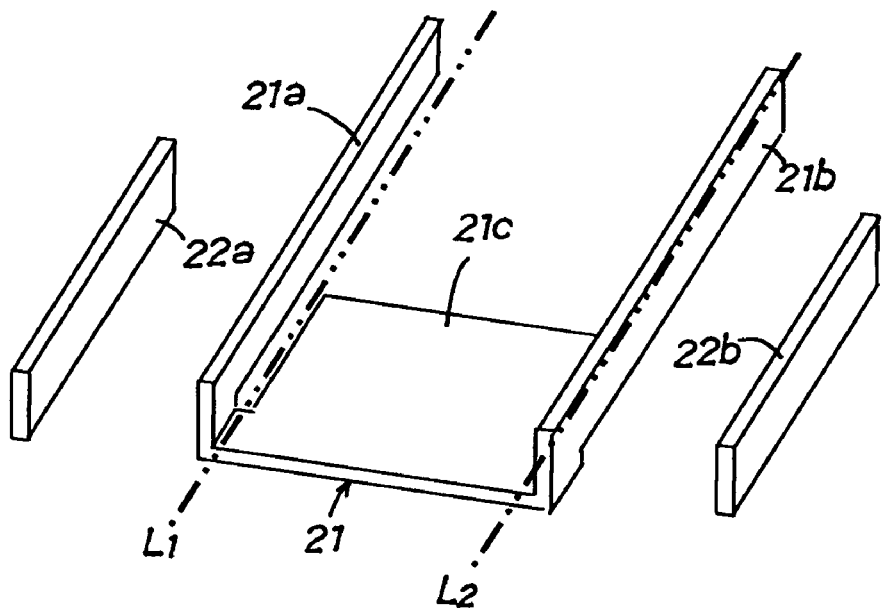
FIGS. 18A and 18B are a perspective view illustrating a state of assembling the eighth piezoelectric/electrostrictive device, and a perspective view illustrating the assembled piezoelectric/electrostrictive device, respectively.
Figure 18B:
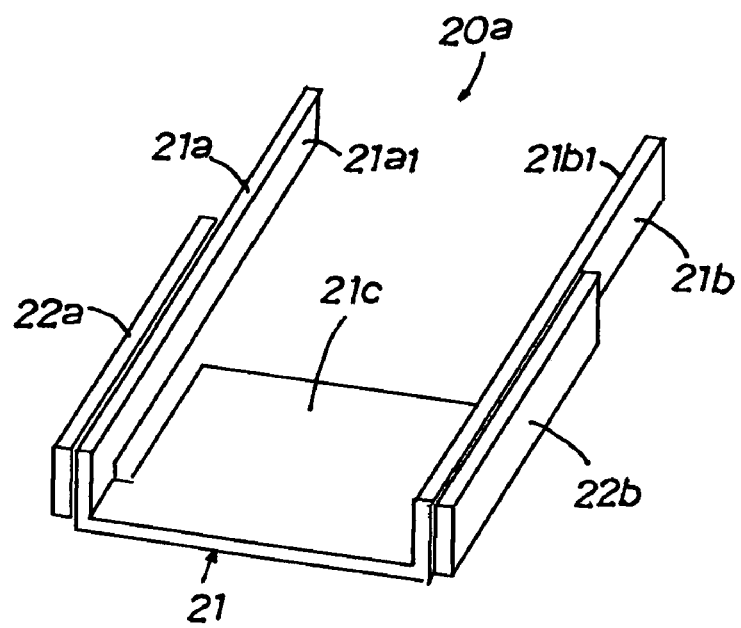

Now, referring to FIG. 18B, the eighth piezoelectric/electrostrictive device 20a is made of a base 21 and a pair of piezoelectric/electrostrictive elements 22a, 22b. Base 21 is constructed with a pair of right and left long and narrow plate-shaped movable parts 21a, 21b and a flat plate-shaped fixing part 21c that connects the movable parts 21a, 21b with each other at one end thereof. However, a mounting part is not provided on the other ends of movable parts 21a, 21b.

Figure 17A:
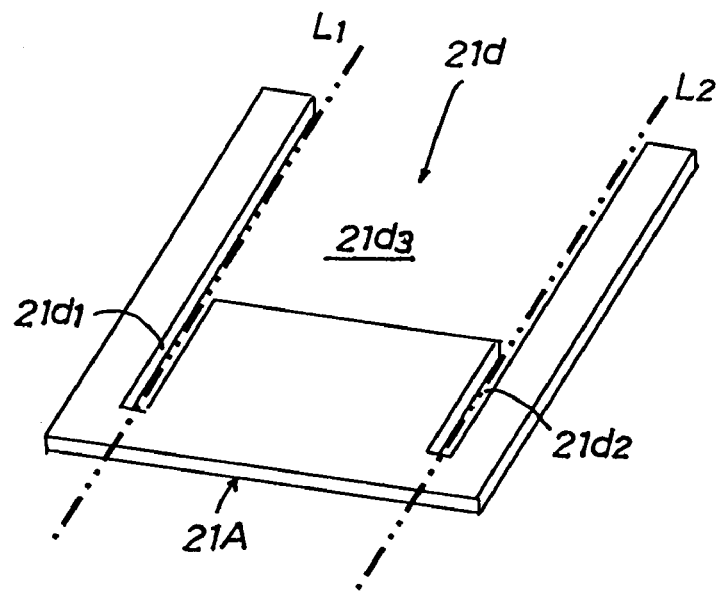
FIGS. 17A and 17B are a perspective view illustrating an original plate of a base constituting the eighth piezoelectric/electrostrictive device of the first form according to the present invention, and a perspective view illustrating the base formed by bending the original plate, respectively.
Figure 17B:
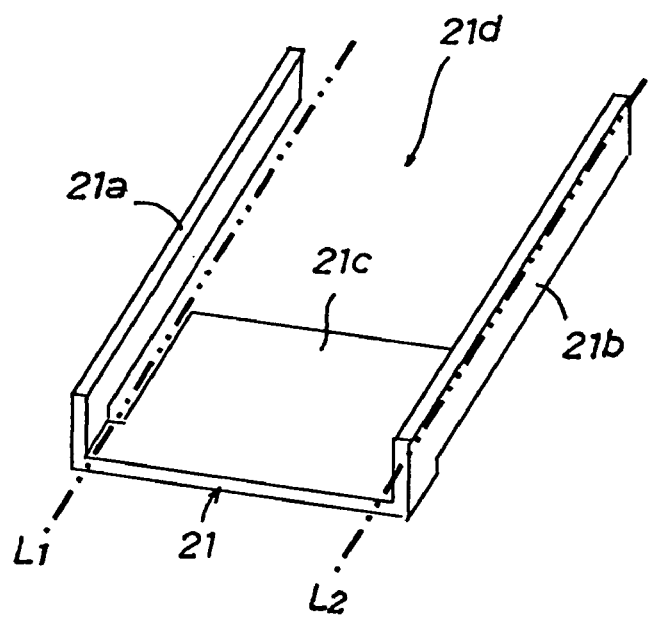

Referring to FIG. 17A, the original plate 21A of base 21 is formed by subjecting a flat plate to a stamping process, and is provided with a gate-shaped opening 21d. Opening 21d has a shape provided with a pair of straight side grooves 21d1, 21d2 located at right and left sides of the flat plate and extending to the front and rear ends, and an open site 21d3 obtained by cutting and removing the other end located between these two grooves 21d1, 21d2. Base 21 is formed by perpendicularly bending the right and left sides of original plate 21A at the side grooves 21d1, 21d2 along central lines L1, L2 that extend at the center of the width of the grooves 21d1, 21d2 in the longitudinal direction thereof, as shown in FIG. 17B. By bending the right and left sides of original plate 21A in such a manner, the sites located outside the side grooves 21d1, 21d2 are formed into movable parts 21a, 21b, and the site between the side grooves 21d1, 21d2 is formed into fixing part 21c.

In base 21 thus integrally constructed from original plate 21A, piezoelectric/electrostrictive elements 22a, 22b are bonded via an adhesive onto the outer sides of movable parts 21a, 21b as shown in FIG. 18A to form piezoelectric/electrostrictive device 20a shown in FIG. 18B. Piezoelectric/electrostrictive device 20a thus formed functions in the same manner as the conventional piezoelectric/electrostrictive devices of this form by being used in a state in which a component to be controlled, such as a magnetic head, is bonded between the other ends of movable parts 21a, 21b. However, since base 21 is integrally constructed from one sheet of original plate 21A, piezoelectric/electrostrictive device 20a produces the following functions and effects.

Namely, in the eighth piezoelectric/electrostrictive device 20a, base 21 has an integral structure made of original plate 21A and is constructed with one construction component. Therefore, the construction components are two kinds, i.e. base 21 and piezoelectric/electrostrictive elements 22a, 22b, so that the number of construction components of piezoelectric/electrostrictive device 20a can be greatly reduced, and the number of steps for assembling the construction components can be reduced, thereby leading to large reduction of costs.

Further, in the eighth piezoelectric/electrostrictive device 20a, since the number of construction components is extremely small and the number of bonding sites between the construction components is extremely small, there is little or no variation in the adhesion between the construction components, whereby the eighth piezoelectric/electrostrictive device 20a has device characteristics in which the set precision is high.

Further, in forming the eighth piezoelectric/electrostrictive device 20a, there is no need to adopt means for cutting a device master at numerous sites as in the prior art, so that there is no contamination caused by adhesion of dusts and other contaminants generated at the time of cutting the device master. For this reason, if base 21 and piezoelectric/electrostrictive elements 22a, 22b are cleaned in advance in assembling the eighth piezoelectric/electrostrictive device 20a, the assembled piezoelectric/electrostrictive device 20a has little or no contamination, thereby providing a great advantage that the step of cleaning the piezoelectric/electrostrictive device 20a can be omitted or carried out in a simple manner.

Figure 19:
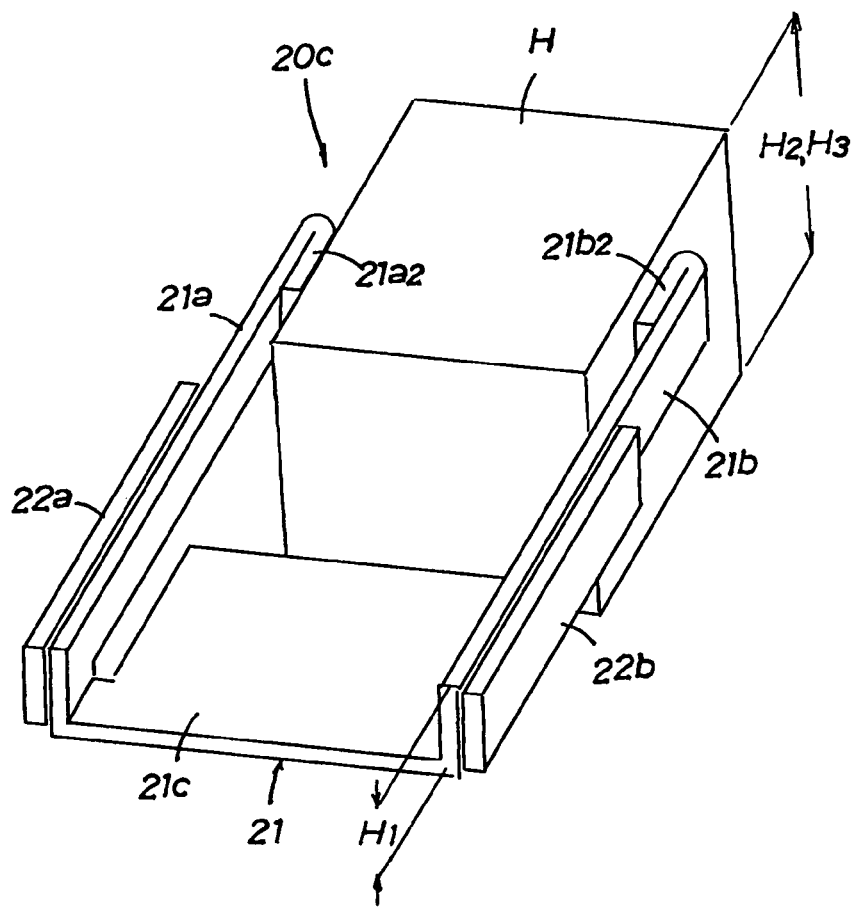
FIG. 19 is a perspective view illustrating a state in which a component to be controlled is mounted on the first modification of the eighth piezoelectric/electrostrictive device.

The mounting of the component to be controlled and others onto the eighth piezoelectric/electrostrictive device 20a is carried out by fixing them onto the inner surfaces 21a1, 21b1 on the tip end side of movable parts 21a, 21b via an adhesive. In this case, as will be clear if reference is made to FIG. 19 illustrating a later-mentioned piezoelectric/electrostrictive device 20c which is a modification of the piezoelectric/electrostrictive device 20a, if the height H1 of device 20a is smaller than the height H2 of the component to be controlled, the height H3 in the state in which device 20a and the component to be controlled are assembled will be equal to the height H2 of the component to be controlled (H3=H2), whereby the height H1 of device 20a can be ignored. This provides an advantage that a further reduction of space can be achieved as compared with the piezoelectric/electrostrictive devices according to other embodiments of the present invention.

Here, in this assembled structure, since the component to be controlled is sandwiched between the two movable parts 21a, 21b, the interval between the inner surfaces 21a1, 21b1 on the tip end side of movable parts 21a, 21b must be set substantially equal to the width dimension including the width of the component to be controlled and the thickness of the intervening adhesive layer. If this is neglected, when the interval between the inner surfaces 21a1, 21b1 on the tip end side of movable parts 21a, 21b is too narrow, the component cannot be placed between the inner surfaces 21a1, 21b1 on the tip end side of movable parts 21a, 21b, thereby making the assemblage impossible, whereas if the interval between the inner surfaces 21a1, 21b1 on the tip end side of movable parts 21a, 21b is too wide, the component to be controlled cannot be bonded to both of the inner surfaces 21a1, 21b1 on the tip end side of movable parts 21a, 21b, thereby making the assemblage impossible.

Further, if this assembled structure is adopted, even if the interval between the inner surfaces 21a1, 21b1 on the tip end side of movable parts 21a, 21b is set to be at a width dimension such that the component can be placed and bonded to both of the inner surfaces 21a1, 21b1 on the tip end side of movable parts 21a, 21b, if the thickness of the adhesive layer for bonding the component to be controlled onto the inner surfaces 21a1, 21b1 on the tip end side of movable parts 21a, 21b varies, the displacement resonance of the two movable parts 21a, 21b is changed, thereby causing variation in the device characteristics. For this reason, in a bending process for forming base 21, a press-molding means of high precision is adopted to enable mass production of bases 21 bent in a highly precise manner. This will reduce the variation in the thickness of the adhesive layer for bonding the component onto the inner surfaces 21a1, 21b1 on the tip end side of movable parts 21a, 21b as much as possible, whereby the device will have a quality with extremely reduced variation of device characteristics.

FIG. 19 illustrates a piezoelectric/electrostrictive device 20c which is a first modification of the eighth piezoelectric/electrostrictive device 20a. The piezoelectric/electrostrictive device 20c has the same basic construction as the piezoelectric/electrostrictive device 20a, and is different in construction from the piezoelectric/electrostrictive device 20a only in that the tip ends of movable parts 21a, 21b are inwardly bent. Namely, movable parts 21a, 21b have bent portions 21a2, 21b2 at the tip ends thereof. The bent portions 21a2, 21b2 are formed by bending the tip ends of movable parts 21a, 21b inwardly by about 180°, and the inside surfaces of the bent portions 21a2, 21b2 face each other to provide mounting sites for mounting the component H to be controlled. The component H to be controlled is mounted by being bonded to the inside surfaces of bent portions 21a2, 21b2 via a suitable adhesive.

Here, since the other parts of piezoelectric/electrostrictive device 20c are the same as those of piezoelectric/electrostrictive device 20a, like constituent members and like constituent sites are denoted with like reference numerals, and their detailed description will be omitted.

Thus, in the piezoelectric/electrostrictive device 20c, the bonding length and the bonding area to the component H to be controlled can be defined by the two bent portions 21a2, 21b2, thereby effectively eliminating the variation of the bonding length and the bonding area to the component H to be controlled among individual devices. This can eliminate the variation in the value of displacement resonance among individual devices caused by the variation in the bonding length and the bonding area to the component H to be controlled.

Here, in the piezoelectric/electrostrictive device 20c, as described in the function and effects of the eighth piezoelectric/electrostrictive device 20a, since the height H1 of device 20c is smaller than the height H2 of the component to be controlled, the height H3 in the state in which the component H to be controlled is mounted on device 20c is equal to the height H2 of the component H to be controlled (H3=H2), so that the height H1 of device 20c can be ignored, thereby providing an advantage of further reduction in the space as compared with the piezoelectric/electrostrictive devices according to other embodiments of the present invention.

Figure 20:
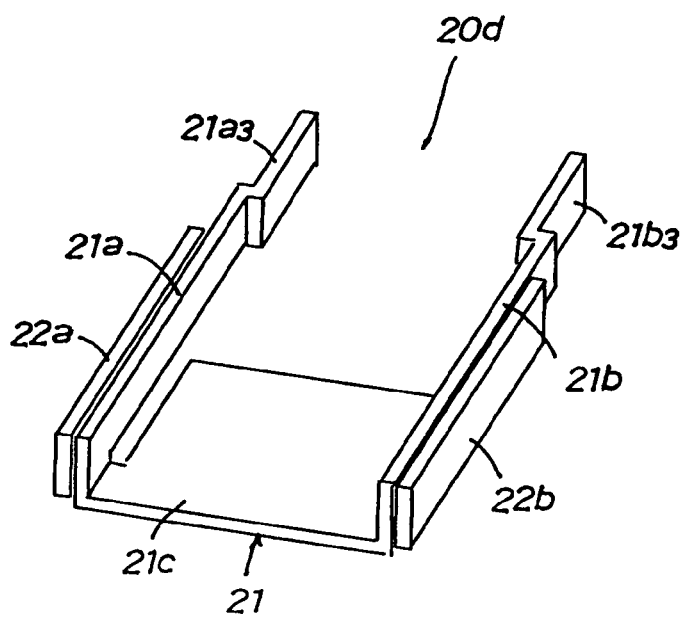
FIG. 20 is a perspective view illustrating the second modification of the eighth piezoelectric/electrostrictive device.

FIG. 20 illustrates a piezoelectric/electrostrictive device 20d which is a second modification of the eighth piezoelectric/electrostrictive device 20a. The piezoelectric/electrostrictive device 20d has the same basic construction as the piezoelectric/electrostrictive device 20a, and is different in construction from the piezoelectric/electrostrictive device 20a only in that the movable parts 21a, 21b are formed to be narrow band-shaped plates with steps, and the tip ends of movable parts 21a, 21b constitute crooked portions 21a3, 21b3 that are slightly biased inwardly from the principal part. The crooked portions 21a3, 21b3 of movable parts 21a, 21b are positioned to face each other, and the inside surfaces of these crooked portions 21a3, 21b3 constitute mounting sites for mounting the component H to be controlled, in the same manner as the bent portions 21a2, 21b2 in piezoelectric/electrostrictive device 20c. The component H to be controlled is bonded onto the inside surfaces of crooked portions 21a3, 21b3 via a suitable adhesive. Therefore, the piezoelectric/electrostrictive device 20d functions in the same manner as the piezoelectric/electrostrictive device 20c, and produces the same actions and effects as the piezoelectric/electrostrictive device 20c.

Here, since the other parts of piezoelectric/electrostrictive device 20d are the same as those of piezoelectric/electrostrictive device 20c, the same constituent members and the same constituent sites as in piezoelectric/electrostrictive device 20c are denoted with the same reference numerals as in piezoelectric/electrostrictive device 20c, and their detailed description will be omitted.

The ninth piezoelectric/electrostrictive device 20b shown in FIG. 11 belongs to the category of the piezoelectric/electrostrictive device of the second form according to the present invention. The ninth piezoelectric/electrostrictive device 20b has a base constructed in a greatly different manner from that of the first piezoelectric/electrostrictive device 10a.

Figure 22A:
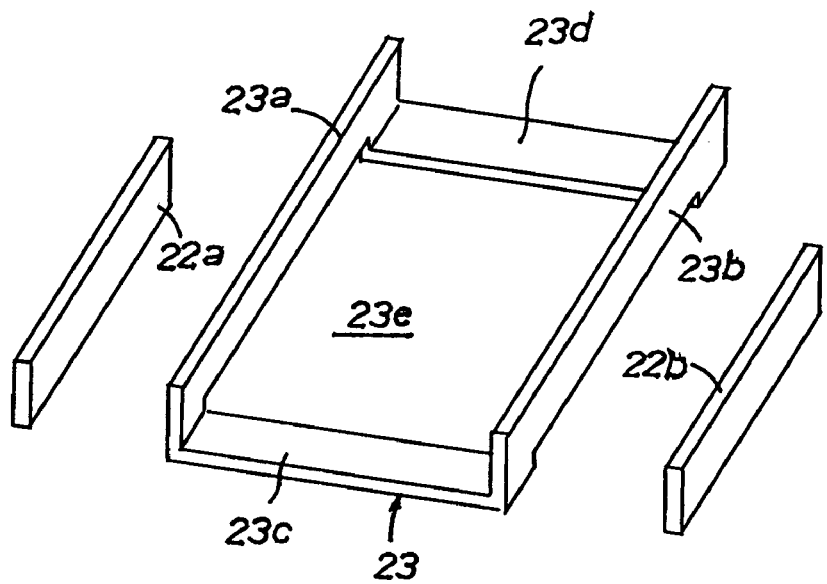
FIGS. 22A and 22B are a perspective view illustrating a state of assembling the ninth piezoelectric/electrostrictive device, and a perspective view illustrating the assembled piezoelectric/electrostrictive device, respectively.
Figure 22B:
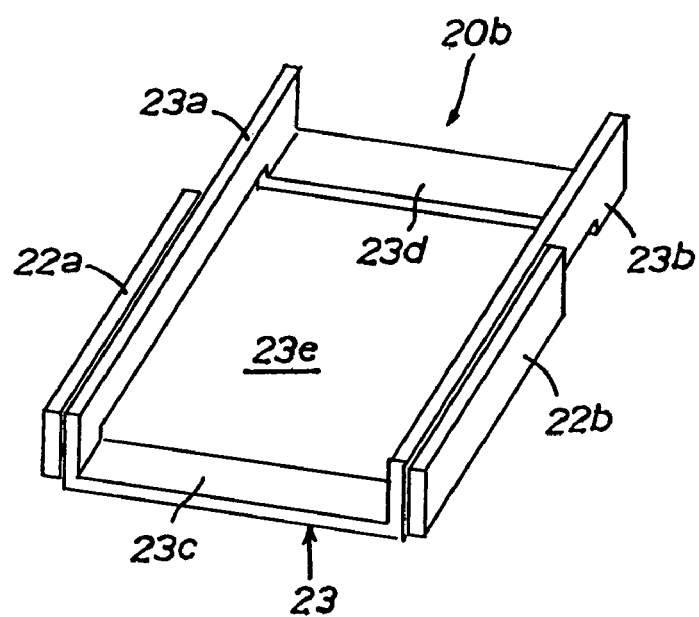

Now, referring to FIG. 22B, the ninth piezoelectric/electrostrictive device 20b is made of a base 23 and a pair of piezoelectric/electrostrictive elements 22a, 22b. Base 23 is constructed with a pair of right and left long and narrow plate-shaped movable parts 23a, 23b, a flat and narrow plate-shaped fixing part 23c that connects the movable parts 23a, 23b with each other at one end thereof, and a flat and narrow plate-shaped mounting part 23d that connects the movable parts 23a, 23b with each other at the other end thereof.

Figure 21A:
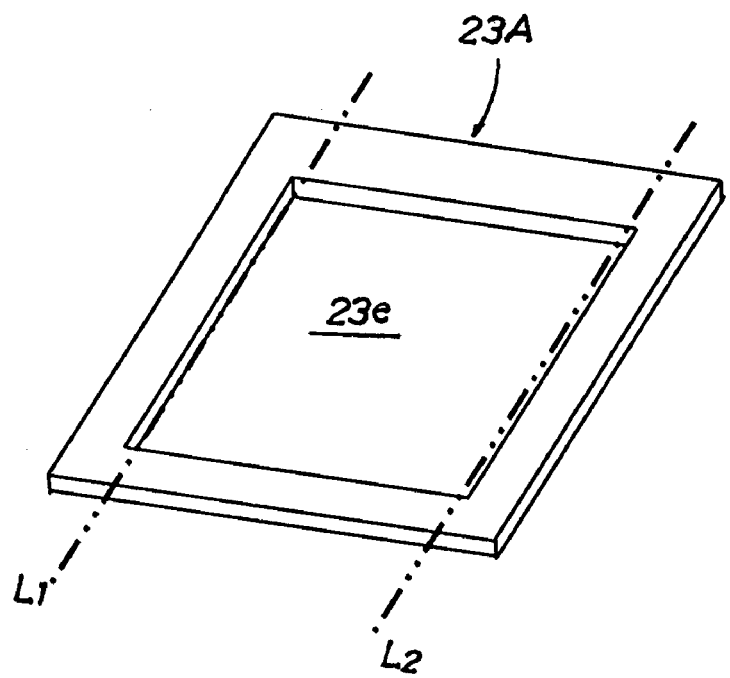
FIGS. 21A and 21B are a perspective view illustrating an original plate of a base constituting the ninth piezoelectric/electrostrictive device of the second form according to the present invention, and a perspective view illustrating the base formed by bending the original plate, respectively.
Figure 21B:
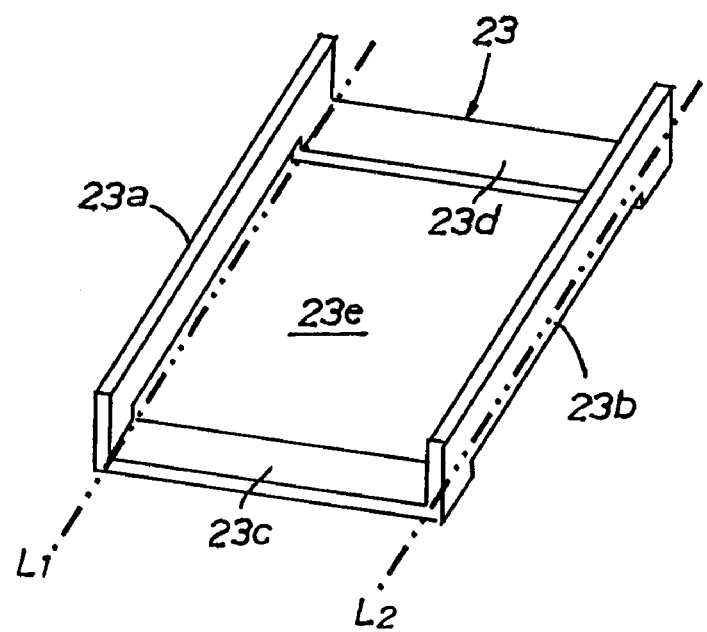

Referring to FIG. 21A, the original plate 23A of base 23 is formed by subjecting a flat plate to a stamping process, and is provided with a generally square-shaped opening 23e. Base 23 is formed by perpendicularly bending the right and left sides of original plate 23A at the opening peripheries of opening 23e along central lines L1, L2 that extend along the opening peripheries in the longitudinal direction, as shown in FIG. 21B. By bending the right and left sides of original plate 23A in such a manner, the sides of the opening peripheries are formed into movable parts 23a, 23b, and the sites between the sides of the opening peripheries are formed into fixing part 23c and mounting part 23d.

In base 23 thus integrally constructed from original plate 23A, piezoelectric/electrostrictive elements 22a, 22b are bonded via an adhesive onto the outer sides of movable parts 23a, 23b as shown in FIG. 22A to form piezoelectric/electrostrictive device 20b shown in FIG. 22B. The assembled piezoelectric/electrostrictive device 20b functions in the same manner as the conventional piezoelectric/electrostrictive devices of this form. However, since base 23 is integrally constructed from one sheet of original plate 23A, piezoelectric/electrostrictive device 20b produces approximately the same functions and effects as the first piezoelectric/electrostrictive device 10a and the eighth piezoelectric/electrostrictive device 20a.

In the ninth piezoelectric/electrostrictive device 20b, fixing part 23c and mounting part 23d are small, and the bonding area to the actuator or the component to be controlled is small. However, if one can adopt means for firmly joining the component with a small bonding area, such as spot welding, the ninth piezoelectric/electrostrictive device 20b has no disadvantage. A large fixing part or mounting part acts as a superfluous weight (mass). In this respect, the ninth piezoelectric/electrostrictive device 20b is different from the other piezoelectric/electrostrictive devices 10a to 10g. Since a superfluous mass is absent, the resonance frequency can be set to be high, thereby providing an advantage that the actuator can be operated at a higher speed.

Regarding the piezoelectric/electrostrictive devices 10a to 10g, 20a to 20d according to the above-described embodiments, in the stamped structure adopted as an original plate for forming the bases 11 to 18, 21, and 23, the openings 11e to 18e, 21d, and 23e are formed by stamping simultaneously at the time of the stamping process. However, these openings 11e to 18e, 21d, and 23e of the original plate can be formed by machining the original plate stamped out into a predetermined shape, using means other than the stamping means, for example, a hole-forming machining means such as laser machining, electric discharge machining, drill machining, supersonic wave machining, or etching. Regarding the hole-forming machining means, if means other than etching is used, burrs may be generated at the edge of the machined hole; however, the burrs can be easily removed by an etching process or a blasting process.

Further, the movable parts 11a, 11b . . . constituting the bases 11, 13 to 18, 21, 23 of the piezoelectric/electrostrictive devices 10a to 10g, 20a to 20d are preferably bent at an angle of about 90° to the fixing parts 11c. . . and the mounting parts 11d . . . , and the intersecting angle is within the range of 90°±10°, preferably 90°±5°, more preferably 90°±1°. If the angle of bending the movable parts 11a, 11b . . . is deviated from 90°, the displacement in the flapping direction will be large. Here, the above notation . . . is used to mean that the reference numerals of the other corresponding sites are omitted, and is used to abbreviate the description.

The bases 11 to 18, 21, 23 formed by bending are preferably subjected to a supersonic wave cleaning process using a detergent, an organic solvent, or the like. With the use of supersonic wave cleaning, the bases are not destroyed even if the power is increased, so that supersonic wave cleaning with a large power can remove the contamination easily.

Further, the piezoelectric/electrostrictive devices 10a to 10g, 20a to 20d are constructed in such a manner that the base and the piezoelectric/electrostrictive elements are formed as separate bodies, and the piezoelectric/electrostrictive elements are bonded to the movable parts of the base. However, in the piezoelectric/electrostrictive devices according to the present invention, a piezoelectric/electrostrictive layer and electrodes can be formed as films by means of sputtering, CVD, MBE, or the like or formed as films by the sol-gel method onto the portions to become the movable parts in the original plate before being formed into the base, or onto the movable parts of the base, thereby to form the piezoelectric/electrostrictive elements directly on the base.

The piezoelectric/electrostrictive elements 12a, 12b, 22a, 22b constituting the piezoelectric/electrostrictive devices 10a to 10g, 20a to 20d according to the above-described embodiments are each provided with a piezoelectric/electrostrictive layer and a pair of electrodes for applying an electric field thereto, and are piezoelectric/electrostrictive elements of unimorph type, bimorph type, or the like. Among these, piezoelectric/electrostrictive elements of unimorph type are excellent in the stability of the generating displacement, and are also advantageous for weight reduction, so that they are suitable as a construction component of piezoelectric/electrostrictive devices.

FIGS. 23 and 24 illustrate several examples of piezoelectric/electrostrictive elements 31 to 34 that are suitably adopted as the piezoelectric/electrostrictive elements 12a, 12b, 22a, 22b constituting the piezoelectric/electrostrictive devices 10a to 10g, 20a to 20d.

Figure 23A:
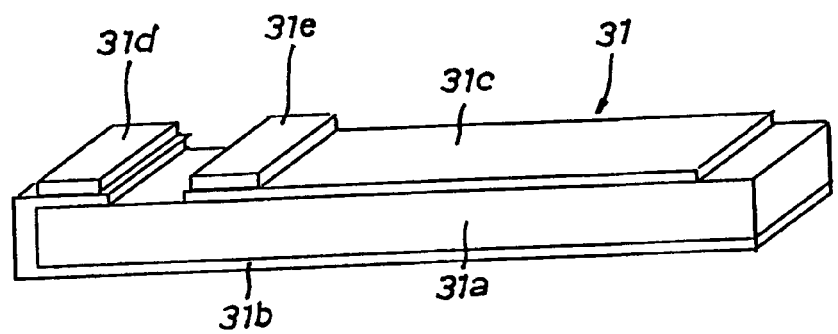
FIGS. 23A and FIG. 23B are perspective views illustrating two examples of piezoelectric/electrostrictive elements adopted as the piezoelectric/electrostrictive element constituting the piezoelectric/electrostrictive device according to the present invention.
Figure 23B:
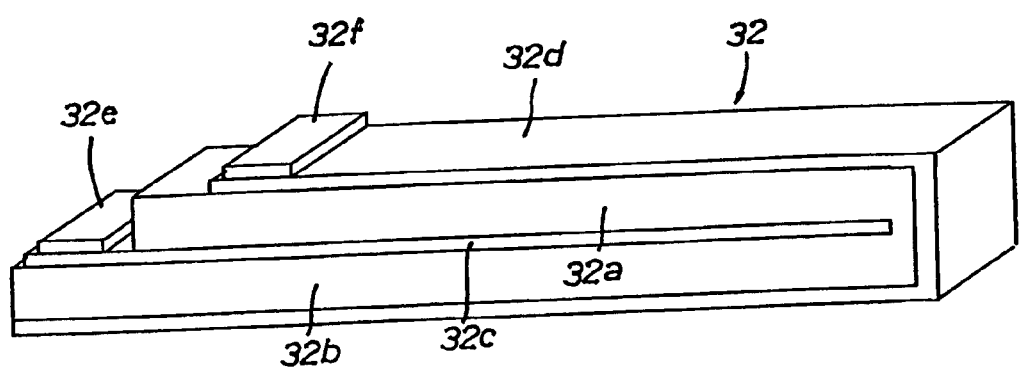

Piezoelectric/electrostrictive element 31 shown in FIG. 23A has a one-layer structure in which the piezoelectric/electrostrictive layer consists of one layer, and is constructed with a piezoelectric/electrostrictive layer 31a, a pair of lower first and upper second electrodes 31b, 31c, and a pair of terminals 31d, 31e. Piezoelectric/electrostrictive element 32 shown in FIG. 23B has a two-layer structure in which the piezoelectric/electrostrictive layer consists of two layers, and is constructed with piezoelectric/electrostrictive layers 32a, 32b, a first electrode 32c that intervenes between the two piezoelectric/electrostrictive layers 32a, 32b, a second electrode 32d that surrounds the outer sides of the two piezoelectric/electrostrictive layers 32a, 32b, and a pair of terminals 32e, 32f.

Figure 24A:
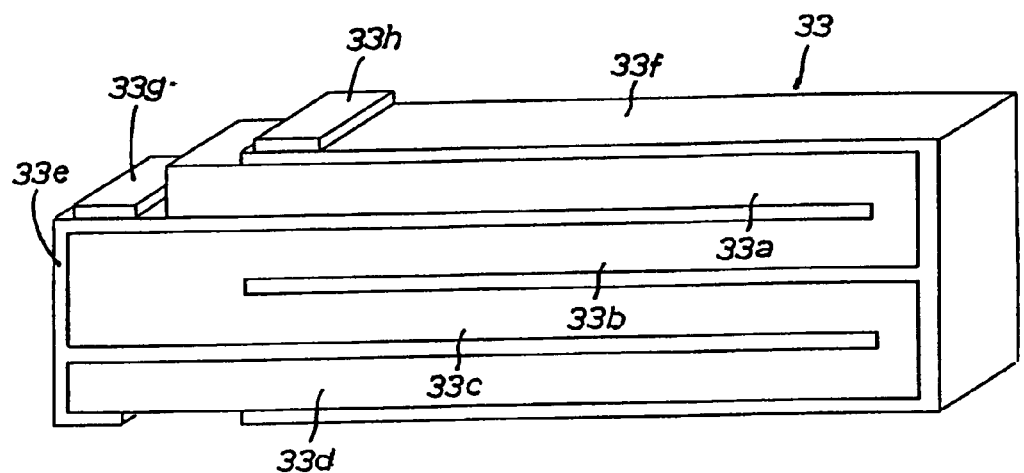
FIGS. 24A and FIG. 24B are perspective views illustrating two other examples of piezoelectric/electrostrictive elements adopted as the piezoelectric/electrostrictive element constituting the piezoelectric/electrostrictive device according to the present invention.
Figure 24B:
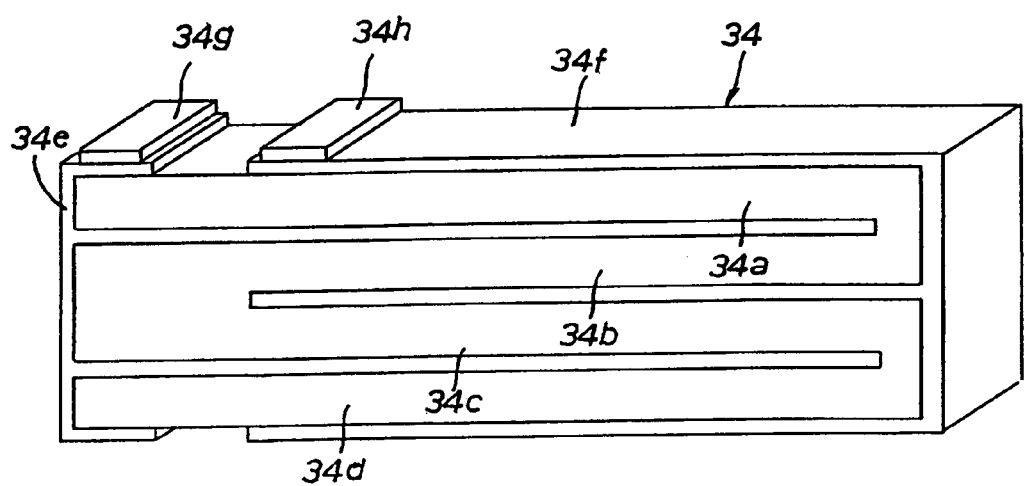

Piezoelectric/electrostrictive elements 33, 34 shown in FIG. 24 each have a four-layer structure in which the piezoelectric/electrostrictive layer consists of four layers. Piezoelectric/electrostrictive element 33 shown in FIG. 24A is constructed with piezoelectric/electrostrictive layers 33a, 33b, 33c, 33d, first and second electrodes 33e, 33f that intervene between and surround the four piezoelectric/electrostrictive layers 33a, 33b, 33c, 33d, and a pair of terminals 33g, 33h. The piezoelectric/electrostrictive element 34 shown in FIG. 24B is different from the piezoelectric/electrostrictive element 33 in that the terminals are placed at different sites. Piezoelectric/electrostrictive element 34 is constructed with piezoelectric/electrostrictive layers 34a, 34b, 34c, 34d, first and second electrodes 34e, 34f that intervene between and surround the four piezoelectric/electrostrictive layers 34a, 34b, 34c, 34d, and a pair of terminals 34g, 34h.

These piezoel÷½÷½ic/electrostrictive elements 31 to 34 are suitably adopted as the piezoelectric/electrostrictive elements 12a, 12b, 22a, 22b of the piezoelectric/electrostrictive devices 10a to 10g, 20a to 20d in accordance with the usage of the piezoelectric/electrostrictive devices.

In addition to piezoelectric ceramic, one can use electrostrictive ceramic, ferroelectric ceramic, antiferroelectric ceramic, or the like as well in the piezoelectric/electrostrictive layers constituting the piezoelectric/electrostrictive elements 31 to 34. However, if the piezoelectric/electrostrictive device is used for positioning the magnetic head of a hard disk drive or the like purpose, it is preferable to use a material whose striation (distortion) hysteresis is small because the linearity between the displacement amount of the mounting part and the driving voltage or the output voltage is essential. It is preferable to use a material having a coercive electric field of at most 10 kV/mm.

As a material for forming the piezoelectric/electrostrictive layers, one can specifically mention lead zirconate, lead titanate, magnesium lead niobate, zinc lead niobate, manganese lead niobate, antimony lead stannate, manganese lead tungstate, cobalt lead niobate, barium titanate, bismuth sodium titanate, potassium sodium niobate, strontium bismuth tantalate, and others, which are used either alone or as a suitable mixture thereof. Particularly, a material containing lead zirconate, lead titanate, or magnesium lead niobate as a major component, or a material containing bismuth sodium titanate as a major component is suitable.

The characteristics of the piezoelectric/electrostrictive layers can be adjusted by adding a suitable material to the materials for forming the piezoelectric/electrostrictive layers. As a material to be added, one can mention oxides of lanthanum, calcium, strontium, molybdenum, tungsten, barium, niobium, zinc, nickel, manganese, cesium, cadmium, chromium, cobalt, antimony, iron, yttrium, tantalum, lithium, bismuth, tin, and others, or materials that eventually become oxides, which are used either alone or as a suitable mixture thereof.

For example, by allowing lanthanum or strontium to be contained in lead zirconate, lead titanate, magnesium lead niobate, or the like constituting the major component, there will be provided an advantage that the coercive electric field or the piezoelectric property can be adjusted. Here, it is preferable to avoid addition of a material that easily undergoes vitrification, such as silica. This is because a material such as silica that easily undergoes vitrification is liable to react with the piezoelectric/electrostrictive layers at the time of thermal treatment of the piezoelectric/electrostrictive layers, and changes their composition to deteriorate the piezoelectric properties.

The electrodes constituting the piezoelectric/electrostrictive elements 31 to 34 are preferably made of a metal material that is solid at room temperature and e÷½ellent in electrical conductivity. As a metal material, one can mention metals such as aluminum, titanium, chromium, iron, cobalt, nickel, copper, zinc, niobium, molybdenum, ruthenium, palladium, rhodium, silver, tin, tantalum, tungsten, iridium, platinum, gold, or lead, which are used as a single metal or an alloy of these metals. Further, one can use a thermal material obtained by dispersing ceramics made of the same materials as or made of different materials from the piezoelectric/electrostrictive layers into these metal materials.

Piezoelectric/electrostrictive elements 31 to 34 are preferably formed by integrally baking the piezoelectric/electrostrictive layers and the electrodes in a mutually laminated state. In this case, as the electrodes, it is preferable to adopt those made of a high-melting-point metal material such as platinum, palladium, or an alloy of these, or an electrode made of a thermal material which is a mixture of a high-melting-point metal material and the materials for forming the piezoelectric/electrostrictive layers or other ceramic materials. The thickness of the electrodes preferably has a film shape as thin as possible because the thickness becomes a factor that affects the displacement of the piezoelectric/electrostrictive elements. For this reason, in order that the electrodes formed by being integrally baked with the piezoelectric/electrostrictive layers have a film shape as thin as possible, it is preferable to use the material for forming the electrodes in a form of a metal paste, for example, a gold resinate paste, platinum resinate paste, silver resinate paste, or the like.

The thickness of each of the piezoelectric/electrostrictive elements 31 to 34 is preferably within a range from 40 μm to 180 μm if piezoelectric/electrostrictive elements 31 to 34 are to be used as the piezoelectric/electrostrictive elements 12a, 12b, 22a, 22b of the piezoelectric/electrostrictive device according to each embodiment. If the thickness is below 40 μm, piezoelectric/electrostrictive elements 31 to 34 are liable to be broken during the handling, whereas if the thickness exceeds 180 μm, the scale reduction of the device will be difficult. Further, by allowing the piezoelectric/electrostrictive elements to have a multi-layer structure such as in the piezoelectric/electrostrictive elements 33, 34, one can increase the output of the piezoelectric/electrostrictive elements to enlarge the displacement of the device. Furthermore, by allowing the piezoelectric/electrostrictive elements to have a multi-layer structure, the rigidity of the device will be improved, thereby advantageously raising the resonance frequency of the device to increase the speed of the displacement operation of the device.

Piezoelectric/electrostrictive elements 31 to 34 are prepared using means for cutting an original plate of a large area, which is formed by laminating and baking the piezoelectric/electrostrictive layers and the electrodes by printing or tape molding, out into a predetermined dimension in a large number with the use of a dicing machine, a slicer, a wire-saw, or the like. Piezoelectric/electrostrictive elements 31 to 34 are thinner and have a lower hardness than known ceramic bases, so that the speed of cutting the original plate can be set to be high, whereby the original plates can be processed in a large mass and at a high speed.

Piezoelectric/electrostrictive elements 31 to 34 have a simple plate-shaped structure and can be easily handled with. Also, since the surface area is small, the amount of adhering dust is small, and the dust can be easily removed. However, since the piezoelectric/electrostrictive elements are mainly made of a ceramic material, a suitable cleaning condition must be set in supersonic wave cleaning. In a piezoelectric/electrostrictive element cut out from the original plate, it is preferable to perform a precision cleaning treatment by US cleaning and then perform a heat treatment at 100° C. to 1000° C. in atmospheric air so as to completely remove the moisture and organic substances that have penetrated into fine pores of the ceramic material.

If the piezoelectric/electrostrictive elements 31 to 34 are to be adopted as the piezoelectric/electrostrictive elements 12a, 12b, 22a, 22b constituting the piezoelectric/electrostrictive devices 10a to 10g, 20a to 20d according to each embodiment, it is preferable to use a resin-series adhesive such as epoxy resin, UV resin, or hot-melt adhesive, or an inorganic adhesive such as glass, cement, solder, or brazing material as a bonding means to the base of each of the piezoelectric/electrostrictive elements 31 to 34. Also, a mixture of resin-series adhesive with metal powder or ceramic powder can be used as well. The hardness of the adhesive is preferably not less than 80 in terms of Shore D hardness.

Here, it is preferable to perform a surface roughening treatment such as blasting, etching, or plating on the surface site of the base where the piezoelectric/electrostrictive element is to be bonded. By allowing the surface roughness of the bonding site to be Ra=about 0.1 μm to 5 μm, the bonding area can be enlarged to improve the adhesive strength. In this case, the surface of the bonding site on the piezoelectric/electrostrictive element side is preferably rough as well. If one wishes that the electrodes are not electrically conducted to the base, the electrodes are not disposed on the surface of the piezoelectric/electrostrictive layer constituting the lowermost layer.

If solder or brazing material is to be used as the adhesive, it is preferable to dispose an electrode layer made of a metal material on the surface of the piezoelectric/electrostrictive element in order to improve the wettability. The thickness of the adhesive is preferably within the range from 1 µm to 50 µm. The thickness of the adhesive is preferably small in view of reducing variations in the displacement and in the resonance characteristics of the device and in view of saving space; however, in order to ensure the characteristics such as the bonding strength, displacement, and resonance, the optimal thickness is set for each adhesive to be adopted.

In bonding the piezoelectric/electrostrictive element to the base, the piezoelectric/electrostrictive element is bonded to the base so that the piezoelectric/electrostrictive element completely overlaps the bending position of the fixing part while allowing the electrodes of the piezoelectric/electrostrictive element to be on the side of the fixing part of the base. The piezoelectric/electrostrictive element is preferably bonded so as to align with the end of the base on the fixing part side; however, in order to facilitate the connection between the terminals of the piezoelectric/electrostrictive element and the external terminals, one may bond the piezoelectric/electrostrictive element to protrude outward from the end of the base. However, since the piezoelectric/electrostrictive element is liable to be broken as compared with the base which is made of metal, one must take care in handling the piezoelectric/electrostrictive element.

Figure 25:
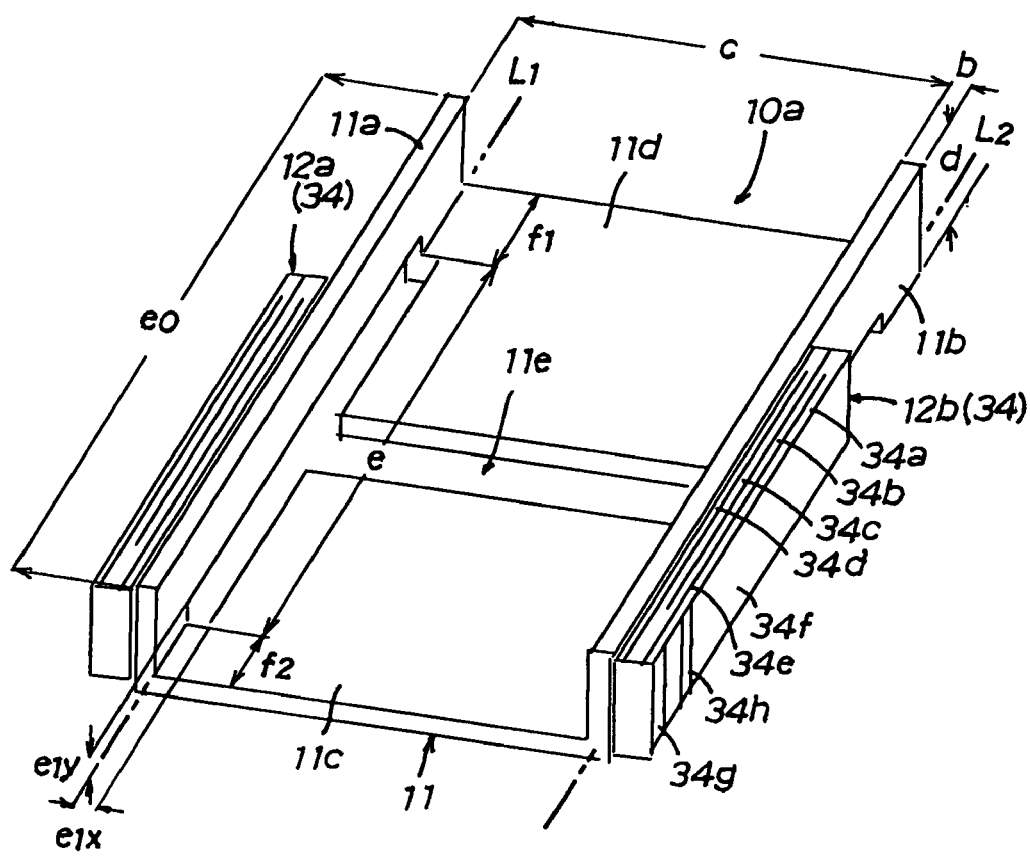
FIG. 25 is a perspective view illustrating the first piezoelectric/electrostrictive device in which the piezoelectric/electrostrictive element shown in FIG. 24B is adopted as the piezoelectric/electrostrictive element.
Figure 25:
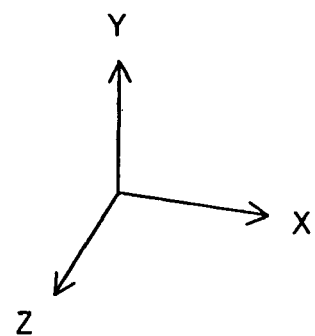

FIG. 25 illustrates an example in which the piezoelectric/electrostrictive element 34 is adopted as the piezoelectric/electrostrictive elements 12a, 12b in the first piezoelectric/electrostrictive device 10a that belongs to the category of the piezoelectric/electrostrictive device of the second form according to the present invention. Hereafter, the first piezoelectric/electrostrictive device 10a of this embodiment will be used as a representative example having a basic construction of the piezoelectric/electrostrictive device according to the present invention. The construction and operation as well as functions and effects of the piezoelectric/electrostrictive device according to the present invention will be described in detail with reference to the first piezoelectric/electrostrictive device 10a.

Figure 26:
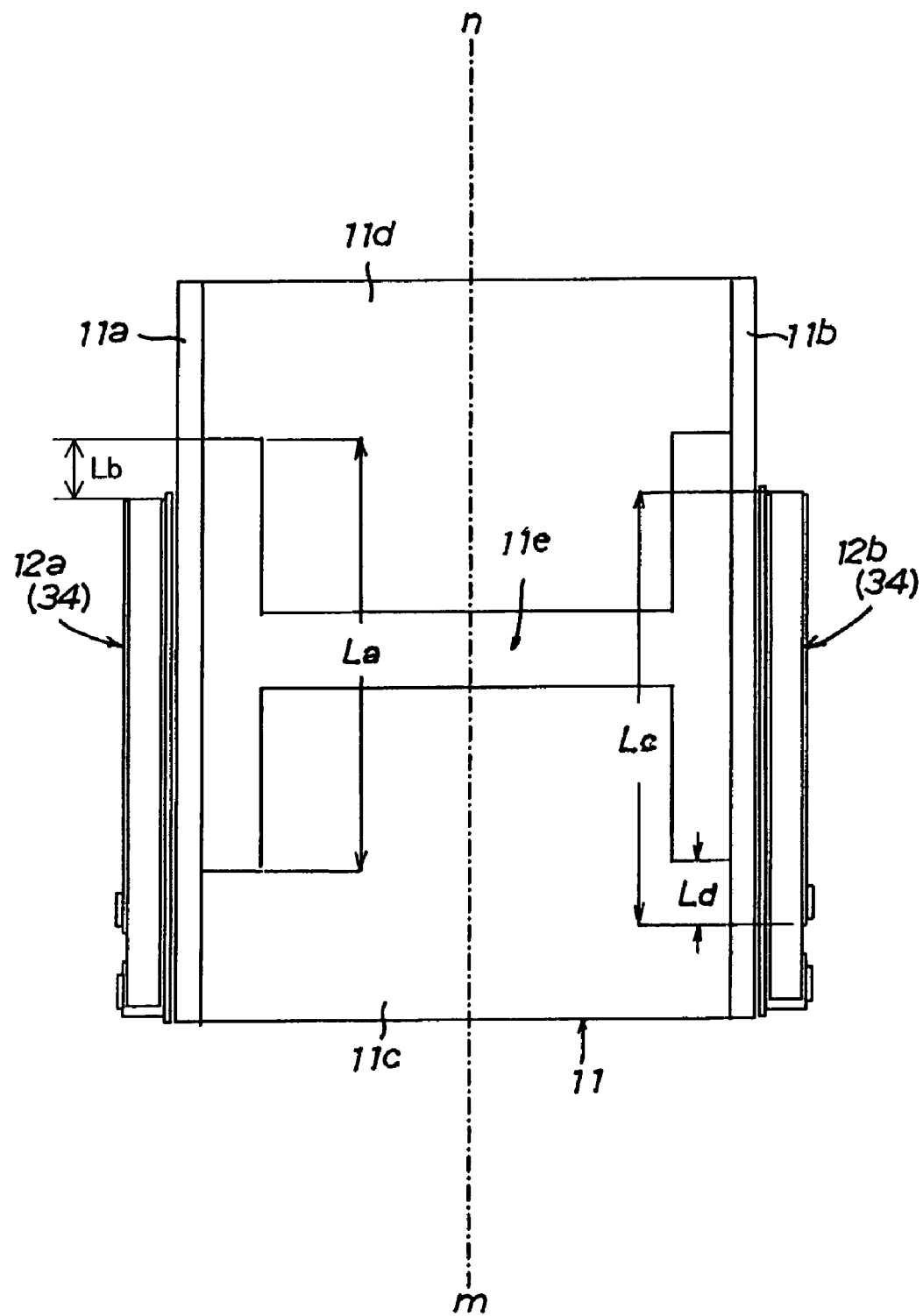
FIG. 26 is a plan view illustrating a non-operating state of the piezoelectric/electrostrictive device of FIG. 25.

If a part of piezoelectric/electrostrictive element 34 is positioned at the fixing part 11c of the base 11 in the piezoelectric/electrostrictive device 10a, (1−Lb/La) is preferably at least 0.4, more preferably from 0.5 to 0.8, where La is the shortest distance between the boundary to the mounting part 11d and the boundary to the fixing part 11c in the pair of movable parts 11a, 11b, and Lb is the shorter one of the distances from the boundary part between the mounting part 11d and the movable parts 11a, 11b to either end of the electrodes 34e, 34f of the piezoelectric/electrostrictive element 34, as illustrated in FIG. 26. If this value is less than 0.4, one cannot obtain a large displacement of the device. If this value is within a range from 0.5 to 0.8, compatibility between the displacement and the resonance of the device can be more easily achieved. In this case, one can adopt a construction in which the piezoelectric/electrostrictive element 34 is bonded to only one of the movable parts 11a, 11b, thereby providing a more preferable embodiment. Here, the same applies to the case in which a part of the piezoelectric/electrostrictive element 34 is positioned at a part of the mounting part 11d.

In the piezoelectric/electrostrictive device 10a, application of voltage to the electrodes 34e, 34f of the two piezoelectric/electrostrictive elements 34 is carried out through terminals 34g, 34h. The terminals 34g, 34h are positioned in such a manner that the terminal 34g to one electrode 34e is formed toward the rear of fixing part 11c, and the terminal 34h to the other electrode 34f is formed toward the front direction of fixing part 11c. Either one of the terminals 34g, 34h can be omitted by being electrically conducted to base 11 to be grounded commonly with base 11. The width of the piezoelectric/electrostrictive element 34 to be bonded need not be the same as the width of the bonding site of base 11 (bonding site of movable parts 11, 11b), and the difference in width does not raise any problem in the functions of the device.

Piezoelectric/electrostrictive device 10a is formed, for example, to have a total length of 1.9 mm and a total width of 1.5 mm by forming base 11 with SUS304 having a plate thickness of 40 µm. Piezoelectric/electrostrictive element 34 adopted as piezoelectric/electrostrictive elements 12a, 12b is a four-layer structure in which PZT is used. The thickness of one layer of the piezoelectric/electrostrictive layers 34a to 34d is 15 µm. The electrodes 34e, 34f are made of platinum of 3 µm, and terminals 34g, 34h are thin films made of gold paste. The piezoelectric/electrostrictive elements 34 are bonded onto outer sides of movable parts 11a, 11b via a one-liquid thermosetting epoxy resin adhesive.

In the piezoelectric/electrostrictive device 10a thus constructed to have such a size, the displacement of mounting part 11d was measured when the piezoelectric/electrostrictive element 34 was driven by a sinusoidal wave of 1 kHz with a driving voltage of 20±20 V. The displacement was found to be ±1.5 µm. Further, the resonance frequency showing the maximum value of the displacement was measured by sweeping the frequency at sinusoidal wave voltage ±0.5 V, and was found out to be 45 kHz.

Next, the operation of the piezoelectric/electrostrictive device according to the present invention will be described with reference to the above-described first piezoelectric/electrostrictive device 10a.

The piezoelectric/electrostrictive device 10a is in a state shown in FIG. 26 at the time of non-operation when a voltage is not applied to piezoelectric/electrostrictive elements 12a, 12b. In this state, the longitudinal axis m (longitudinal axis of fixing part 11c) of piezoelectric/electrostrictive device 10a is almost coincident with the central axis n of mounting part 11d. In this state, a sinusoidal wave Wb having a predetermined bias voltage Vb is applied to the pair of electrodes 34e, 34f in one piezoelectric/electrostrictive element 12b, for example, as shown in the waveform diagram of FIG. 27A, and a sinusoidal wave Wa having a phase different by approximately 180° from that of the aforesaid sinusoidal wave Wb is applied to the pair of electrodes 34e, 34f in the other piezoelectric/electrostrictive element 12a, for example, as shown in FIG. 27B.

Now, at the stage when for example the maximum voltage is applied to the pair of electrodes 34e, 34f in the one piezoelectric/electrostrictive element 12b, the piezoelectric/electrostrictive layers 34a to 34d in the one piezoelectric/electrostrictive element 12b undergo shrinking displacement in the principal surface direction thereof.

Figure 28:
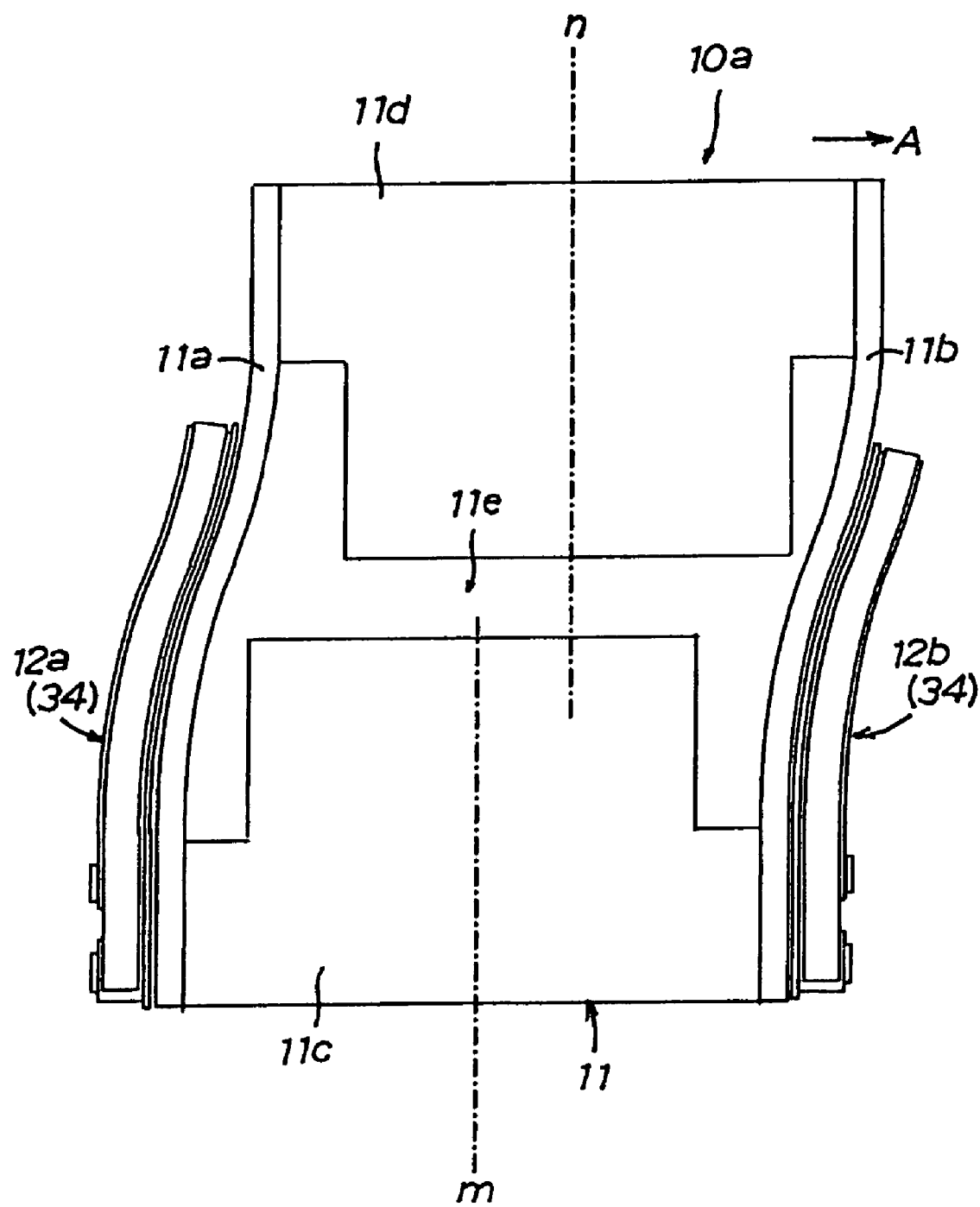
FIG. 28 is a plan view illustrating an operating state of the piezoelectric/electrostrictive device of FIG. 25.

This generates a stress that warps one movable part 11b in the illustrated right direction (direction shown by arrow A) in piezoelectric/electrostrictive device 10a, for example, as shown in FIG. 28. By this stress, movable part 11b is warped in that direction. In this case, the pair of electrodes 34e, 34f in the other piezoelectric/electrostrictive element 12a are in a state in which a voltage is not applied. Therefore, the other movable part 11a follows the warp of the one movable part 11b so as to warp in the same direction as that of movable part 11b. As a result of this, movable parts 11a, 11b both displace in the illustrated right direction with respect to the longitudinal axis m of piezoelectric/electrostrictive device 10a. The displacement amount of this displacement changes in accordance with the maximum value of the voltage applied to each of the piezoelectric/electrostrictive elements 12a, 12b. The larger the maximum value of the voltage is, the larger the displacement amount will be.

Figure 27A:
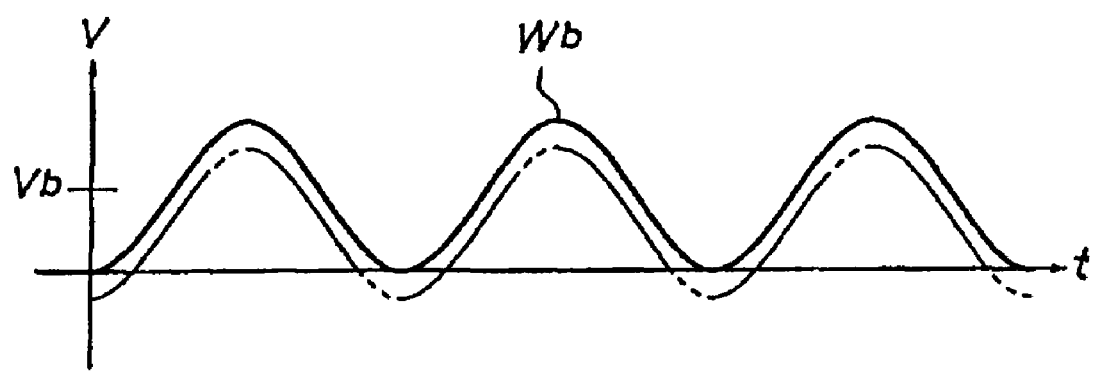
FIGS. 27A and 27B are waveform diagrams respectively showing voltages applied to the two piezoelectric/electrostrictive elements of the piezoelectric/electrostrictive device of FIG. 25.
Figure 27B:
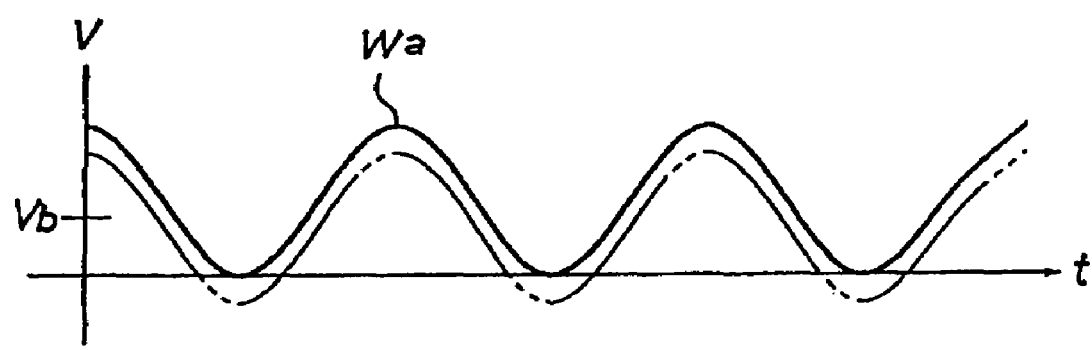

In particular, if a piezoelectric/electrostrictive material having a high coercive electric field is adopted as a material for constructing the piezoelectric/electrostrictive layers 34a to 34d constituting the piezoelectric/electrostrictive element 34, the aforesaid bias voltage may be adjusted so that the minimum level will be at a slightly negative level, as illustrated by waveforms drawn in two-dot chain lines in FIGS. 27A and 27B. In this case, by driving the piezoelectric/electrostrictive element to which the bias voltage of negative level is applied, for example, by driving the other piezoelectric/electrostrictive element 12a, for example, a stress is generated in the other movable part 11a in the same direction as the warping direction of the one movable part 11b, thereby providing a larger displacement amount of mounting part 11d. In other words, by using the waveforms shown in two-dot chain lines in FIGS. 27A and 27B, the piezoelectric/electrostrictive elements 12a, 12b to which the bias voltage of negative level is applied can have a function of supporting the piezoelectric/electrostrictive element 12b, 12a acting as a main agent of displacement operation.

Thus, in piezoelectric/electrostrictive device 10a, a minute displacement of piezoelectric/electrostrictive elements 12a, 12b is amplified to become a large displacement operation by utilizing the warp of movable parts 11a, 11b, and is transmitted to movable parts 11a, 11b. This makes it possible to displace the mounting part 11d to a large extent with respect to the longitudinal axis m of piezoelectric/electrostrictive device 10a.

In the piezoelectric/electrostrictive device 10a, it is preferable to give the following consideration so as to allow the functions thereof to be exhibited with more certainty. Namely, in order to ensure the displacement operation of mounting part 11d, the distance Ld by which the substantial driving part Lc of piezoelectric/electrostrictive elements 12a, 12b overlaps the fixing part 11c or mounting part 11d is preferably not less than a half of the thickness b of movable parts 11a, 11b. Further, the device is constructed in such a manner that the ratio c/d of the distance c between the inner walls of movable parts 11a, 11b (distance in the X-axis direction) to the width d of movable parts 11a, 11b (distance in the Y-axis direction) is from 0.5 to 20. The ratio c/d is preferably from 1 to 15, more preferably from 1 to 10. The defined values of the ratio c/d are based on the knowledge that the displacement amount of mounting part 11d can be increased and the displacement in the X-axis-Z-axis plane can be dominantly obtained.

The ratio e/c of the substantial movable length e in movable parts 11a, 11b having a total length of e0 to the distance c between the inner walls of movable parts 11a, 11b is preferably from 0.5 to 10, more preferably from 0.5 to 5. The length f1 of the connecting part between the mounting part 11d and the movable parts 11a, 11b (distance in the Z-axis direction) and the length f2 of the connecting part between the fixing part 11c and the movable parts 11a, 11b (distance in the Z-axis direction) are preferably short. By providing a short mounting part 11d, the device can have a reduced weight, and the resonance frequency can be increased. However, in order to ensure the rigidity of mounting part 11d in the X-axis direction to make a firm displacement, the ratios f1/b and f2/b to the thickness b of movable parts 11a, 11b is preferably at least 2, more preferably at least 5. Further, the distance e1x from the bending position L1 of base 11 to fixing part 11c or mounting part 11d and the distance e1y from L1 to movable part 11a preferably satisfy (e1x/b)>1 and (e1y/b)>1, more preferably (e1x/b)≧2 and (e1y/b)≧2.

It is essential to set the real dimension of the parts of the piezoelectric/electrostrictive device 10a in consideration of the bonding area of mounting part 11d for mounting the component, the bonding area for mounting the fixing part 11c to another member, the bonding area for mounting the terminals for the electrodes and others, the strength of the whole device, the durability, the necessary displacement amount and resonance property, the driving voltage, and others.

Specifically, for example, the distance c between the inner walls of movable parts 11a, 11b is preferably from 100 μm to 2000 μm, more preferably from 200 μm to 1600 μm. The width d of movable parts 11a, 11b is preferably from 50 μm to 2000 μm, more preferably from 100 μm to 500 μm. In order that the flapping displacement, which is a displacement component in the Y-axis direction, may be effectively restrained, the thickness b of movable parts 11a, 11b and the width d of movable parts 11a, 11b satisfy d>b, and the thickness b is preferably from 2 μm to 300 μm, more preferably from 10 μm to 80 μm.

The substantial movable length e in movable parts 11a, 11b is preferably from 200 μm to 3000 μm, more preferably from 300 μm to 2000 μm. The connecting length f1 between mounting part 11d and movable parts 11a, 11b and the connecting length f2 between fixing part 11c and movable parts 11a, 11b are preferably from 50 μm to 2000 μm, more preferably from 100 μm to 1000 μm.

The distance e1x from the bending position L1 of base 11 to fixing part 11c or mounting part 11d is preferably from 1 μm to 300 μm, more preferably from 5 μm to 80 μm. Further, the distance e1y from the bending position L1 of base 11 to movable part 11a is preferably from 1 μm to 1000 μm, more preferably from 5 μm to 500 μm. Here, the distance from the bending position L2 of base 11 to fixing part 11c or mounting part 11d (distance corresponding to distance e1x) and the distance from the bending position L2 of base 11 to movable part 11a (distance corresponding to distance e1y) are similar to distance e1x and distance e1y.

By constructing the piezoelectric/electrostrictive device 10a in such a manner, the displacement in the Y-axis direction can be prevented from exceeding 10% of the displacement in the X-axis direction. However, by suitably setting the dimension ratios and the real dimensions within the aforesaid ranges, the device can be driven at a low voltage, and it produces an excellent effect that the displacement in the Y-axis direction can be restrained to be not more than 5% of the displacement in the X-axis direction. In other words, mounting part 11d displaces substantially in one axial direction, i.e. the X-axis direction, thereby providing an excellent property that the high-speed response is excellent and a large displacement is obtained at a low voltage.

Further, in the piezoelectric/electrostrictive device 10a, base 11 constituting the principal construction component has a specific shape, and the movable parts 11a, 11b are approximately perpendicular to fixing part 11c and mounting part 11d to function as ribs, so that the rigidity of the device in the Y-axis direction can be set high. For this reason, in the piezoelectric/electrostrictive device 10a, the operation of mounting part 11d can be selectively generated in a plane (in X-axis-Z-axis plane) alone, and the operation of mounting part 11d in the Y-axis-Z-axis plane, i.e. operation in the so-called flapping direction, can be restrained.

Here, in the device according to the present invention, by devising the shapes of the fixing part and the mounting part of the base, the gimbal of the suspension of the hard disk drive can be integrated with the base of the device.

Figure 29:
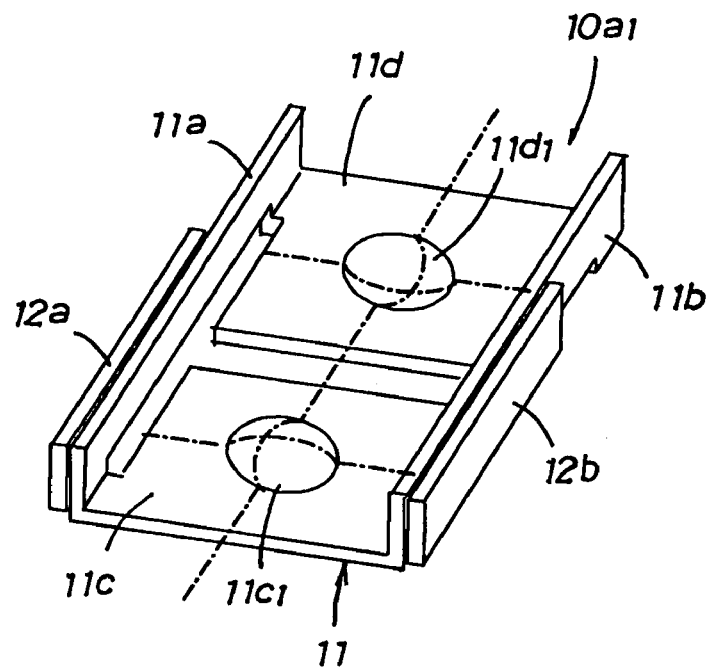
FIG. 29 is a perspective view illustrating the first modification of the first piezoelectric/electrostrictive device.
Figure 30:
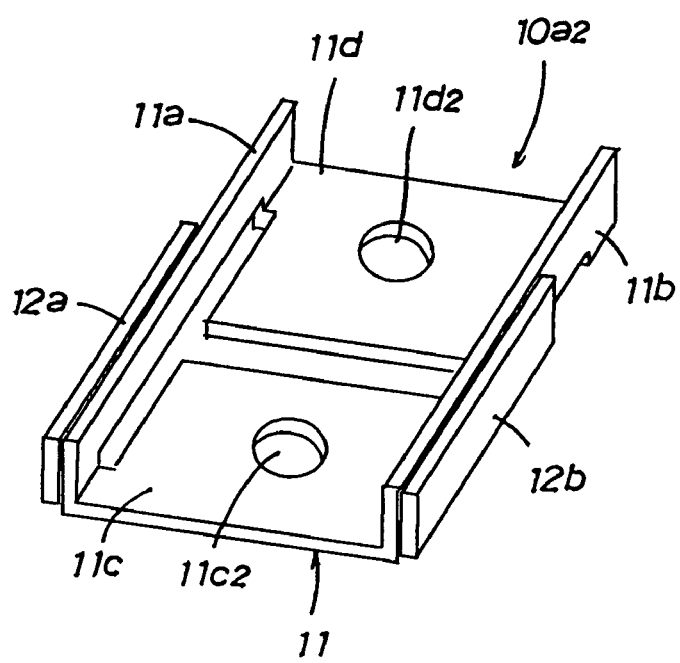
FIG. 30 is a perspective view illustrating the second modification of the first piezoelectric/electrostrictive device.

Here, FIGS. 29 and 30 illustrate two modifications of the first piezoelectric/electrostrictive device 10a. The piezoelectric/electrostrictive devices 10a1, 10a2 according to these modifications have basically the same construction as the first piezoelectric/electrostrictive device 10a. However, in the piezoelectric/electrostrictive device 10a1, circular recesses 11c1, 11d1 are formed by press-molding generally at the central parts of fixing part 11c and mounting part 11d of base 11. In the piezoelectric/electrostrictive device 10a2, circular through-holes 11c2, 11d2 are formed by stamping generally at the central parts of fixing part 11c and mounting part 11d of base 11.

In piezoelectric/electrostrictive device 10a1, circular recesses 11c1, 11d1 disposed in the fixing part 11c and mounting part 11d of base 11 serve to accommodate an adhesive for bonding the component to be mounted to fixing part 11c and mounting part 11d, whereby the adhesive accommodated in the recesses 11c1, 11d 1 increases the bonding strength to the component and the squeeze-out of the adhesive from the bonding site can be prevented.

Further, in piezoelectric/electrostrictive device 10a2, circular through-holes 11c2, 11d2 disposed in the fixing part 11c and mounting part 11d of base 11 act as a standard for positioning in assembling (bonding) the component onto fixing part 11c and mounting part 11d, whereby the precision of assembling in later steps can be improved, and the yield of the products can be improved.

Figure 1J:
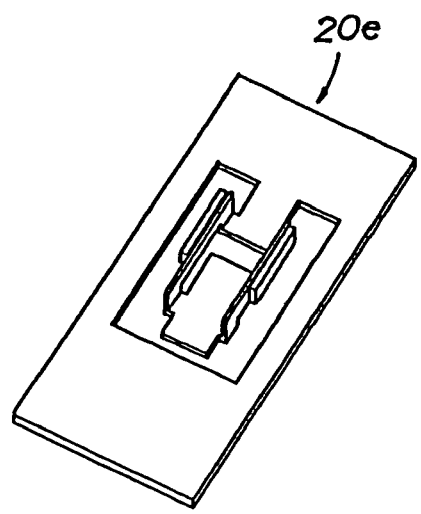
Figure 1K:
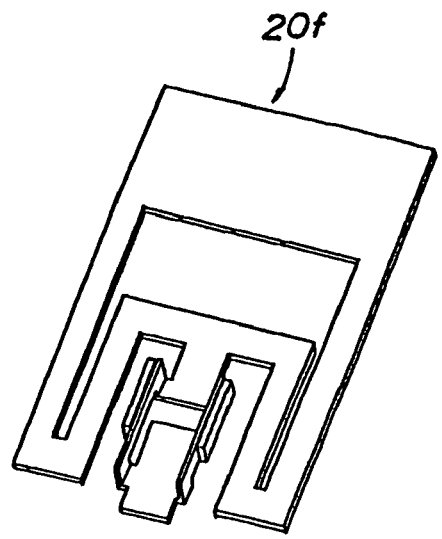
Figure 31:
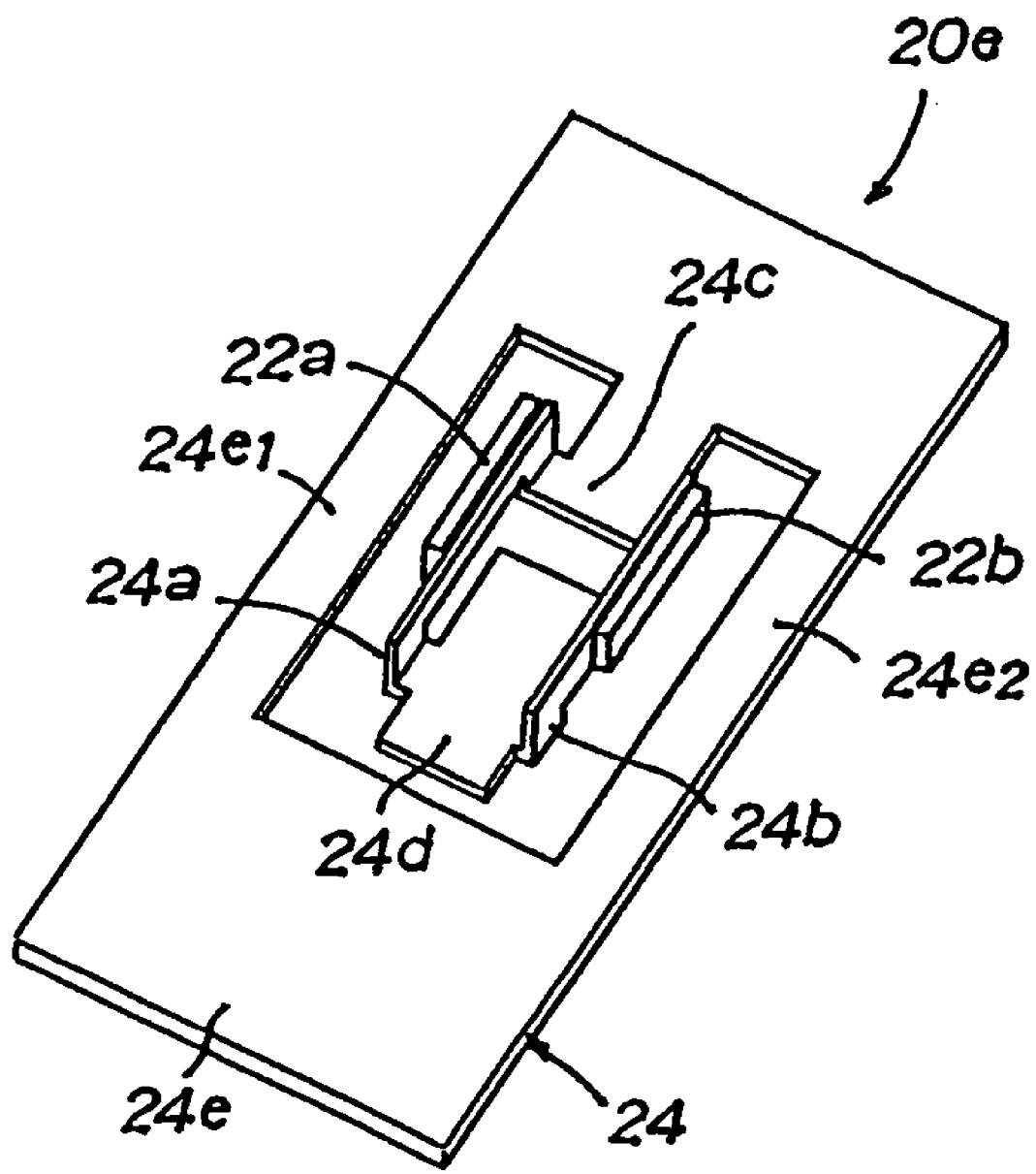
FIG. 31 is a perspective view illustrating the tenth piezoelectric/electrostrictive device of the third form according to the present invention.

The tenth piezoelectric/electrostrictive device 20e and the eleventh piezoelectric/electrostrictive device 20f shown in FIGS. 1J and 1K are piezoelectric/electrostrictive devices belonging to the category of the piezoelectric/electrostrictive device of the third form according to the present invention. Referring to FIGS. 31 and 32, these piezoelectric/electrostrictive devices 20e, 20f each have a basic construction including a base having a pair of right and left movable parts, a fixing part that connects the two movable parts with each other at one end thereof, a mounting part that is separate from the fixing part and connects the two movable parts with each other at the other end thereof, and a connecting part that is integral with the mounting part and surrounds the mounting part, the movable parts, and the fixing part, as well as a piezoelectric/electrostrictive element disposed on at least one side of the two movable parts of the base. The piezoelectric/electrostrictive devices 20e, 20f are largely different in the construction of the base from the piezoelectric/electrostrictive devices of the other embodiments.

The base 24 constituting the tenth piezoelectric/electrostrictive device 20e shown in FIG. 31 includes a pair of right and left movable parts 24a, 24b, a fixing part 24c that connects the two movable parts 24a, 24b with each other at one end thereof, a mounting part 24d that connects the two movable parts 24a, 24b with each other at the other end thereof, and a connecting part 24e that is integral with the mounting part 24d.

The base 24 has such a configuration that a connecting part is added to the base 18 constituting the seventh piezoelectric/electrostrictive device 10g. The connecting part 24e of base 24 has a flat plate shape having a square-shaped opening 24f1 at the central part thereof, where movable parts 24a, 24b, fixing part 24c, and mounting part 24d are placed in an integral state in the opening 24f1. The connecting part 24e surrounds the principal construction parts of base 24, and the two side peripheries 24e1, 24e2 of connecting part 24e have a spring function.

Figure 32A:
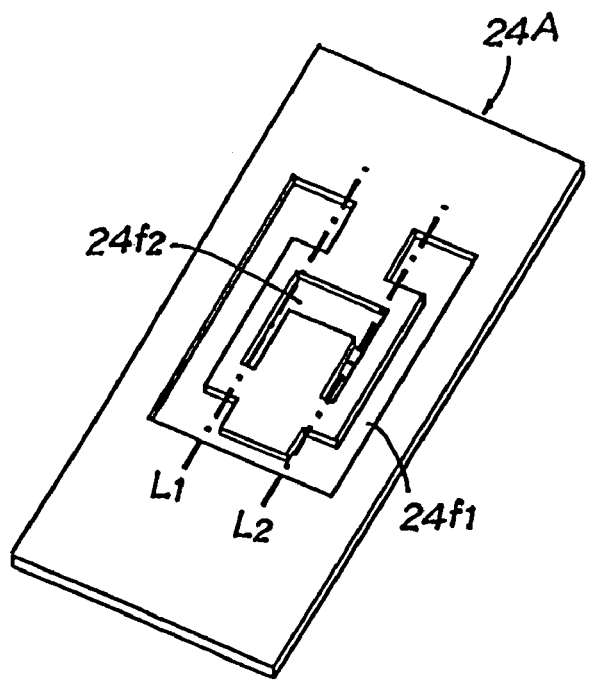
FIGS. 32A and 32B are a perspective view illustrating an original plate of a base constituting the piezoelectric/electrostrictive device of FIG. 31, and a perspective view illustrating the base formed by bending the original plate, respectively.
Figure 32B:
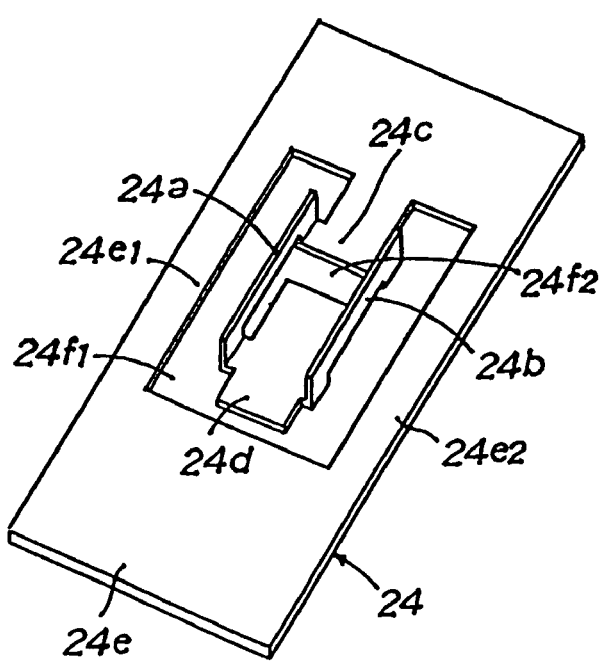

Referring to FIG. 32A, the original plate 24A of base 24 has a rectangular opening 24f1 that will constitute the connecting part 24e and a gate-shaped opening 24f2 that will integrally constitute the movable parts 24a, 24b, fixing part 24c, and mounting part 24d. Base 24 shown in FIG. 32B is formed by bending the original plate 24A along two-dot chain lines L1, L2 shown in FIG. 32A. In the base 24 thus formed, piezoelectric/electrostrictive elements 22a, 22b are bonded onto the outer sides of movable parts 24a, 24b to form the tenth piezoelectric/electrostrictive device 20e shown in FIG. 31.

The tenth piezoelectric/electrostrictive device 20e has the same function as the seventh piezoelectric/electrostrictive device 10g and produces approximately the same actions and effects as the seventh piezoelectric/electrostrictive device 10g. However, since the tenth piezoelectric/electrostrictive device 20e in particular integrally includes the connecting part 24e having a spring function, the connecting part 24e can be allowed to function as a gimbal of the suspension constituting the hard disk drive. In other words, the base 24 has a function of a gimbal as well.

Figure 33:
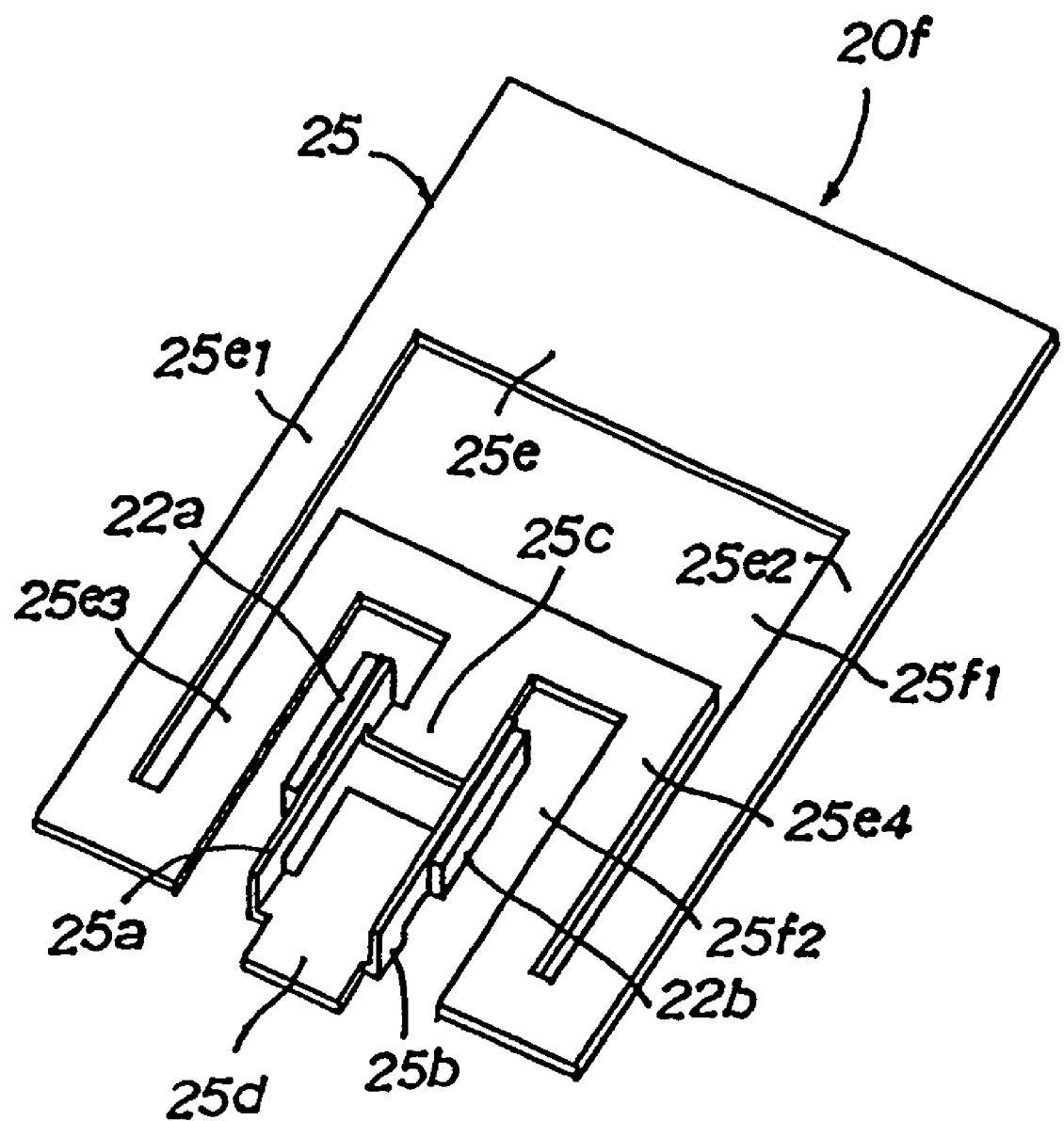
FIG. 33 is a perspective view illustrating the eleventh piezoelectric/electrostrictive device of the third form according to the present invention.

The base 25 constituting the eleventh piezoelectric/electrostrictive device 20f shown in FIG. 33 includes a pair of right and left movable parts 25a, 25b, a fixing part 25c that connects the two movable parts 25a, 25b with each other at one end thereof, a mounting part 25d that connects the two movable parts 25a, 25b with each other at the other end thereof, and a connecting part 25e that is integral with the mounting part 25d.

The base 25 has such a configuration that a connecting part is added to the base 18 constituting the seventh piezoelectric/electrostrictive device 10g. The connecting part 25e of base 25 has a flat plate shape having a gate-shaped opening 25f1 at the central part thereof and having a rectangular opening 25f2, whose one end is open, on the tip end side thereof, where movable parts 25a, 25b, fixing part 25c, and mounting part 25d are placed in an integral state in the opening 25f2. The connecting part 25e surrounds the principal construction parts of base 25, and the two side peripheries 25e1, 25e2 outside the connecting part 25e as well as the two side peripheries 25e3, 25e4 inside the connecting part 25e have a spring function.

Figure 34A:
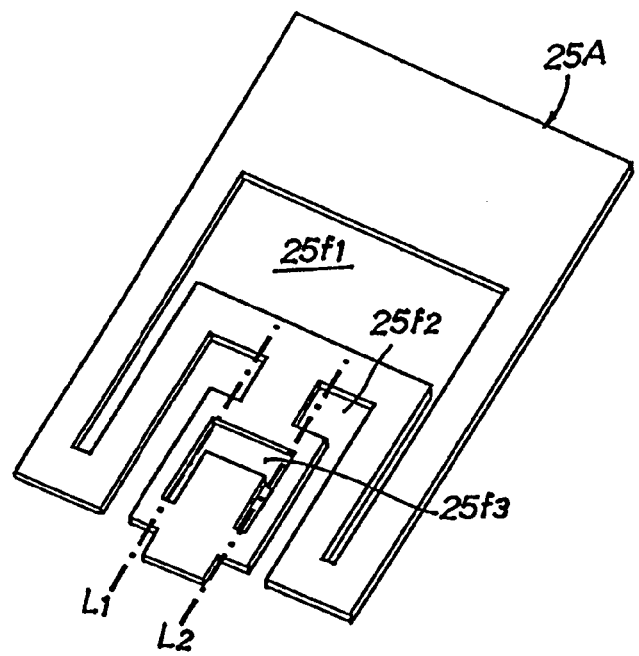
FIGS. 34A and 34B are a perspective view illustrating an original plate of a base constituting the piezoelectric/electrostrictive device of FIG. 33, and a perspective view illustrating the base formed by bending the original plate, respectively.
Figure 34B:
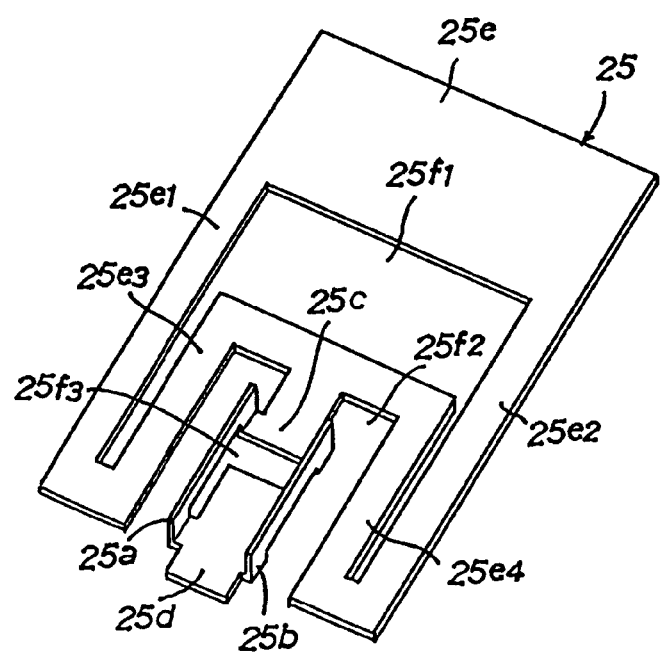

Referring to FIG. 34A, the original plate 25A of base 25 has a gate-shaped opening 25f1 and a rectangular opening 25f2 that will constitute the connecting part 25e and a gate-shaped opening 25f3 that will integrally constitute the movable parts 25a, 25b, fixing part 25c, and mounting part 25d. Base 25 shown in FIG. 34B is formed by bending the original plate 25A along two-dot chain lines L1, L2 shown in FIG. 34A. In the base 25 thus formed, piezoelectric/electrostrictive elements 22a, 22b are bonded onto the outer sides of movable parts 25a, 25b to form the eleventh piezoelectric/electrostrictive device 20f shown in FIG. 33.

The eleventh piezoelectric/electrostrictive device 20f has the same function as the seventh piezoelectric/electrostrictive device 10g and produces approximately the same actions and effects as the seventh piezoelectric/electrostrictive device 10g. However, since the eleventh piezoelectric/electrostrictive device 20f in particular integrally includes the connecting part 25e having a spring function, the connecting part 25e can be allowed to function as a gimbal of the suspension constituting the hard disk drive. In other words, the base 25 has a function of a gimbal as well. Furthermore, since the eleventh piezoelectric/electrostrictive device 20f has a higher spring function that the tenth piezoelectric/electrostrictive device 20e, the function of a gimbal can be exhibited with more certainty.

Figure 35:
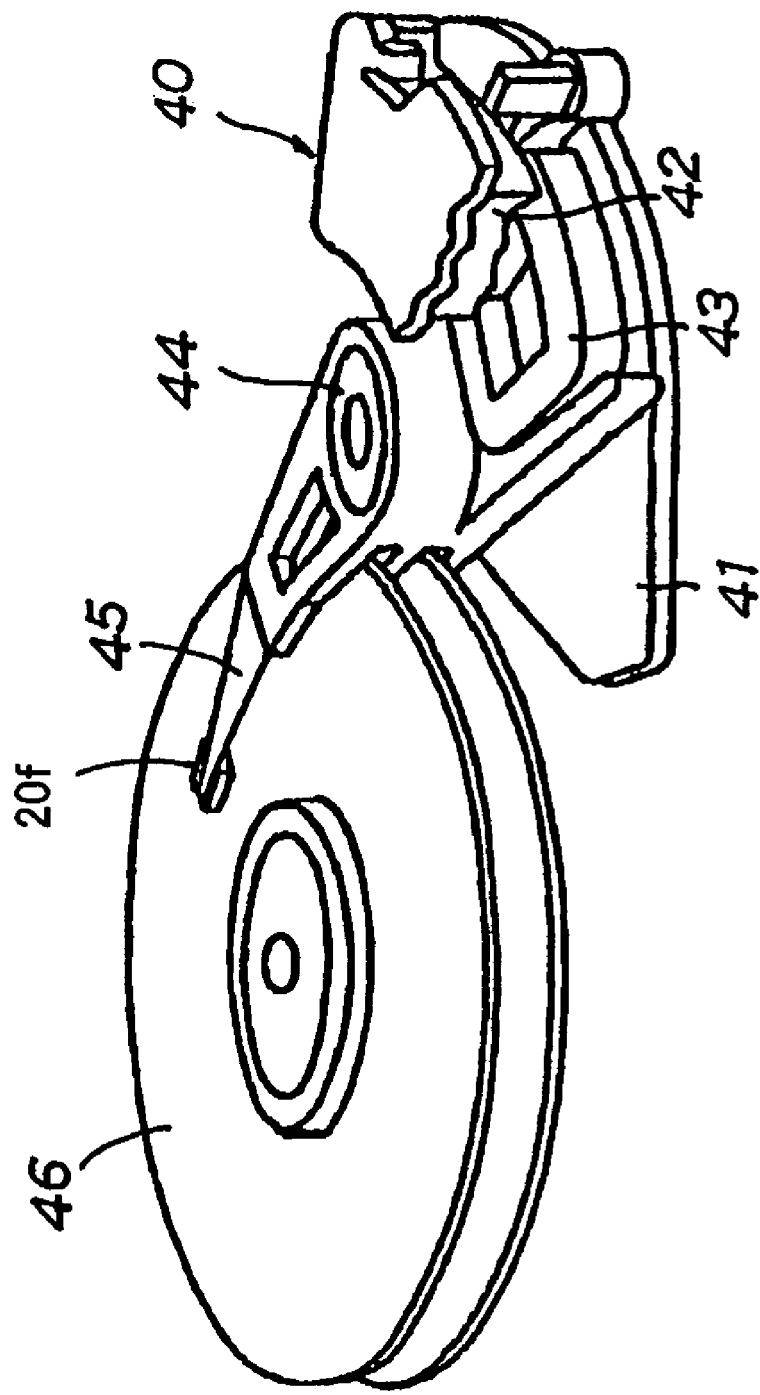
FIG. 35 is a perspective view illustrating a hard disk drive having the tenth piezoelectric/electrostrictive device mounted thereon.

FIG. 35 illustrates a hard disk drive 40 having the tenth piezoelectric/electrostrictive device 20e, which is a piezoelectric/electrostrictive device of the third form according to the present invention, mounted thereon. The hard disk drive 40 is a known one provided with a suspension. Base 41 has a voice coil 42 and a magnet 43 mounted thereon, and the suspension 45 having the tenth piezoelectric/electrostrictive device 20e mounted thereon is attached to an arm 44 disposed on the base 41. Here, the reference numeral 46 denotes a magnetic disk.

Figure 36A:
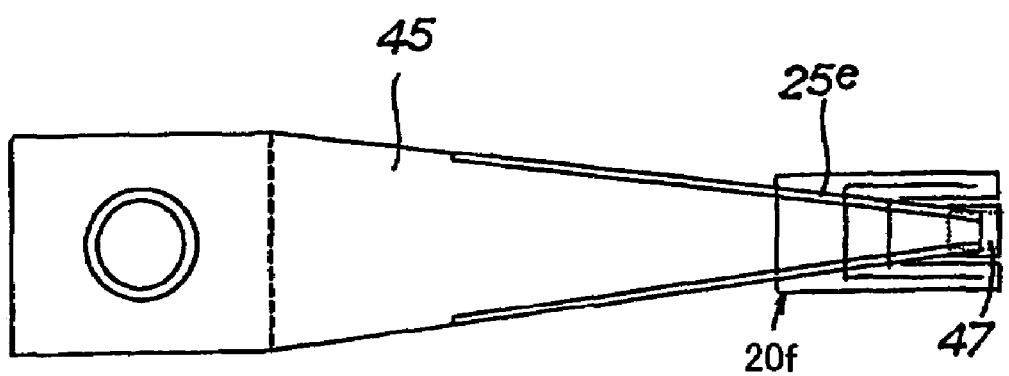
FIGS. 36A and 36B are a plan view and a side view, respectively, of a suspension having the tenth piezoelectric/electrostrictive device mounted thereon.
Figure 36B:
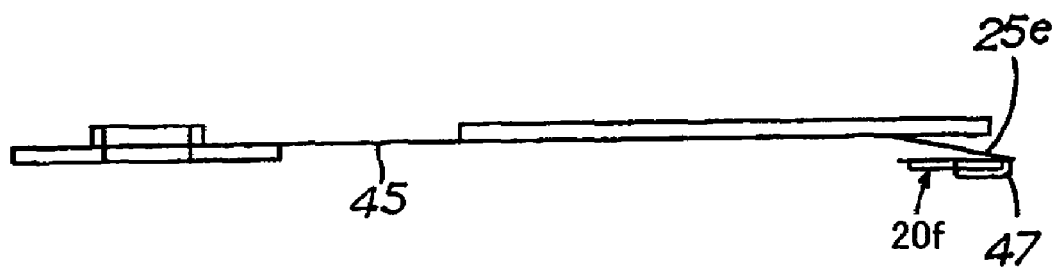

Now, referring to FIG. 36, the tenth piezoelectric/electrostrictive device 20e has a magnetic head 47 (slider) fixed onto the fixing part 24c of the base 24 via an adhesive, and is fixed by means of spot welding or the like to the rear side of the suspension 45 on the rear side of the mounting part 24d side in the connecting part 24e of the base 24. In such a mounting structure of the tenth piezoelectric/electrostrictive device 20e, the connecting part 24e of the base 24 has a function of a conventional gimbal, thereby providing an advantage that the use of a conventional gimbal can be omitted in mounting the tenth piezoelectric/electrostrictive device 20e onto the suspension 45.

Figure 37:
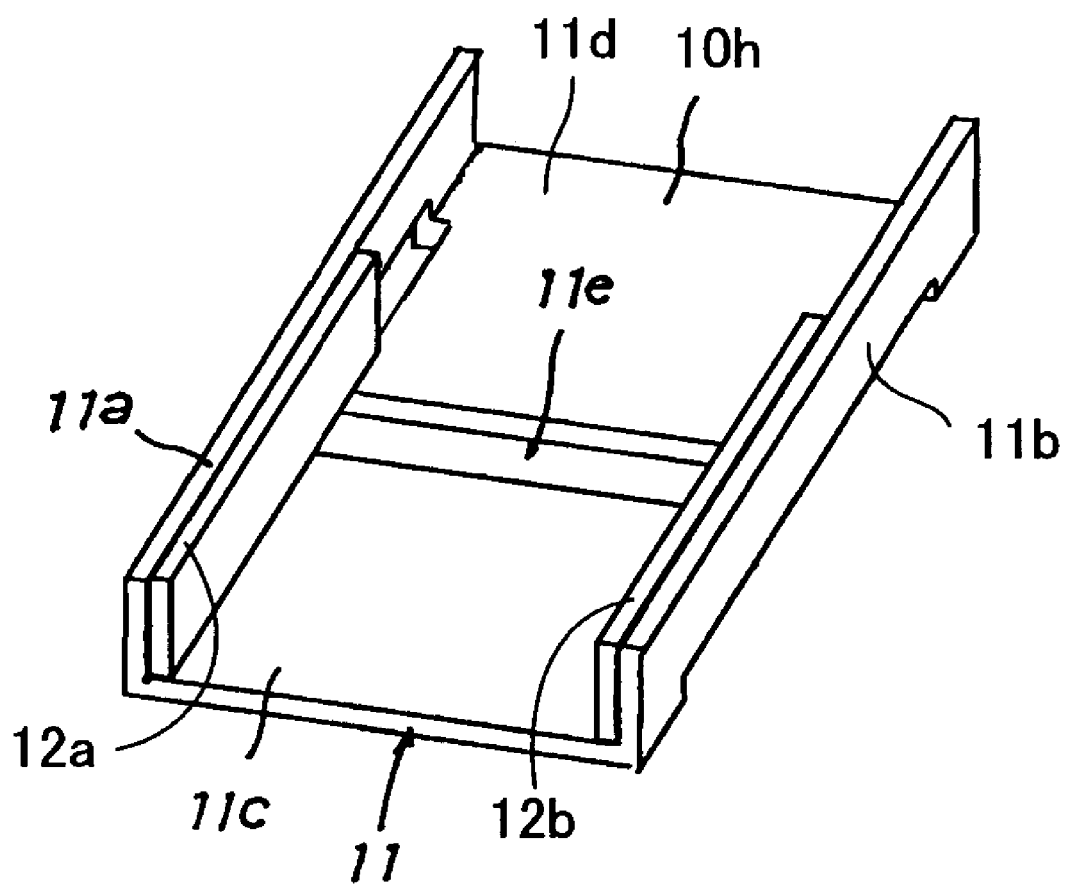
FIG. 37 is a perspective view illustrating a twelfth piezoelectric/electrostrictive device.

Subsequently, a twelfth piezoelectric/electrostrictive device 10h shown in FIG. 37 will be described. The twelfth piezoelectric/electrostrictive device 10h relates to the modification of the first piezoelectric/electrostrictive device 10a shown in FIG. 2 to FIG. 4, and only a point that the position of arrangement of the piezoelectric/electrostrictive elements 12a, 12b is changed from the outer sides of the movable parts 11a, 11b to the inner sides of the movable parts 11a, 11b is different from the first piezoelectric/electrostrictive device 10a.

In other words, the twelfth piezoelectric/electrostrictive device 10h includes:

a base 11 being constructed with one sheet of flat plate, the base 11 having the fixing part 11c of a flat plate shape, the mounting part 11d that is separated from the fixing part 11c and having a flat plate shape, and the pair of left and right movable parts 11a, 11b, the pair of movable parts 11a, 11b each being supported at one end side thereof by each side edge of the fixing part 11c and at the other end side thereof by each side edge of the mounting part 11d, the respective movable parts being erect by a predetermined height from side edges of the fixing part 11c and the mounting part 11d to face each other and extend along the side edges of the fixing part 11c and the mounting part 11d, and piezoelectric/electrostrictive elements 12a, 12b arranged on at least one of inner sides of the pair of left and right movable parts 11a, 11b.

The twelfth piezoelectric/electrostrictive device 10h may be formed, for example, by forming the movable parts 11a, 11b by bending the original plate 11A shown in FIG. 3A to a right angle along two chain double-dashed lines L1, L2 as shown in FIG. 3B, and then bonding the piezoelectric/electrostrictive elements 12a, 12b to the inner sides of the movable parts 11a, 11b with adhesive agent.

Figure 38A:
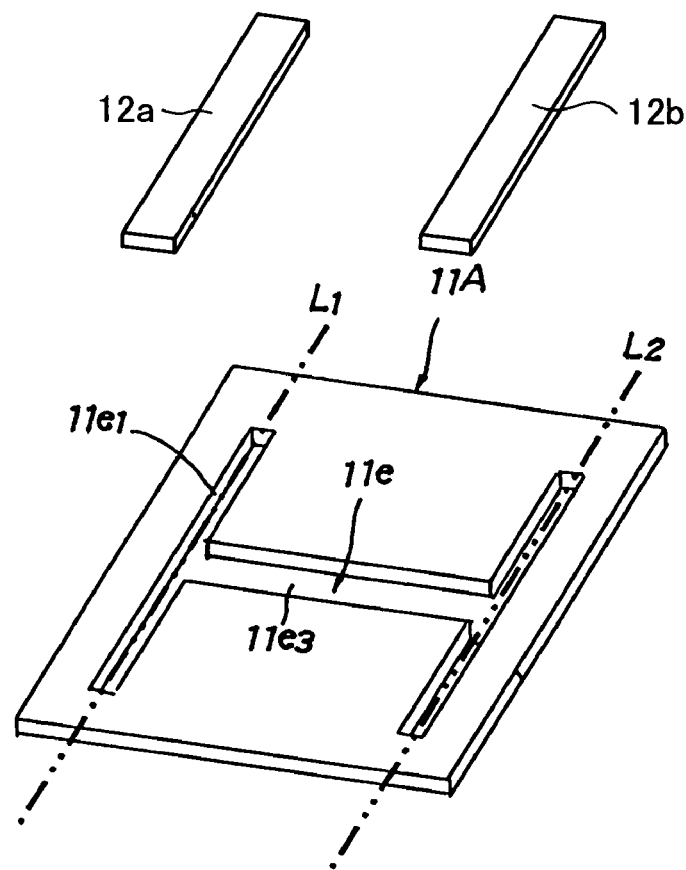
FIG. 38A is a perspective view illustrating a state before a piezoelectric/electrostrictive element is bonded to an original plate of a base constituting the twelfth piezoelectric/electrostrictive device.
Figure 38B:
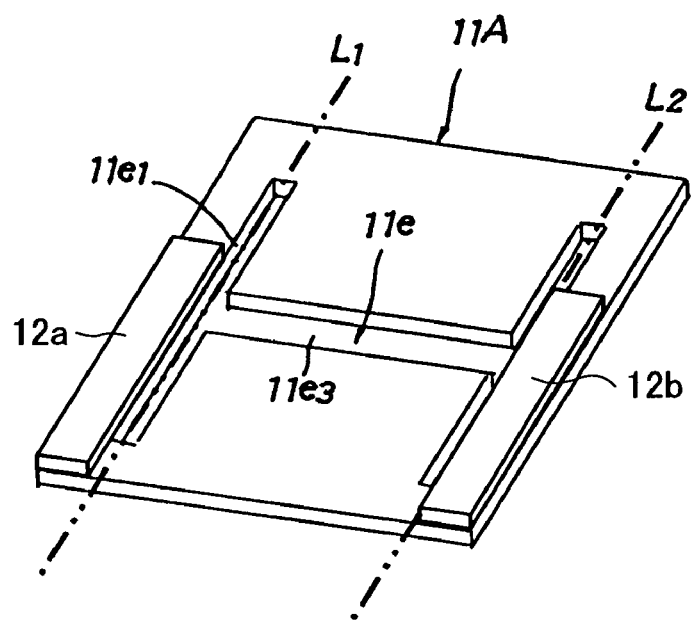
FIG. 38B is a perspective view illustrating a state after the piezoelectric/electrostrictive element is bonded to the original plate of the base constituting the twelfth piezoelectric/electrostrictive device.

Alternatively, the twelfth piezoelectric/electrostrictive device 10h can be formed also by bonding the piezoelectric/electrostrictive elements 12a, 12b to "portions which become inner sides of the movable parts 11a, 11b later" (side edge portions of the side grooves 11e1, 11e2) of the original plate 11A as shown in FIG. 38A and FIG. 38B respectively with adhesive agent, and then bending the original plate 11A at a right angle along the chain double-dashed lines L1, L2.

The twelfth piezoelectric/electrostrictive device 10h has following advantages. Firstly, since the piezoelectric/electrostrictive element does not exist on the outer sides of the movable parts 11a, 11b, destruction of the piezoelectric/electrostrictive element due to contact with foreign substances from the outside can hardly occur, and hence reliability of the piezoelectric/electrostrictive device is high.

Secondly, since the piezoelectric/electrostrictive element does not exist on the outer sides of the movable parts 11a, 11b, an external size of the piezoelectric/electrostrictive device 10h is reduced, and hence a space required for mounting the piezoelectric/electrostrictive device 10h can be reduced.

Thirdly, as shown in FIG. 38A and FIG. 38B, in a case where the original plate 11A is bent after having bonded the piezoelectric/electrostrictive elements 12a, 12b to the original plate 11A, since the piezoelectric/electrostrictive element does not exist on "portions which become outer sides of the movable parts 11a, 11b later", the original plate 11A can be bent by applying a force to the "portions which become the outer sides of the movable parts 11a, 11b later". Therefore, protection of the piezoelectric/electrostrictive element which is required when performing the bending process can be simplified.

Figure 39:
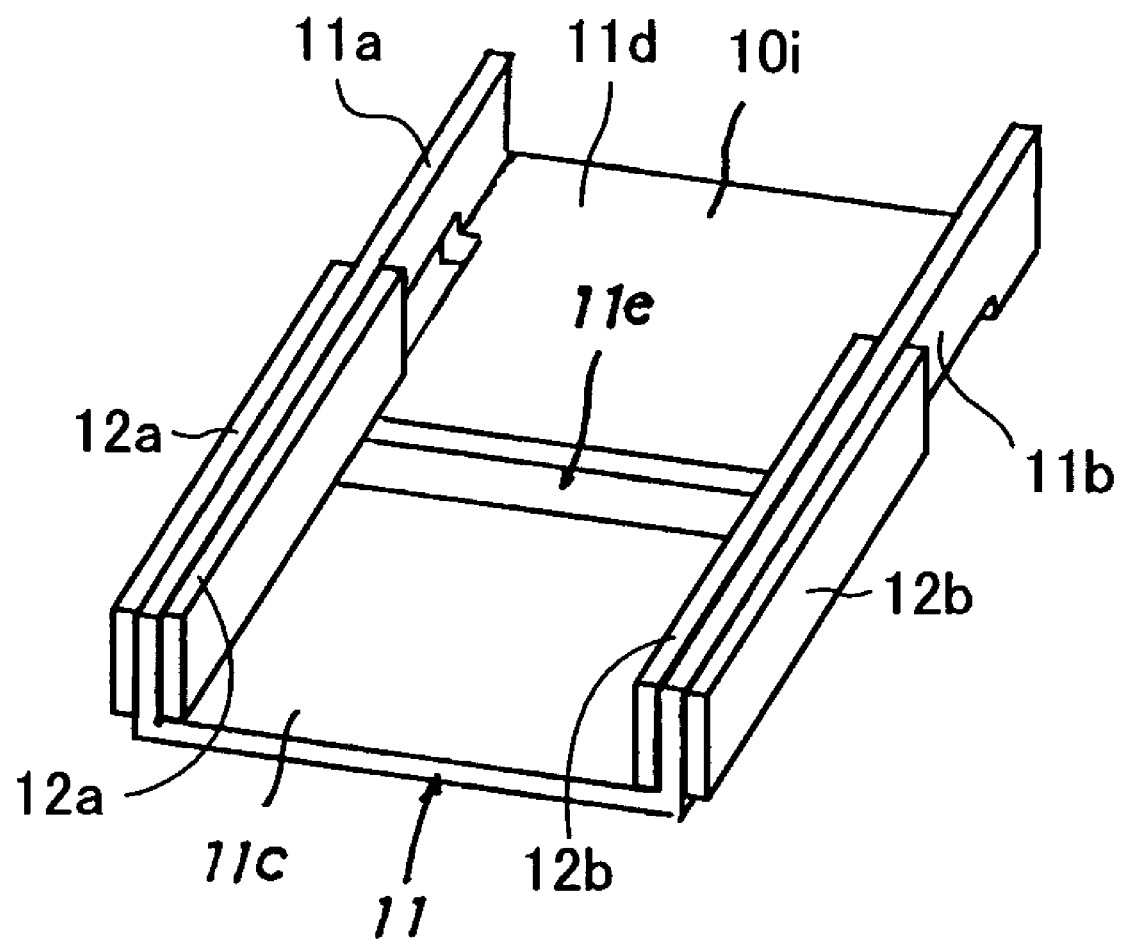
FIG. 39 is a perspective view illustrating a thirteenth piezoelectric/electrostrictive device.

Subsequently, a thirteenth piezoelectric/electrostrictive device 10i shown in FIG. 39 will be described. The thirteenth piezoelectric/electrostrictive device 10i further includes the piezoelectric/electrostrictive elements 12a, 12b disposed on the outer sides of the movable parts 11a, 11b of the twelfth piezoelectric/electrostrictive device 10h shown in FIG. 37.

The thirteenth piezoelectric/electrostrictive device 10i can be formed, for example, by forming the movable parts 11a, 11b by bending the original plate 11A shown in FIG. 3A at a right angle along the chain double-dashed lines L1, L2 as sown in FIG. 3B, and then bonding the piezoelectric/electrostrictive elements 12a to the inner and outer sides of the movable part 11a respectively with adhesive agent and bonding the piezoelectric/electrostrictive elements 12b to the inner and outer sides of the movable part 11b respectively with adhesive agent.

Alternatively, the thirteenth piezoelectric/electrostrictive device 10i may also be formed by bonding the piezoelectric/electrostrictive elements 12a, 12b to the "portions which become the inner sides of the movable parts 11a, 11b later" of the original plate 11A as shown in FIG. 38A and 38B respectively with adhesive agent, and then forming the movable parts 11a, 11b by bending the original plate 11A at a right angle along the chain double-dashed lines L1, L2 and then bonding the piezoelectric/electrostrictive elements 12a, 12b to the outer sides of the movable parts 11a, 11b with adhesive agent.

Figure 40A:
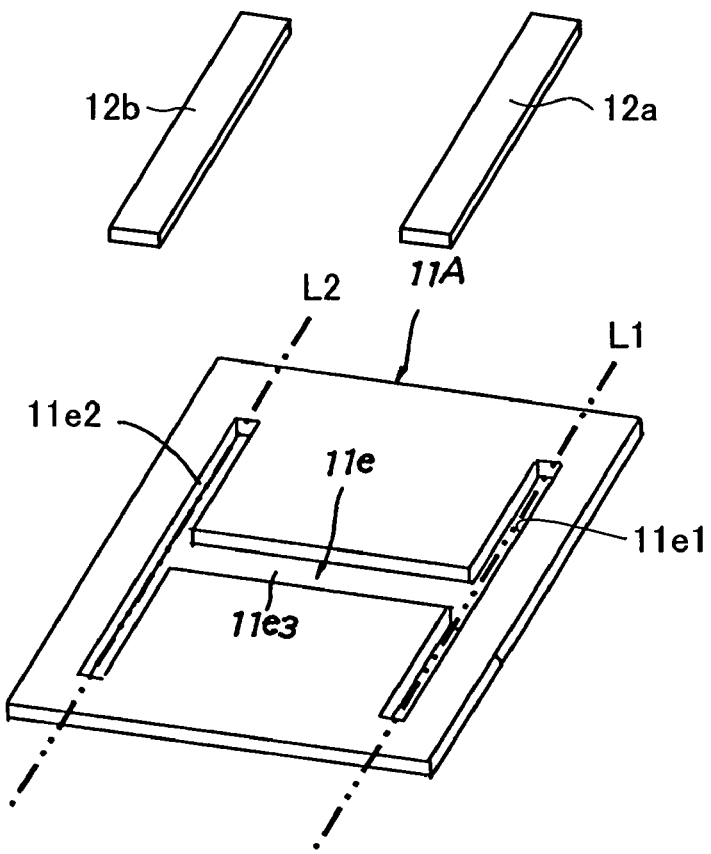
FIG. 40A is a perspective view illustrating a state before the piezoelectric/electrostrictive element is bonded to an original plate of a base constituting the thirteenth piezoelectric/electrostrictive device.
Figure 40B:
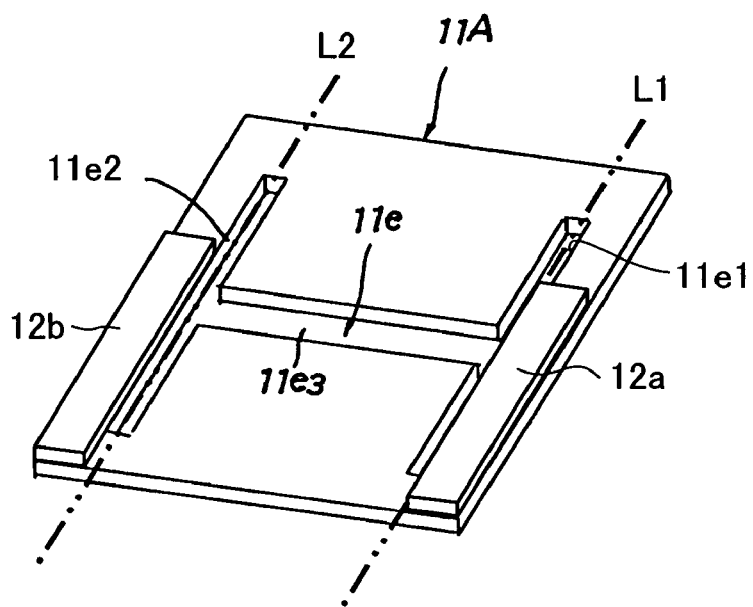
FIG. 40B is a perspective view illustrating a state after the piezoelectric/electrostrictive element is bonded to the original plate of the base constituting the thirteenth piezoelectric/electrostrictive device.
Figure 41A:
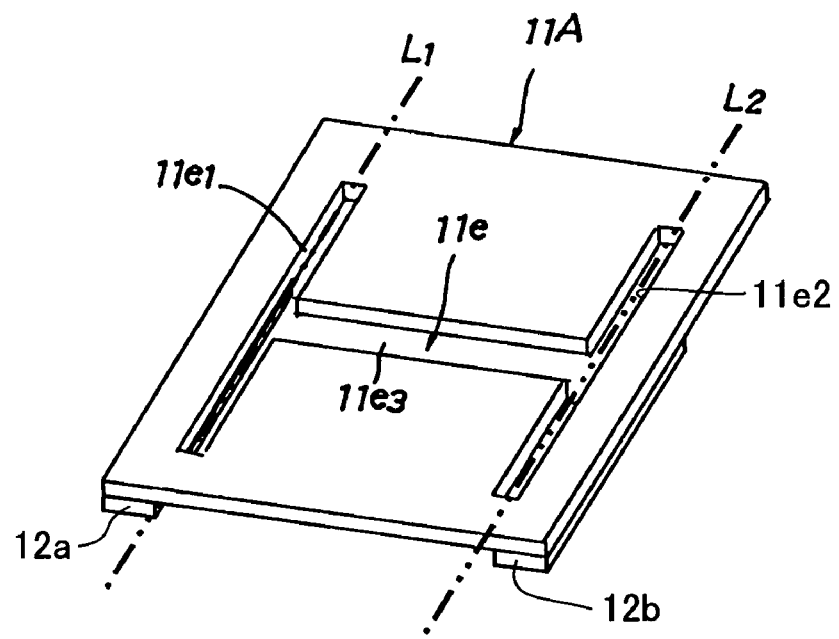
FIG. 41A is a perspective view illustrating a state before the original plate of the base constituting the thirteenth piezoelectric/electrostrictive device after having bonded the piezoelectric/electrostrictive element thereon is bent.
Figure 41B:
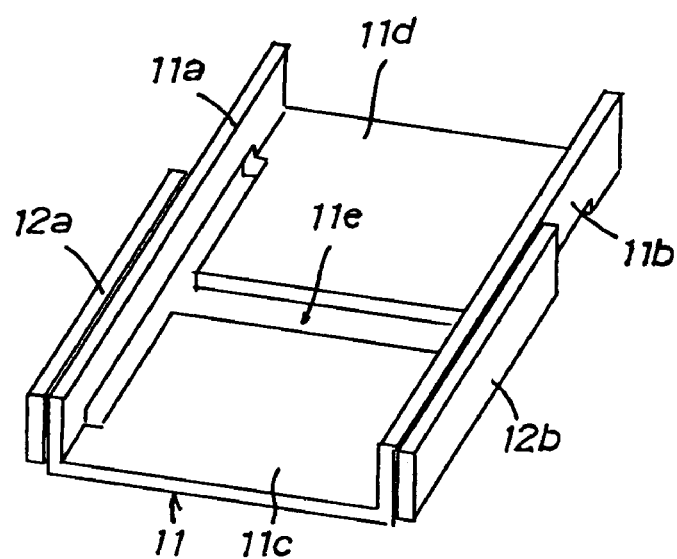
FIG. 41B is a perspective view illustrating a state after the original plate of the base constituting the thirteenth piezoelectric/electrostrictive device after having bonded the piezoelectric/electrostrictive element thereon is bent.

Alternatively, the thirteenth piezoelectric/electrostrictive device 10i may also be formed by bonding the piezoelectric/electrostrictive elements 12a, 12b to the "portions which become the outer sides of the movable parts 11a, 11b later" of the original plate 11A with adhesive agent, as shown in FIG. 40A and FIG. 40B, then bending the original plate 11A at a right angle along the chain double-dashed lines L1, L2 to form the movable parts 11a, 11b as shown in FIG. 41A and FIG. 41B, and then bonding the piezoelectric/electrostrictive elements 12a, 12b on the inner sides of the movable parts 11a, 11b with adhesive agent.

The thirteenth piezoelectric/electrostrictive device 10i has following advantages. Firstly, since the total driving force of the piezoelectric/electrostrictive elements is increased, displacement of the movable parts 11a, 11b (therefore, non-controlled part H) can be increased.

Secondly, the resonant frequency of the piezoelectric/electrostrictive device can be increased.

Thirdly, the non-controlled part H can be driven efficiently by applying the same reference drive signal to the piezoelectric/electrostrictive element 12a on the outer side of the movable part 11a and the piezoelectric/electrostrictive element 12b on the inner side of the movable part 11b, and applying the drive signals whose phase is shifted from the reference drive signal by 180° to the piezoelectric/electrostrictive element 12a on the inner side of the movable part 11a and the piezoelectric/electrostrictive element 12b on the outer side of the movable part 11b.

Figure 42:
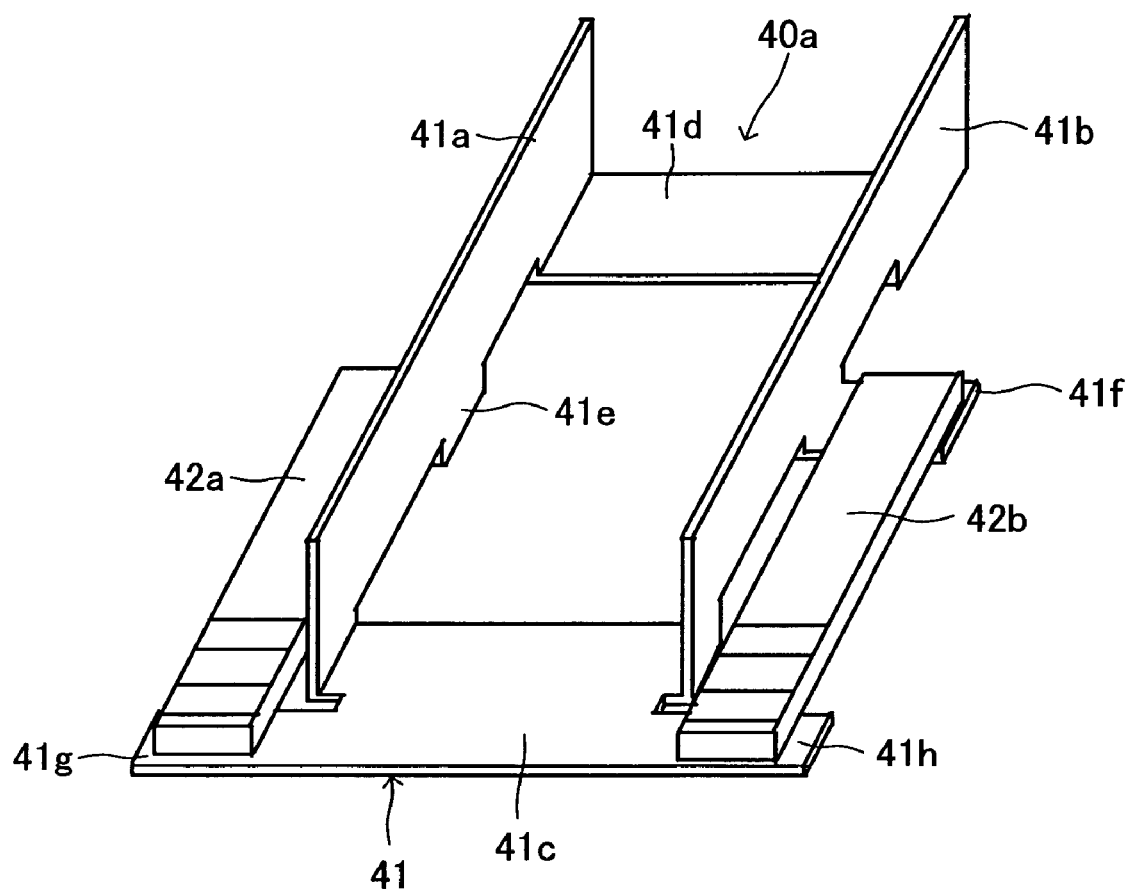
FIG. 42 is a perspective view of a fourteenth piezoelectric/electrostrictive device.

Subsequently, a fourteenth piezoelectric/electrostrictive device 40a shown in FIG. 42 will be described. In the above-described piezoelectric/electrostrictive device, long and narrow plate-shaped piezoelectric/electrostrictive elements are disposed on the side surfaces of the movable part which are erect perpendicularly from the flat surface of the base. In other words, the long and narrow plate-shaped piezoelectric/electrostrictive element is arranged perpendicularly with respect to the flat surface of the base. On the other hand, a characteristic of the fourteenth piezoelectric/electrostrictive device 40a is in that the long and narrow plate-shaped piezoelectric/electrostrictive elements are disposed horizontally with respect to the flat surface of the base.

Specifically, the fourteenth piezoelectric/electrostrictive device 40a includes: a base 41 being constructed with one sheet of flat plate, the base 41 having a fixing part 41c of a flat plate shape, a mounting part 41d that is separate from the fixing part 41c and having a flat plate shape, and a pair of left and right movable parts 41a, 41b, the pair of movable parts 41a, 41b each being supported at one end side thereof by each side edge of the fixing part 41c and at the other end side thereof by each side edge of the mounting part 41d, the respective movable parts being erect by a predetermined height from side edges of the fixing part 41c and the mounting part 41d to face each other and extend along the side edges of the fixing part 41c and the mounting part 41d, and first receiving parts 41e, 41f extending from a mid portion between the one end side and the other end side of at least one of the pair of left and right movable parts 41a, 41b in parallel with the flat surface of the base 41, second receiving parts 41g, 41h extending from at least one of the side edges of the fixing part 41c in parallel with the flat surface of the base 41, and piezoelectric/electrostrictive elements 42a, 42b disposed at one end side thereof on the second receiving parts 41g, 41h and at the other end side thereof on the first receiving parts 41e, 41f so as to connect the first receiving parts 41e, 41f and the second receiving parts 41g, 41h.

Figure 43A:
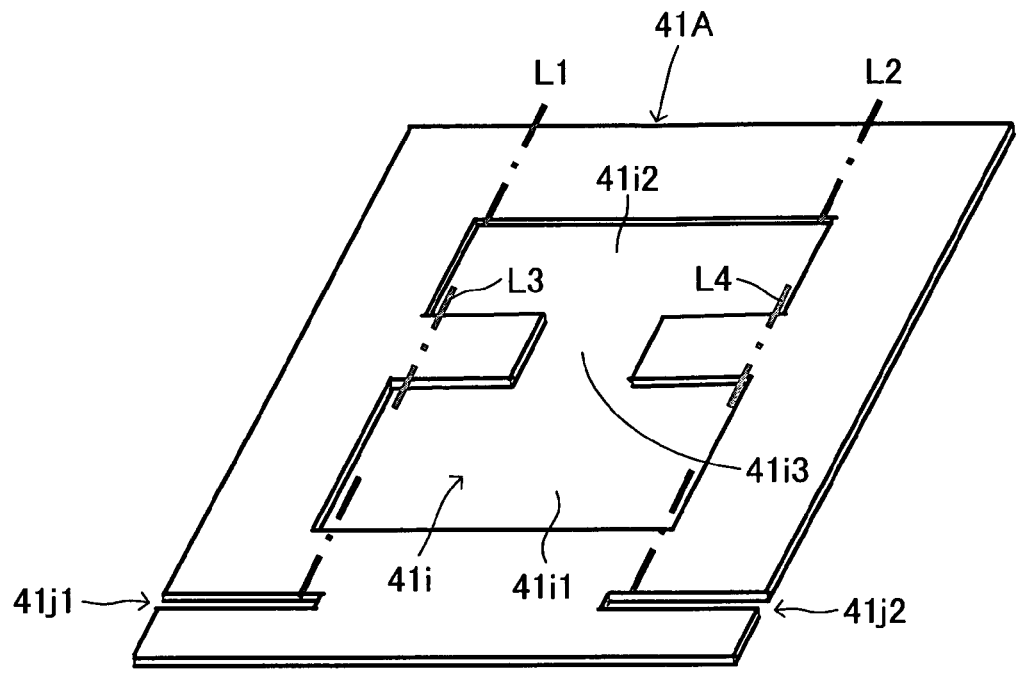
FIG. 43A is a perspective view illustrating a state before an original plate of a base constituting the fourteenth piezoelectric/electrostrictive device is bent.

The base 41 of the fourteenth piezoelectric/electrostrictive device 40a is formed from an original plate 41A shown in FIG. 43A. The original plate 41A is a punched structure formed by stamping a flexible flat plate which can be bent, and is formed into a shape of the base 41 extended into a planar state. The flat plate for forming the original plate 41A is preferably metal in terms of strength.

The original plate 41A is formed with an H-shaped opening 41i and a pair of left and right slits 41j1, 41j2. The opening 41i and the slits 41j1, 41j2 are formed simultaneously at the time of stamping the flat plate. The slits 41j1, 41j2 are provided for dividing "portions which become the movable parts 41a, 41b later" and "portions which become second receiving parts 41g, 41h later".

The opening 41i includes a rectangular shaped front opening 41i1 formed on one end side (front end side) at the center of the original plate 41A, a rectangular shaped rear opening 41i2 formed on the other end side (rear end side) at the center thereof, and a rectangular shaped center opening 41i3 which connects the front opening 41i1 and the rear opening 41i2 with each other at the center of the original plate 41A.

Figure 43B:
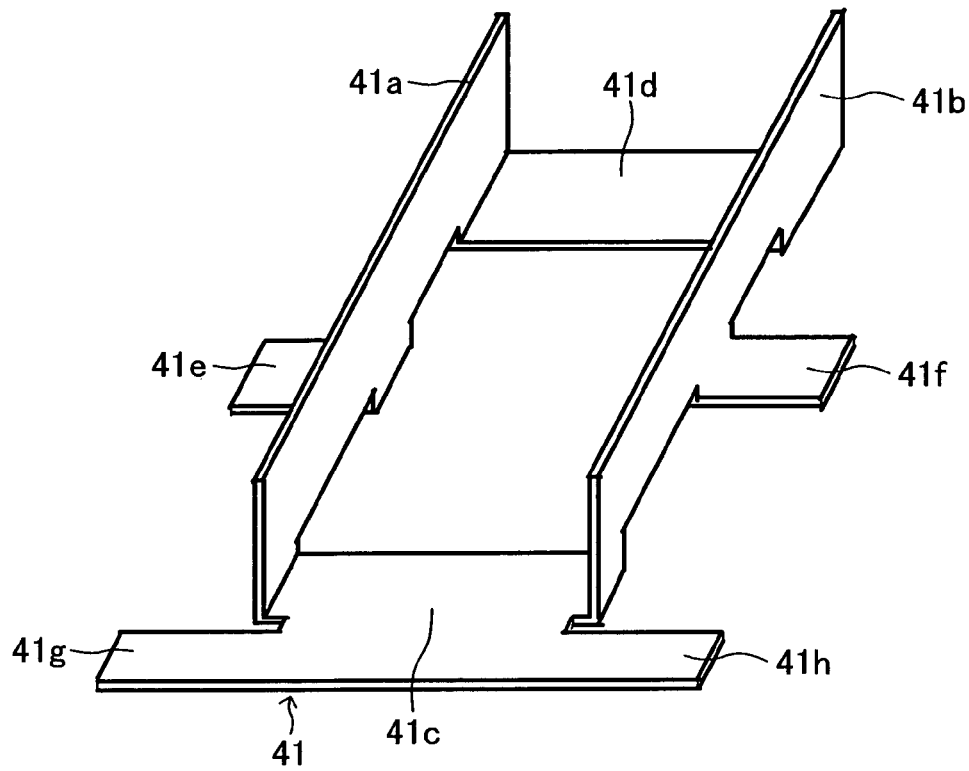
FIG. 43B is a perspective view illustrating a state after the original plate of the base constituting the fourteenth piezoelectric/electrostrictive device is bent.

The base 41 is formed by bending the original plate 41A at a right angle along dashed lines L1, L2 to form the movable parts 41a, 41b as shown in FIG. 43A and FIG. 43B, and then bending the original plate 41A at a right angle along dashed lines L3, L4 to form the first receiving parts 41e, 41f.

Accordingly, the first receiving parts 41e, 41f extend outward in parallel with the flat surface of the base 41. The second receiving parts 41g, 41h also extend from the side edge of the fixing part 41c outward in parallel with the flat surface of the base 41 without being bent. Consequently, the thin plate shaped first receiving parts 41e, 41f and the thin plate shaped second receiving parts 41g, 41h exist on the identical plane (on a plane of the base 41 including the fixing part 41c and the mounting part 41d).

The fourteenth piezoelectric/electrostrictive device 40a is formed by bonding the other end and one end of the piezoelectric/electrostrictive element 42a on upper surfaces of the first receiving part 41e and the second receiving part 41g respectively with adhesive agent so as to connect the first receiving part 41e and the second receiving part 41g of the base 41 thus formed, and bonding the other end and one end of the piezoelectric/electrostrictive element 42b on upper surfaces of the first receiving part 41f and the second receiving part 41h respectively with adhesive agent so as to connect the first receiving part 41f and the second receiving part 41h. Accordingly, the long and narrow shaped piezoelectric/electrostrictive elements 42a, 42b are arranged in parallel with the flat surface of the base 41.

Figure 44:
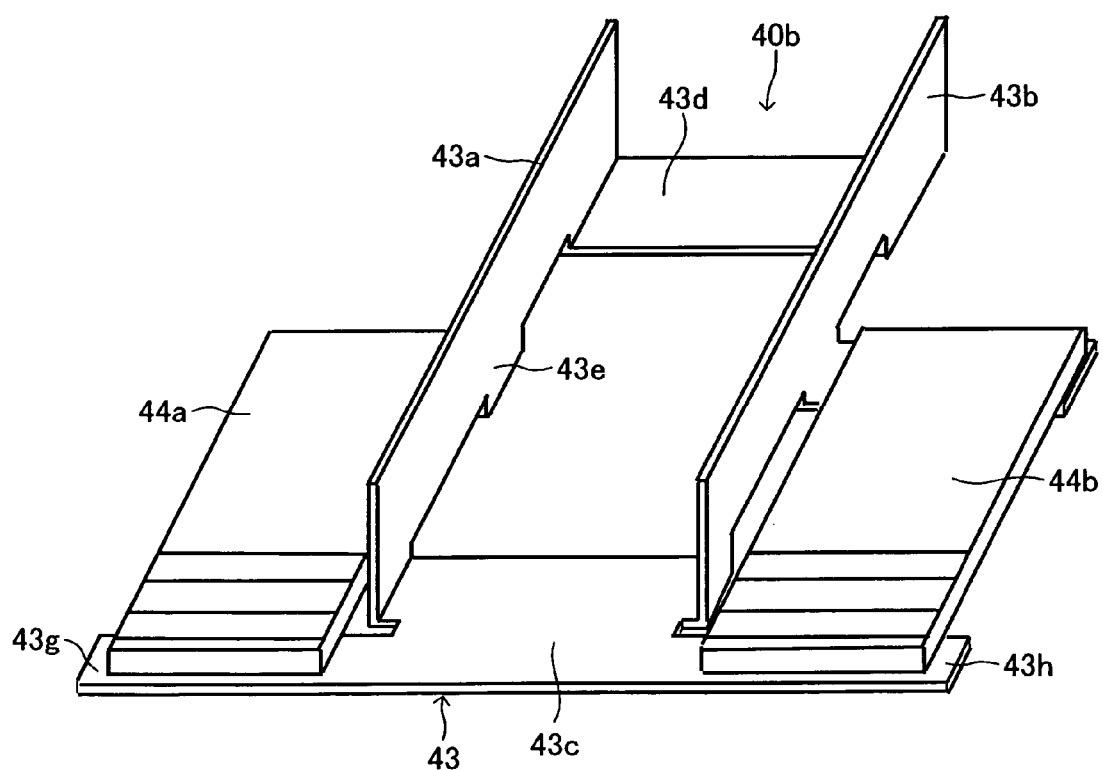
FIG. 44 is a perspective view illustrating a first modification of the fourteenth piezoelectric/electrostrictive device.

The fourteenth piezoelectric/electrostrictive device 40a has following advantages. Firstly, as a piezoelectric/electrostrictive device 40b according to a first modification of the fourteenth piezoelectric/electrostrictive device 40a shown in FIG. 44, by enlarging the length of extension of first receiving parts 43e, 43f and second receiving parts 43g, 43h in the lateral direction, piezoelectric/electrostrictive elements 44a, 44b of large width can be used. Consequently, the drive force of the piezoelectric/electrostrictive element can be increased, and hence displacement of movable parts 43a, 43b (therefore the non-controlled part H) can be increased.

Secondly, since the piezoelectric/electrostrictive elements 44a, 44b of large width can be used as described above, handling of the piezoelectric/electrostrictive elements is facilitated.

Figure 45:
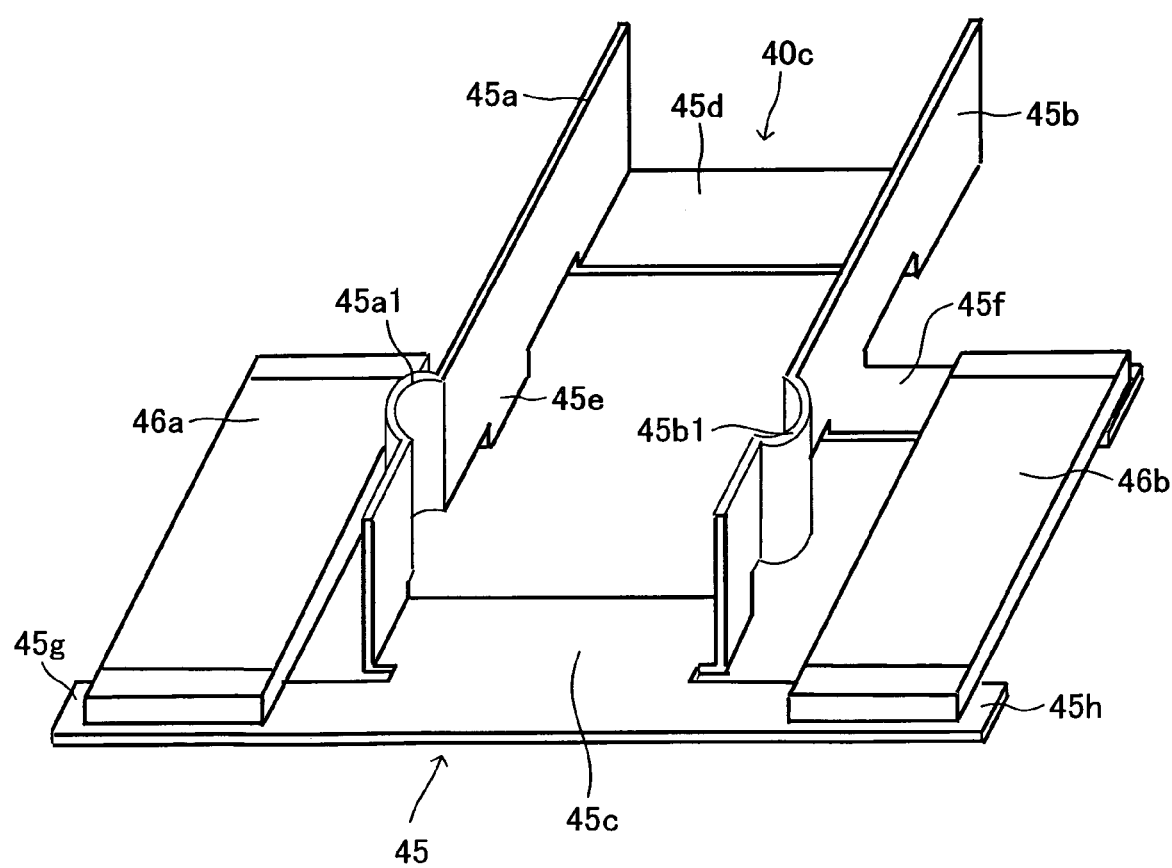
FIG. 45 is a perspective view illustrating a second modification of the fourteenth piezoelectric/electrostrictive device.
Figure 46:
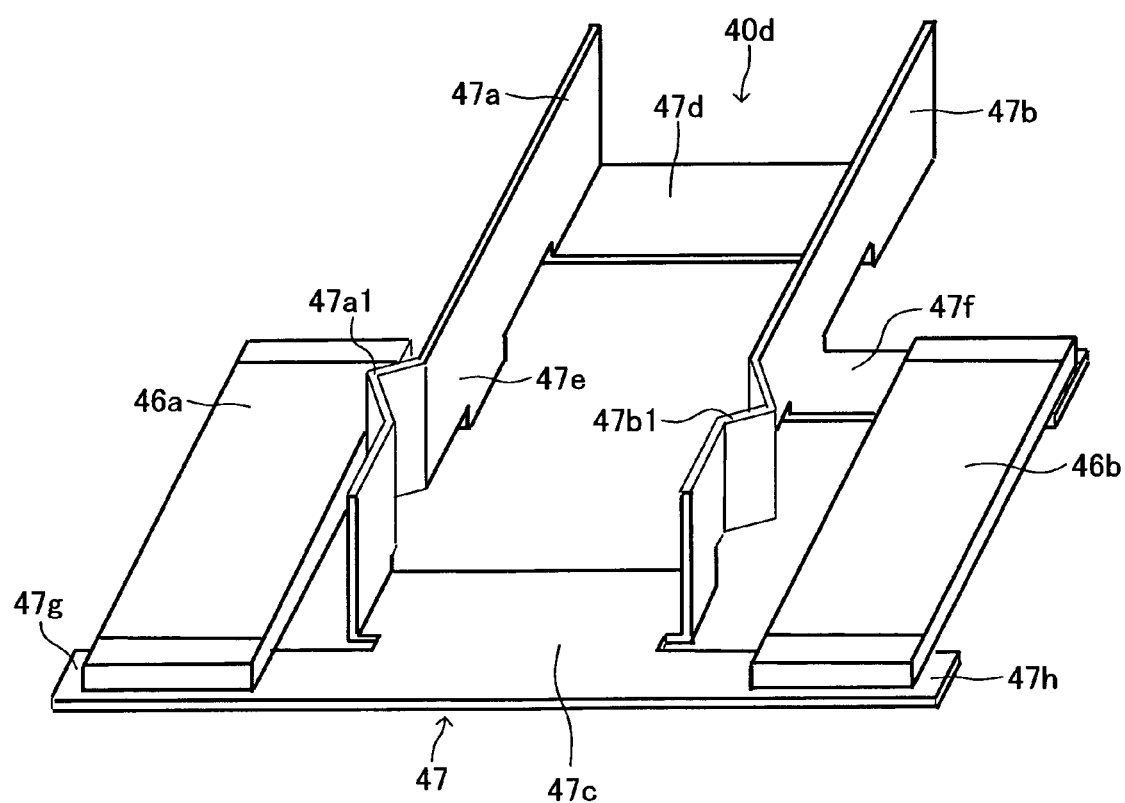
FIG. 46 is a perspective view illustrating a third modification of the fourteenth piezoelectric/electrostrictive device.
Figure 47:
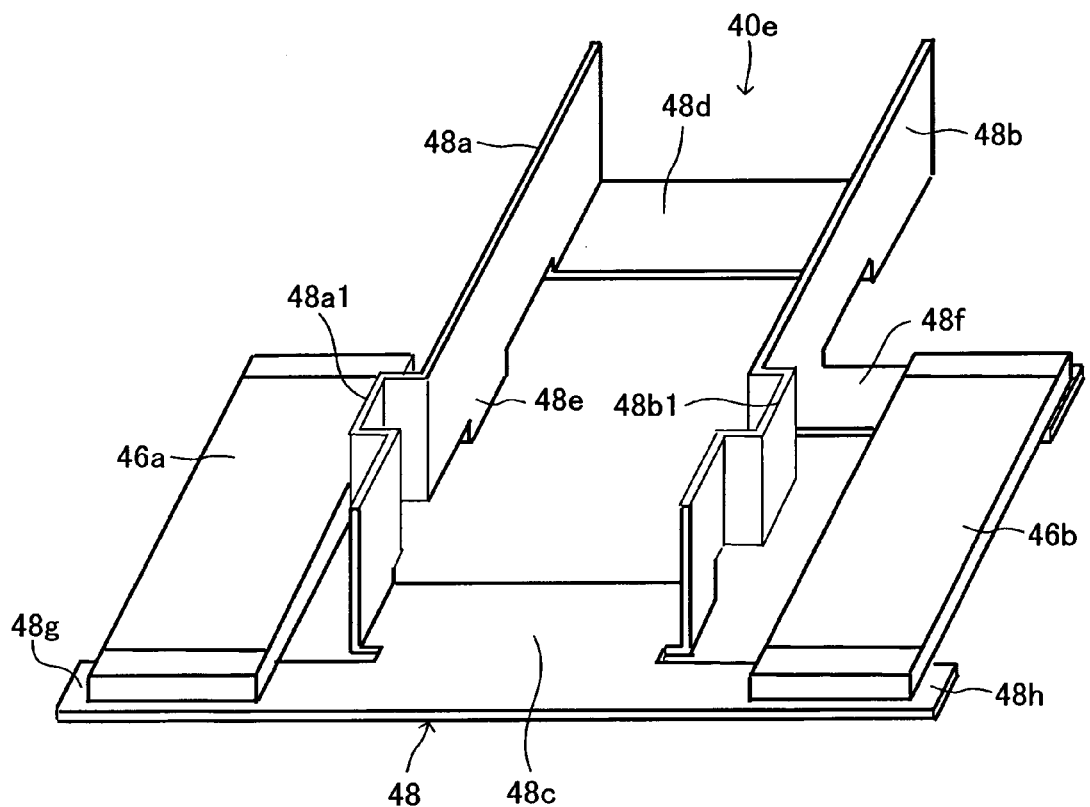
FIG. 47 is a perspective view illustrating a fourth modification of the fourteenth piezoelectric/electrostrictive device.

Thirdly, by providing expandable structure (arcuate curved portions 45a1, 45b1 in top view in FIG. 45, bent portions 47a1, 47b1 of rectangular shape in top view in FIG. 46, and bent portions 48a1, 48b1 of triangular shape in top view in FIG. 47) at a portion between the first receiving part and the second receiving part of the long and narrow plate shaped movable portions as piezoelectric/electrostrictive devices 40c-40e according to second to fourth modifications of the fourteenth piezoelectric/electrostrictive device 40a shown in FIG. 45 to FIG. 47, expansion and contraction of the piezoelectric/electrostrictive elements can be converted into displacement of the movable part (therefore the non-controlled part H) efficiently.

Fourthly, since the piezoelectric/electrostrictive element is arranged perpendicularly with respect to the movable part, impact resistant property of the piezoelectric/electrostrictive element is enhanced.

Subsequently, a fifteenth piezoelectric/electrostrictive device 50a shown in FIG. 50 will be described. In the above-described piezoelectric/electrostrictive device, the piezoelectric/electrostrictive element formed mainly of PZT is directly adhered to a metallic base. On the other hand, the characteristic of the fifteenth piezoelectric/electrostrictive device 50a is in that the piezoelectric/electrostrictive element formed mainly of PZT is bonded to a reinforcing member (actuator) formed mainly of zirconia, and the reinforcing member is bonded to the metallic base.

Figure 48:
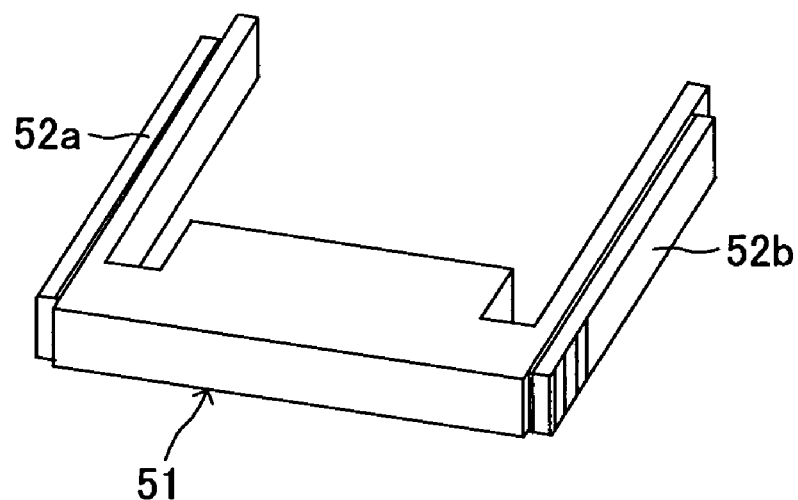
FIG. 48 is a perspective view illustrating a state before a reinforcing member having a piezoelectric/electrostrictive element which constitutes a fifteenth piezoelectric/electrostrictive device bonded thereon is bonded on a base.
Figure 48:
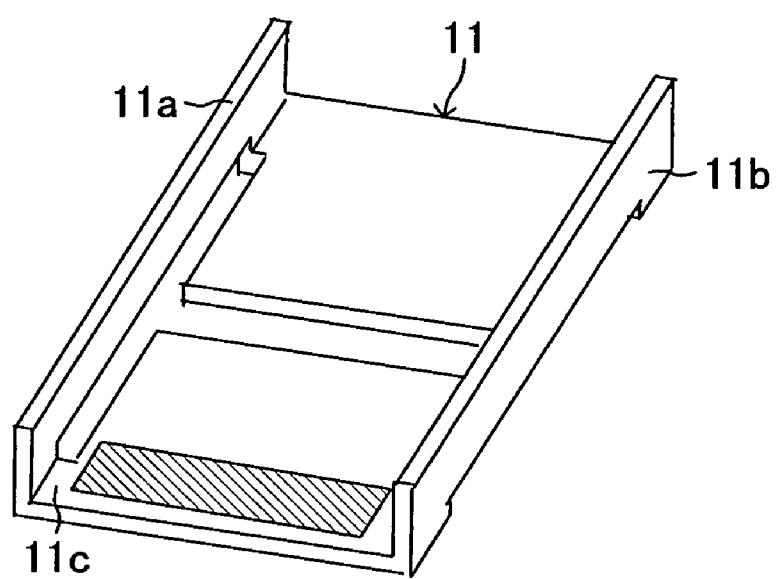

A method of manufacturing the fifteenth piezoelectric/electrostrictive device 50a will be described below. As shown in FIG. 48, firstly, long and narrow plate-shaped piezoelectric/electrostrictive elements 52a, 52b formed of PZT of the fifteenth piezoelectric/electrostrictive device 50a are bonded to outer sides of thin plate parts of a reinforcing member 51 being formed of zirconia and having a pair of left and right thin plate parts, and a fixing part for supporting the respective thin plate parts with adhesive agent. Then, adhesive agent is applied to a predetermined range (see a hatched range) on the upper surface of the fixing part 11c of the base 11 shown in FIG. 3B.

Figure 49:
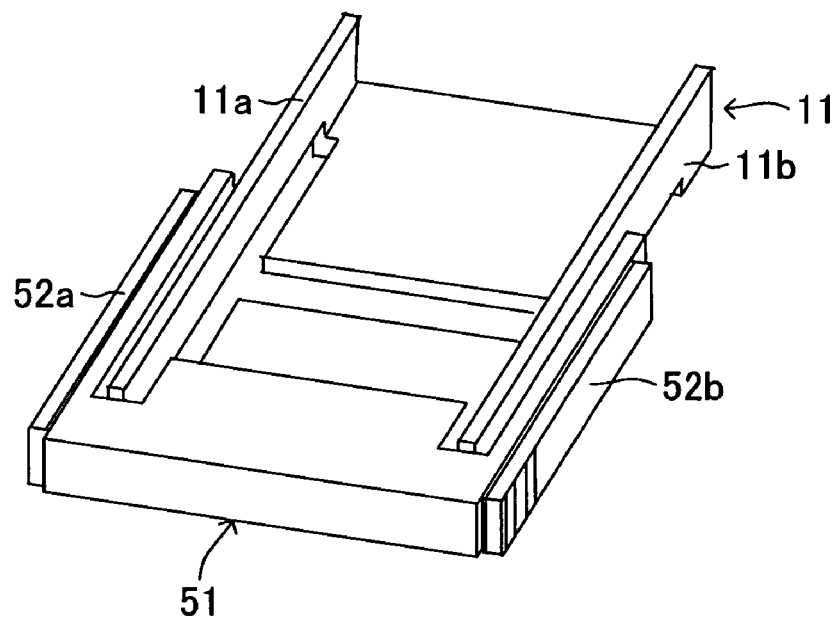
FIG. 49 is a perspective view showing a state after the reinforcing member having the piezoelectric/electrostrictive element which constitutes the fifteenth piezoelectric/electrostrictive device bonded thereon is bonded on the base.

Subsequently, as shown in FIG. 49, the fixing part of the reinforcing member 51 which is integral with the piezoelectric/electrostrictive elements 52a, 52b is placed on the upper surface of the fixing part 11c of the base 11 so that the inner sides of the thin plate parts of the reinforcing member 51 face the outer sides of the movable parts 11a, 11b of the base 11. Accordingly, the reinforcing member 51 which is integral with the piezoelectric/electrostrictive elements 52a, 52b is bonded and integrated with the base 11 by the adhesive agent applied on the upper surface of the fixing part 11c of the base 11.

Figure 50:
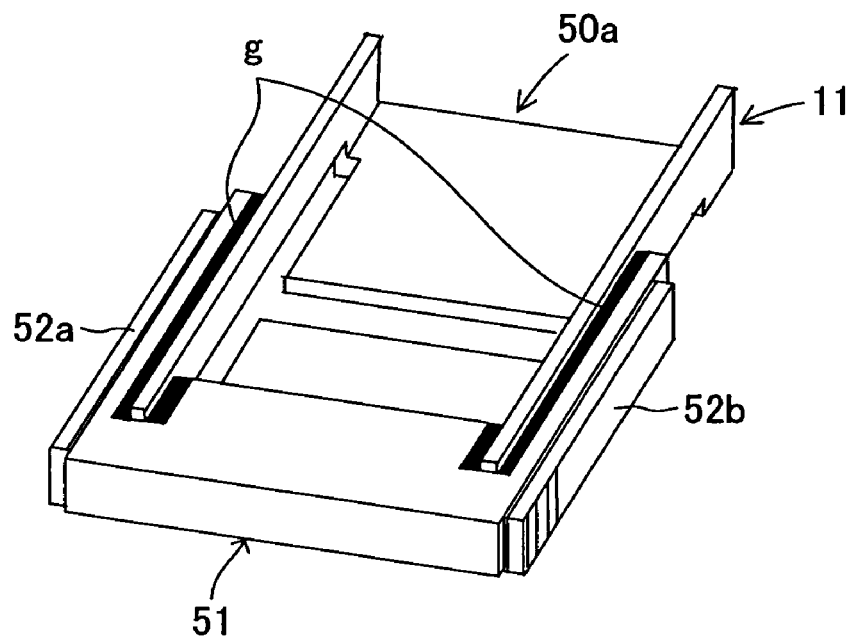
FIG. 50 is a perspective view illustrating the fifteenth piezoelectric/electrostrictive device.

At the last, as shown in FIG. 50, resin g is injected into a portion formed with a gap between the movable parts 11a, 11b of the base 11 and the reinforcing member 51 to achieve resin adhesion, whereby the fifteenth piezoelectric/electrostrictive device 50a is formed.

Figure 51:
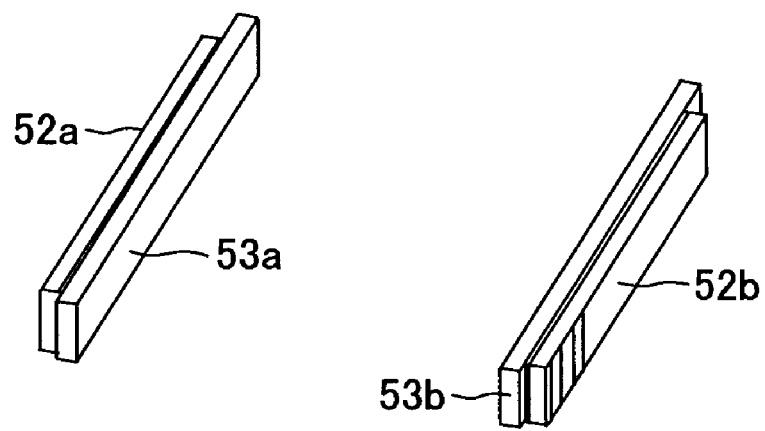
FIG. 51 is a perspective view showing a state before a reinforcing member having a piezoelectric/electrostrictive element which constitutes a first modification of the fifteenth piezoelectric/electrostrictive device bonded thereon is bonded on the base.
Figure 51:
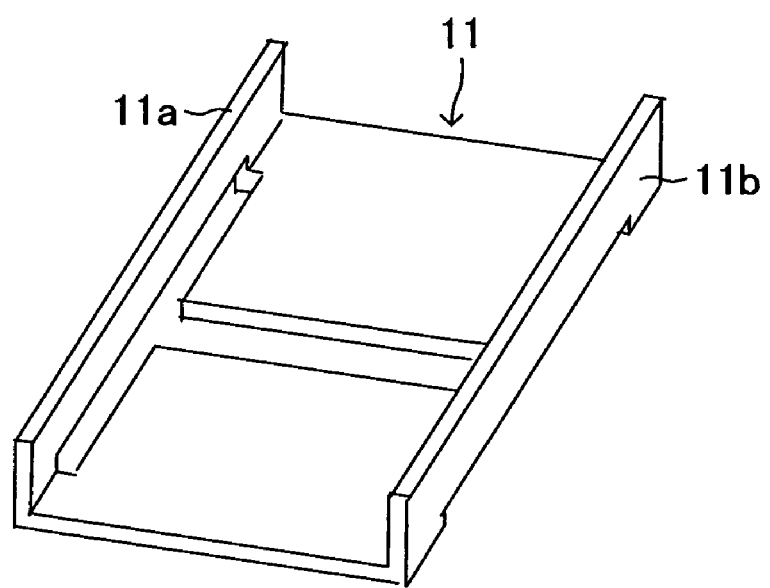
Figure 52:
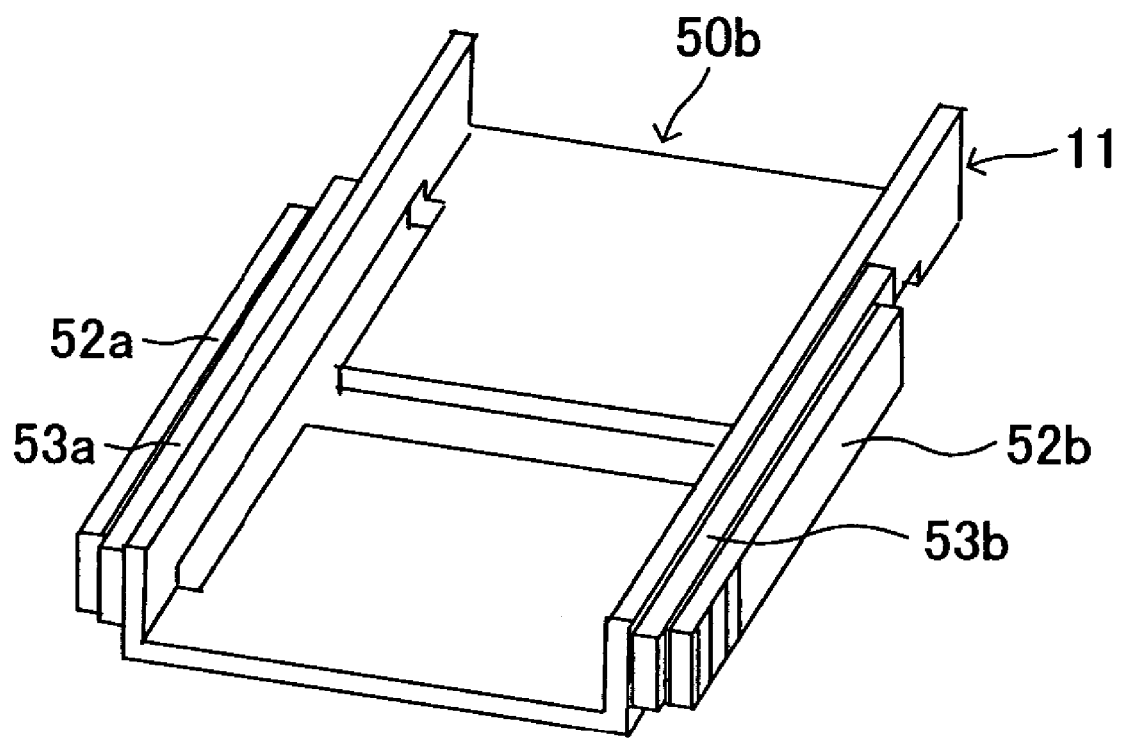
FIG. 52 is a perspective view illustrating the first modification of the fifteenth piezoelectric/electrostrictive device.

A piezoelectric/electrostrictive device 50b according to a first modification of the piezoelectric/electrostrictive device 50a shown in FIG. 51 and FIG. 52 is different from the fifteenth piezoelectric/electrostrictive device 50a in that reinforcing members 53a, 53b formed of a pair of left and right long and narrow plate-shaped zirconia are used as the reinforcing members (actuator).

In other words, as shown in FIG. 51, in the piezoelectric/electrostrictive device 50b, the long and narrow plate-shaped piezoelectric/electrostrictive elements 52a, 52b are bonded to one side surfaces of the reinforcing members 53a, 53b, and as shown in FIG. 52, the other surfaces of the reinforcing members 53a, 53b are bonded to the outer sides of the movable parts 11a, 11b of the base 11.

Figure 53:
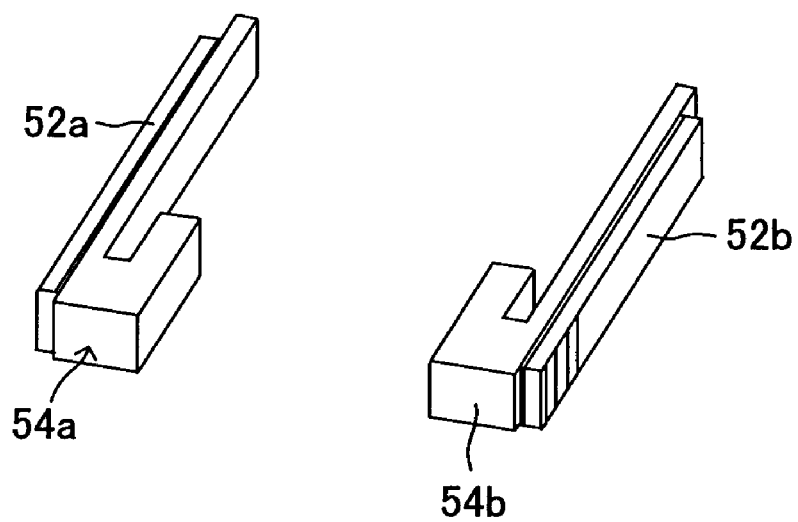
FIG. 53 is a perspective view illustrating a state before the reinforcing member having a piezoelectric/electrostrictive element which constitutes a second modification of the fifteenth piezoelectric/electrostrictive device bonded thereon is bonded on the base.
Figure 53:
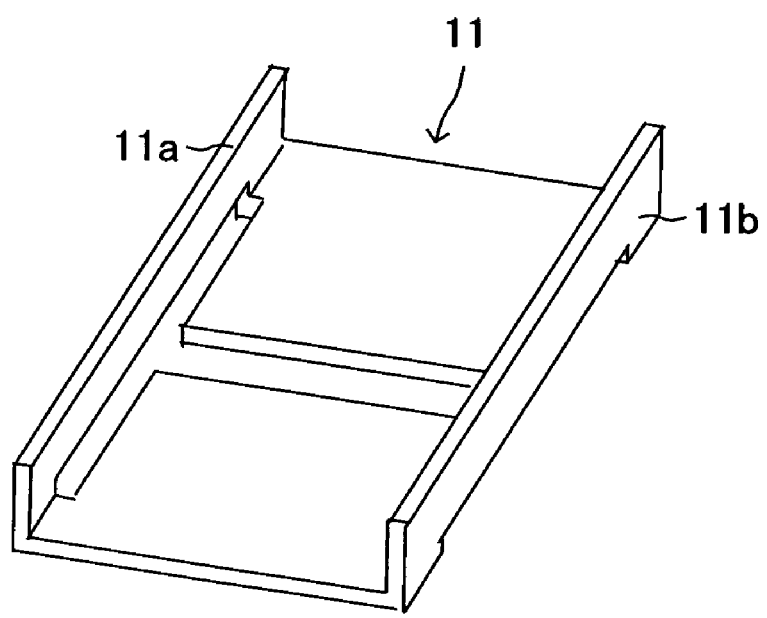
Figure 54:
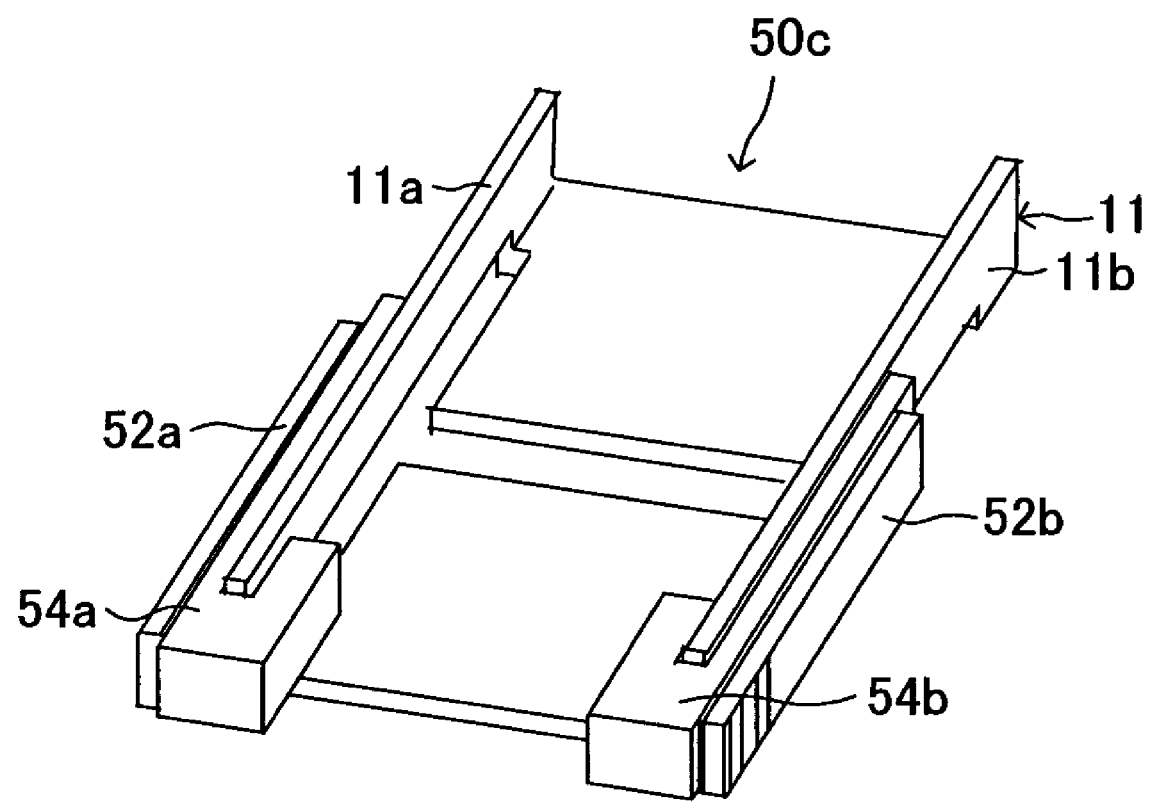
FIG. 54 is a perspective view illustrating the second modification of the fifteenth piezoelectric/electrostrictive device.

A piezoelectric/electrostrictive device 50c according to a second modification of the fifteenth piezoelectric/electrostrictive device 50a shown in FIG. 53 and FIG. 54 is different from the piezoelectric/electrostrictive device 50b in that a pair of left and right reinforcing members 54a, 54b formed of long and narrow plate-shaped zirconia each formed with a hook-shaped portion at one end thereof are used as the reinforcing members (actuators).

As shown in FIG. 54, in the piezoelectric/electrostrictive device 50c, the reinforcing members 54a, 54b having the piezoelectric/electrostrictive elements 52a, 52b adhered thereon are bonded and fixed to the base 11 so that inner sides of the hook-shaped portions come into tight contact with the one side surfaces of the movable parts 11a, 11b (front side) of the base 11.

Figure 55:
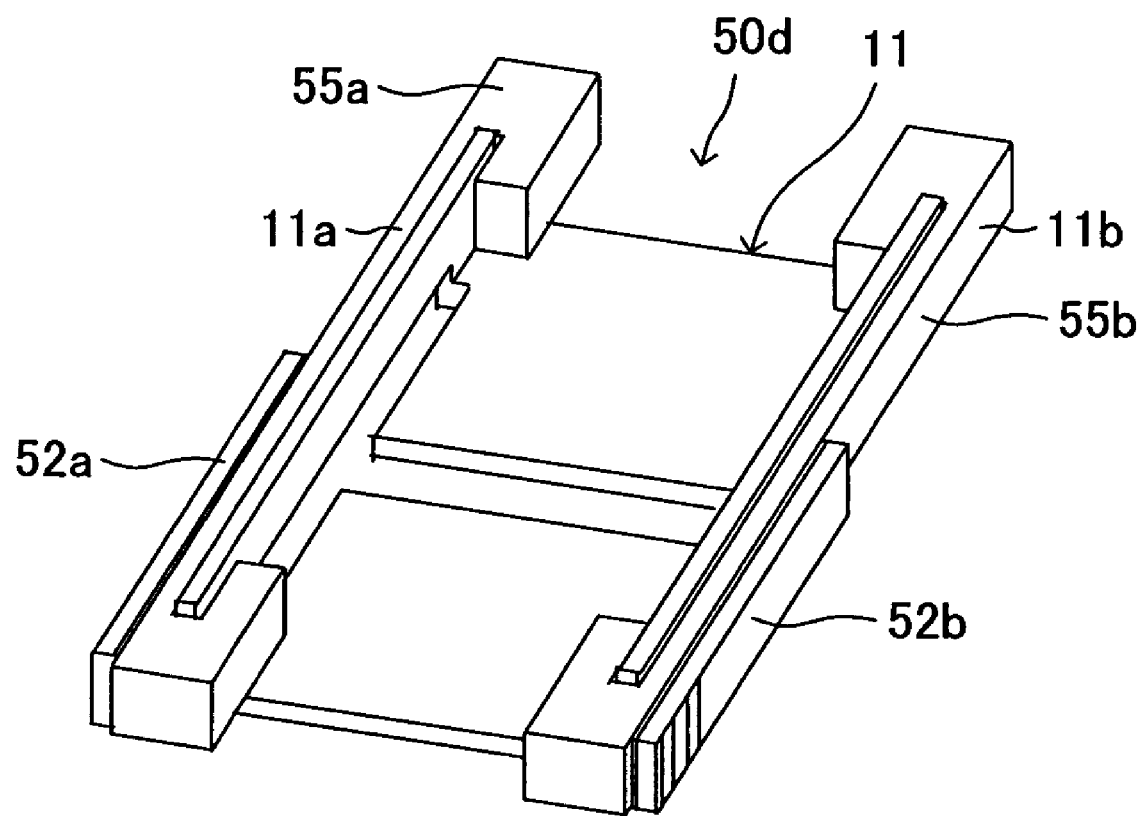
FIG. 55 is a perspective view illustrating a third modification of the fifteenth piezoelectric/electrostrictive device.

A piezoelectric/electrostrictive device 50d according to a third modification of the fifteenth piezoelectric/electrostrictive device 50a shown in FIG. 55 is different from the piezoelectric/electrostrictive device 50c in that reinforcing member 55a, 55b formed of a pair of left and right long and narrow plate-shaped zirconia each formed with a hook-shaped portion also on the other end in addition to the one end are used as the reinforcing members (actuators).

As shown in FIG. 55, in the piezoelectric/electrostrictive device 50d, the reinforcing members 55a, 55b having the piezoelectric/electrostrictive elements 52a, 52b bonded thereon are bonded and fixed to the base 11 so that the inner sides of the hook-shaped portions on one end come into tight contact with the side surfaces of the movable parts 11a, 11b on one end of the base 11, and the inner sides of the hook-shaped portions on the other end come into tight contact with the side surfaces of the movable parts 11a, 11b on the other end of the base 11. The piezoelectric/electrostrictive elements 52a, 52b are extended from one end portions (front end portions) on the outer sides of the reinforcing members 55a, 55b to portions corresponding to the substantially half the length of the length of the reinforcing members 55a, 55b in the fore-and-aft direction.

Figure 56:
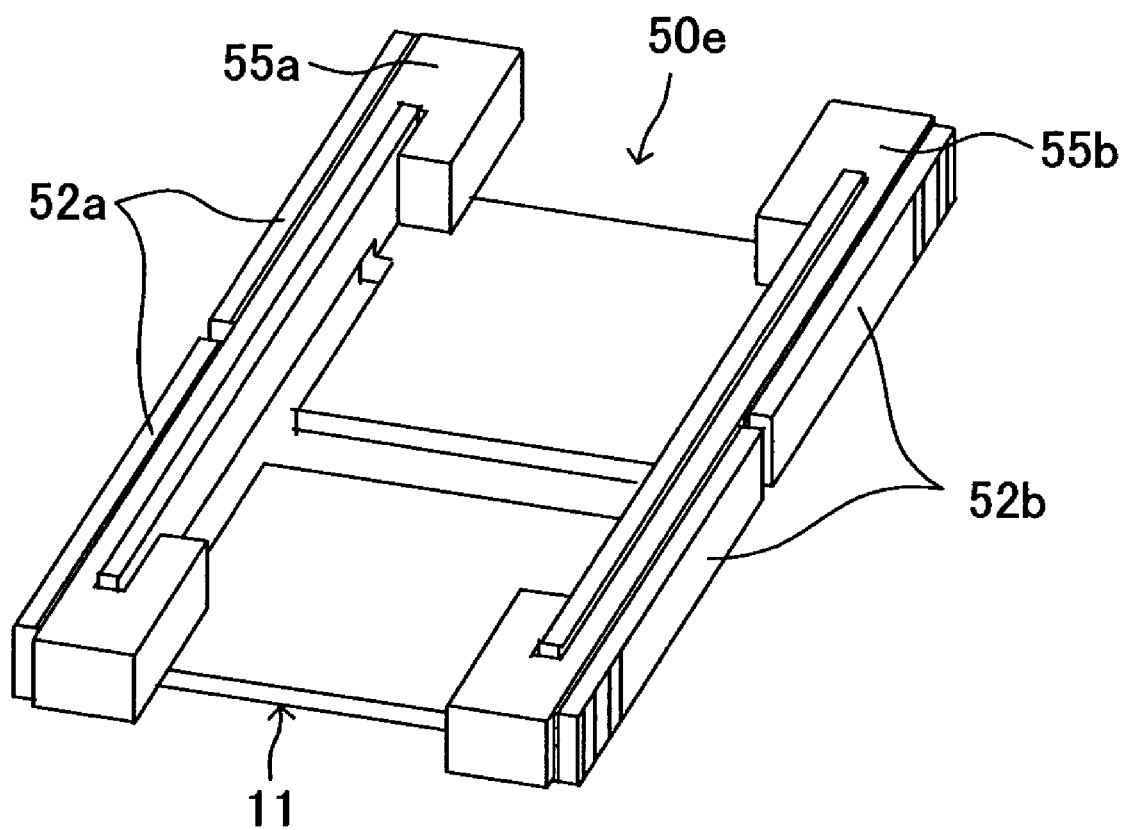
FIG. 56 is a perspective view illustrating a fourth modification of the fifteenth piezoelectric/electrostrictive device.

A piezoelectric/electrostrictive device 50e according to a fourth modification of the fifteenth piezoelectric/electrostrictive device 50a shown in FIG. 56 is different from the piezoelectric/electrostrictive device 50d in that in addition to the piezoelectric/electrostrictive elements 52a, 52b extending from the one end portions (front portions) to the portions corresponding to the substantially half the length of the reinforcing members 55a, 55b in the fore-and-aft direction on the outer sides of the reinforcing members 55a, 55b, the piezoelectric/electrostrictive elements 52a, 52b extending from the other end portions (rear end portions) to the portions corresponding to the substantially half the length in the fore-and-aft direction are bonded on the outer sides of the reinforcing members 55a, 55b.

Figure 57:
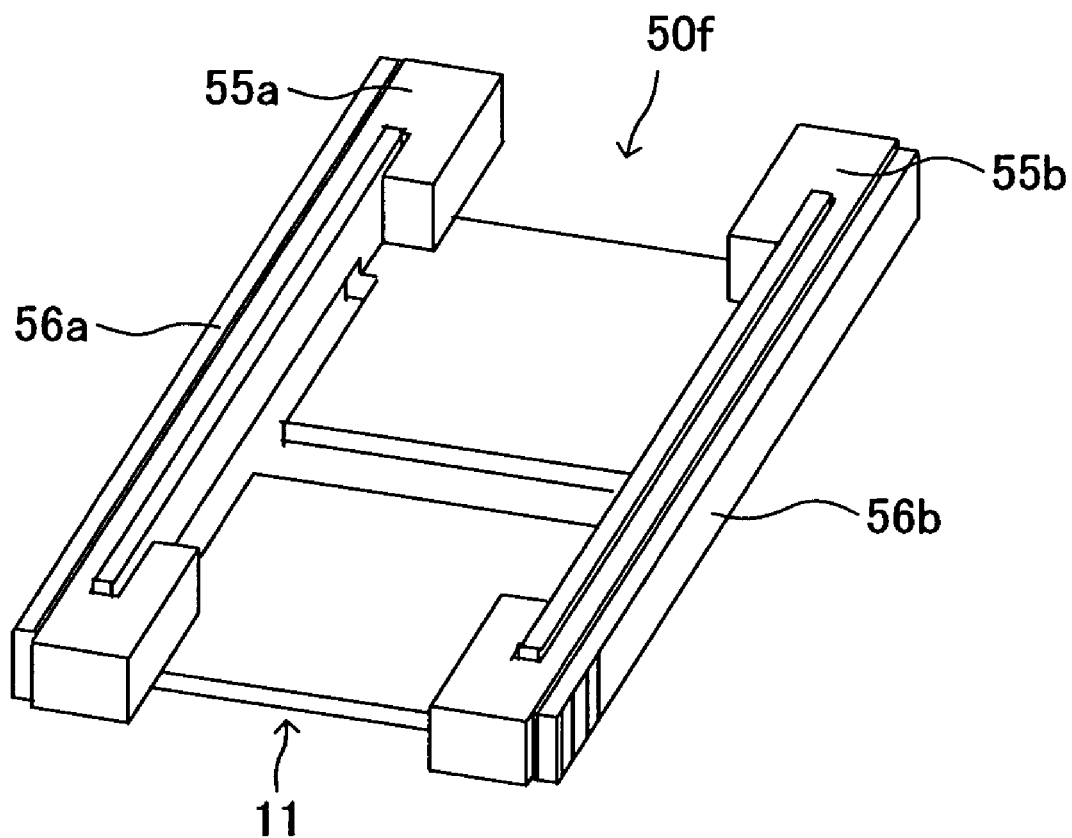
FIG. 57 is a perspective view illustrating a fifth modification of the fifteenth piezoelectric/electrostrictive device.

A piezoelectric/electrostrictive device 50f according to a fifth modification of the fifteenth piezoelectric/electrostrictive device 50a shown in FIG. 57 is different from the piezoelectric/electrostrictive device 50e in that piezoelectric/electrostrictive elements 56a, 56b extending from the one end portions (front end portions) to the other end portions (rear end portions) continuously on the outer sides of the reinforcing members 55a, 55b.

The fifteenth piezoelectric/electrostrictive device 50a and the piezoelectric/electrostrictive devices 50b-50f according to the modifications have following advantages. Firstly, although the piezoelectric/electrostrictive element formed of PZT is easily broken, since stiff reinforcing members formed of zirconia are used for reinforcing the piezoelectric/electrostrictive elements, handling of the piezoelectric/electrostrictive device is facilitated.

Secondly, by using the hook-shaped portions as described above, the positions of the reinforcing members with respect to the base (therefore, the positions of the piezoelectric/electrostrictive elements) can be aligned accurately with intended positions. Therefore, variations in characteristics among the piezoelectric/electrostrictive devices can be reduced.

Thirdly, by using the hook-shaped portions as described above, assembly of the reinforcing members with respect to the base is facilitated.

Fourthly, by using the stiff reinforcing member formed of zirconia for reinforcing the piezoelectric/electrostrictive element, impact resistant property of the piezoelectric/electrostrictive elements increases.

Fifthly, the resonance frequency of the piezoelectric/electrostrictive device can be increased.

Sixthly, as described above, since the positions of the piezoelectric/electrostrictive elements with respect to the base can be aligned accurately with the intended positions, electrical connection between electrodes in the piezoelectric/electrostrictive element and an external drive circuit can be achieved easily.

Seventhly, since the reinforcing member can be upsized, assembly of the reinforcing member to the base is facilitated.

Eighthly, since flexibility in shape of the reinforcing member such as width or height is high, modification in design for achieving intended characteristics and functions is facilitated.

For example, if the thickness of the movable parts 11a, 11b (therefore the thickness of the original plate 11A) is small in the first piezoelectric/electrostrictive device 10a shown in FIG. 2 to FIG. 4, when the piezoelectric/electrostrictive elements 12a, 12b are driven, there may occur such a phenomenon that displacement of the other end sides of the movable parts 11a, 11b (rear end sides, on the side of the mounting part 11d) (therefore, displacement of the non-control part H) is reduced because portions on one end sides of the movable parts 11a, 11b (front end side, on the side of the fixing part 11c) are deformed.

Figure 58:
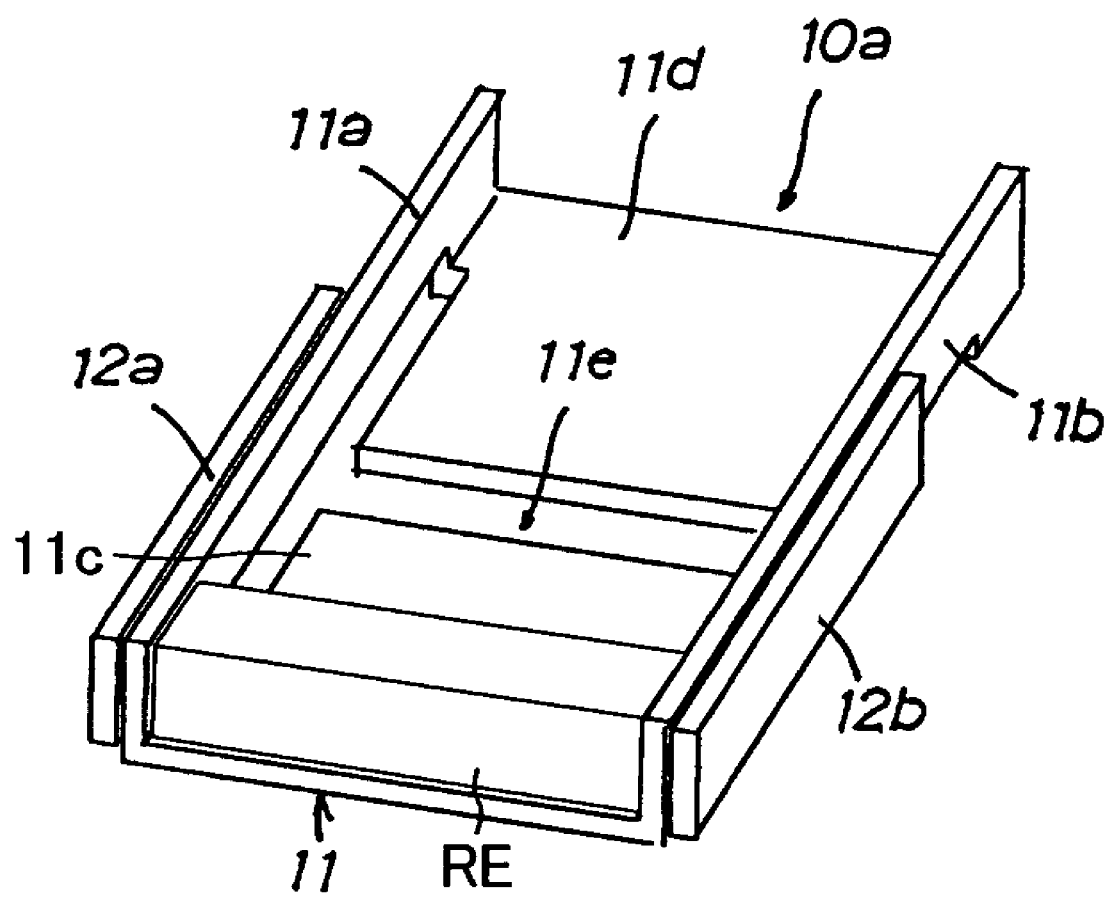
FIG. 58 is a perspective view illustrating an example in which the reinforcing member is inserted into movable parts of the first piezoelectric/electrostrictive device shown in FIG. 4.

In such a case, as shown in FIG. 58, a reinforcing member RE may be inserted between the respective portions on the one end sides (front end sides, on the side of the fixing part 11c) of the movable parts 11a, 11b for reinforcing the same. The reinforcing member RE may be, for example, of ceramic, metal, or resin. In this example, the reinforcing member RE assumes a square pole shape. However, the shape is not limited thereto, and for example, may be a shape of cylindrical column shape.

What is claimed is:

1. A piezoelectric/electrostrictive device comprising:
   a base being constructed with one sheet of flat plate, the base having a fixing part of a flat plate shape, a mounting part that is separate from the fixing part and having a flat plate shape, and a pair of left and right movable parts, the pair of movable parts each being supported at one end side thereof by each side edge of the fixing part and at the other end side thereof by each side edge of the mounting part, the respective movable parts being erect by a predetermined height from the side edges of the fixing part and the mounting part to face each other and extend along the side edges of the fixing part and the mounting part; and
   a piezoelectric/electrostrictive element arranged on an inner side of at least one of the pair of left and right movable parts, a first end of the piezoelectric/electrostrictive element extending to a position on the inner side of the at least one of the pair of left and right movable parts, the position overlapping the side edge of the fixing part,
   wherein (i) La is a distance measured along a respective movable part between a boundary of the respective movable part and the fixing part and a boundary of the respective movable part and the mounting part, (ii) Lb is a distance measured along the respective movable part between the boundary of the respective movable part and the mounting part to a second end of the piezoelectric/electrostrictive element opposite the first end, and (iii) a value of the equation (1−Lb/La) is from 0.5 to 0.8.

2. A piezoelectric/electrostrictive device according to claim 1, wherein a piezoelectric/electrostrictive element is further provided on an outer side of at least one of the pair of left and right movable parts.

3. A piezoelectric/electrostrictive device comprising:
   a base being constructed with one sheet of flat plate, the base having a fixing part of a flat plate shape, a mounting part that is separate from the fixing part and having a flat plate shape, a pair of left and right movable parts, the pair of movable parts each being supported at one end side thereof by each side edge of the fixing part and at the other end side thereof by each side edge of the mounting part, the respective movable parts being erect by a predetermined height from side edges of the fixing part and the mounting part to face each other and extend along the side edges of the fixing part and the mounting part, a first receiving part extending from a mid portion between the one end side and the other end side of at least one of the pair of left and right movable parts in parallel with a flat surface of the base, and a second receiving part extending from at least one of the side edges of the fixing part in parallel with the flat surface of the base, and
   a piezoelectric/electrostrictive element disposed at one end side thereof on the second receiving part and at the other end side thereof on the first receiving part so as to connect the first receiving part and the second receiving part.

* * * * *